(12) United States Patent
Aoyagi

(10) Patent No.: US 9,650,493 B2
(45) Date of Patent: May 16, 2017

(54) COLORING COMPOSITION, CURED FILM, COLOR FILTER, PATTERN FORMING METHOD, METHOD FOR MANUFACTURING COLOR FILTER, SOLID-STATE IMAGING DEVICE, AND IMAGE DISPLAY DEVICE

(71) Applicant: FUJIFILM Corporation, Minato-ku, Tokyo (JP)

(72) Inventor: Kaoru Aoyagi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/213,483

(22) Filed: Jul. 19, 2016

(65) Prior Publication Data

US 2016/0326348 A1   Nov. 10, 2016

Related U.S. Application Data

(63) Continuation of application No. PCT/JP2015/053456, filed on Feb. 9, 2015.

(30) Foreign Application Priority Data

Feb. 14, 2014 (JP) .................... 2014-026460
Jan. 20, 2015 (JP) .................... 2015-008324

(51) Int. Cl.
*G03F 7/004* (2006.01)
*G02B 5/20* (2006.01)
(Continued)

(52) U.S. Cl.
CPC ........ *C08K 5/3417* (2013.01); *C09B 47/0671* (2013.01); *C09B 67/009* (2013.01);
(Continued)

(58) Field of Classification Search
CPC ...... G03F 7/0007; G02B 5/223; C08K 5/3417
(Continued)

(56) References Cited

U.S. PATENT DOCUMENTS

2010/0239965 A1* 9/2010 Takakuwa ............ C08K 5/0008
430/7
2014/0145286 A1   5/2014 Aoyagi et al.
(Continued)

FOREIGN PATENT DOCUMENTS

JP   2000-66022 A    3/2000
JP   2009-191244 A   8/2009
(Continued)

OTHER PUBLICATIONS

Computer-generated transaltion of JP 2014-119487 (Jun. 2014).*
(Continued)

*Primary Examiner* — John A McPherson
(74) *Attorney, Agent, or Firm* — Sughrue Mion, PLLC

(57) ABSTRACT

A coloring composition containing a halogenated zinc phthalocyanine pigment, which has excellent viscosity stability, is provided. A cured film, a color filter, a pattern forming method, a method for manufacturing a color filter, a solid-state imaging device, and an image display device, each using the coloring composition, are also provided.
The colorant composition includes a colorant, a resin, and a pigment derivative, in which the colorant contains a halogenated zinc phthalocyanine pigment, the content of the colorant with respect to the total solid content in the coloring composition is 50% by mass or more, and the content of the Group 2 element ions with respect to the mass of the halogenated zinc phthalocyanine pigment is 30 ppm by mass to 300 ppm by mass.

15 Claims, 3 Drawing Sheets

(51) Int. Cl.
| | |
|---|---|
| *C08K 5/3417* | (2006.01) |
| *C09B 47/067* | (2006.01) |
| *C09B 67/00* | (2006.01) |
| *C09B 67/22* | (2006.01) |
| *C09B 67/46* | (2006.01) |
| *G02B 5/22* | (2006.01) |
| *G03F 7/00* | (2006.01) |
| *G03F 7/16* | (2006.01) |
| *G03F 7/20* | (2006.01) |
| *G03F 7/30* | (2006.01) |
| *G02F 1/1335* | (2006.01) |

(52) U.S. Cl.
CPC ...... *C09B 67/0023* (2013.01); *C09B 67/0033* (2013.01); *G02B 5/223* (2013.01); *G03F 7/0007* (2013.01); *G03F 7/16* (2013.01); *G03F 7/20* (2013.01); *G03F 7/30* (2013.01); *G02B 5/201* (2013.01); *G02F 1/133514* (2013.01)

(58) Field of Classification Search
USPC ..... 430/7, 323; 106/410, 412; 540/136, 137, 540/140
See application file for complete search history.

(56) References Cited

U.S. PATENT DOCUMENTS

| | | |
|---|---|---|
| 2014/0151614 A1 | 6/2014 | Muro et al. |
| 2014/0168805 A1 | 6/2014 | Sugishima et al. |
| 2014/0177081 A1 | 6/2014 | Sugishima et al. |
| 2014/0178634 A1 | 6/2014 | Sugishima et al. |

FOREIGN PATENT DOCUMENTS

| | | |
|---|---|---|
| JP | 2009-223127 A | 10/2009 |
| JP | 2010-54912 A | 3/2010 |
| JP | 2010-100789 A | 5/2010 |
| JP | 2012-177716 A | 9/2012 |
| JP | 2013-54080 A | 3/2013 |
| JP | 2013-54081 A | 3/2013 |
| JP | 2013-64993 A | 4/2013 |
| JP | 2013-64998 A | 4/2013 |
| JP | 2013-64999 A | 4/2013 |
| JP | 2014-119487 A | 6/2014 |
| WO | WO 2013/032039 A1 * | 3/2013 |

OTHER PUBLICATIONS

International Search Report for PCT/JP2015/053456 dated Apr. 21, 2015 [PCT/ISA/210].
Written Opinion for PCT/JP2015/053456 dated Apr. 21, 2015 [PCT/ISA/237].
International Preliminary on Patentability Report dated Aug. 25, 2016, issued by the International Searching Authority in Application No. PCT/JP2015/053456.
Office Action dated Mar. 7, 2017 issued by the Japanese Patent Office in corresponding Japanese Application No. 2015-008324.

* cited by examiner

COLORING COMPOSITION, CURED FILM, COLOR FILTER, PATTERN FORMING METHOD, METHOD FOR MANUFACTURING COLOR FILTER, SOLID-STATE IMAGING DEVICE, AND IMAGE DISPLAY DEVICE

CROSS-REFERENCE TO RELATED APPLICATIONS

This application is a Continuation of PCT International Application No. PCT/JP2015/053456 filed on Feb. 9, 2015, which claims priority under 35 U.S.C §119(a) to Japanese Patent Application No. 2014-026460 filed on Feb. 14, 2014 and Japanese Patent Application No. 2015-008324 filed on Jan. 20, 2015. Each of the above application(s) is hereby expressly incorporated by reference, in its entirety, into the present application.

BACKGROUND OF THE INVENTION

1. Field of the Invention

The present invention relates to a coloring composition. The present invention further relates to a cured film, a color filter, a pattern forming method, a method for manufacturing a color filter, a solid-state imaging device, and an image display device, each using the coloring composition.

2. Description of the Related Art

Recently, in accordance with the development of personal computers, in particular, large-screen liquid crystal televisions, liquid crystal displays (LCD), in particular, color liquid crystal displays tend to be in increased demand. Organic EL displays are required to be distributed due to a demand for an additional increase in high quality. Meanwhile, as digital cameras and camera-mounted mobile phones are distributed, demands of solid-state imaging devices such as CCD image sensors are also greatly increased.

Color filters are used as key devices of the displays or optical elements, and the demand for higher quality and cost reduction is increasing. Such color filters usually comprise colored patterns with three colors of red (R), green (G), and blue (B), and divides light that passes through display devices or imaging devices into three colors.

Furthermore, as a colorant for forming a green pixel portion of a color filter, for example, halogenated copper phthalocyanine pigments including a bromine atom, such as Color Index (C. I.) Pigment Green 36, are well-known.

Recently, in order to secure a wider color gamut to enhance the color reproducibility of a liquid crystal display, it has been proposed to use a C. I. Pigment Green 58 (halogenated zinc phthalocyanine pigment) which is a halogenated phthalocyanine pigment having zinc used as a central metal (see JP2013-54080A, JP2013-54081A, JP2013-64993A, JP2013-64998A, and JP2013-64999A).

SUMMARY OF THE INVENTION

Color filters are known to have reduced crosstalk (color mixing of light) when forming into thin films. In order to form thin films with the color filters while maintaining the spectral patterns, it is necessary to increase the concentration of colorants in the total solid content of a coloring composition. However, if the concentration of colorants in the coloring composition is increased, the amount content of lithographic components is relatively decreased, and thus, it becomes difficult to form a pattern by a photolithography method. Thus, pattern formation is carried out by a dry etching method using a coloring composition having a high concentration of colorants.

The present inventors have investigated, and as a result, they could see that a coloring composition including a halogenated zinc phthalocyanine pigment and having a high concentration of colorants in the total solid content has a big change in viscosity over time and its viscosity stability is easily lowered.

Therefore, the present invention has an object to provide a coloring composition containing a halogenated zinc phthalocyanine pigment, which has excellent viscosity stability. The present invention has another object to provide a cured film, a color filter, a pattern forming method, a method for manufacturing a color filter, a solid-state imaging device, and an image display device, each using the coloring composition.

The present inventors have conducted extensive investigations, and as a result, they have found that by incorporating a trace amount of Group 2 element ions into the coloring composition, it is possible to improve the dispersibility of the halogenated zinc phthalocyanine pigment by keeping a good equilibrium between a resin and a pigment derivative, thereby improving the viscosity stability of the coloring composition. Specifically, the problems were solved by the following means <1>, and preferably <2> to <13>.

<1> A coloring composition comprising:

a colorant;

a resin; and a pigment derivative, in which the colorant contains a halogenated zinc phthalocyanine pigment, the content of the colorant with respect to the total solid content in the coloring composition is 50% by mass or more, and the content of the Group 2 element ions with respect to the mass of the halogenated zinc phthalocyanine pigment is 30 ppm by mass to 300 ppm by mass.

<2> The coloring composition as described in <1>, in which the calcium ions are contained as the Group 2 element ions, the content of the Group 2 element ions containing calcium ions with respect to the mass of the halogenated zinc phthalocyanine pigment is 30 ppm by mass to 300 ppm by mass, and the content of the calcium ions is 30 ppm by mass to 300 ppm by mass.

<3> The coloring composition as described in <1> or <2>, in which the resin has an acidic group and the pigment derivative has a basic group.

<4> The coloring composition as described in any one of <1> to <3>, further comprising a compound having an epoxy group.

<5> The coloring composition as described in <4>, in which the compound having an epoxy group has a structure having at least two benzene rings linked to each other via a hydrocarbon group.

<6> The coloring composition as described in <4> or <5>, in which the compound having an epoxy group is represented by the following General Formula (1):

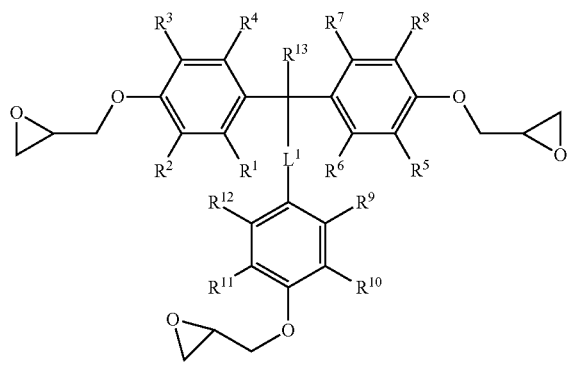

(1)

(in General Formula (1), $R^1$ to $R^{13}$ each independently represent a hydrogen atom, an alkyl group, an alkoxy group, or a halogen atom, and $L^1$ represents a single bond or a divalent linking group).

<7> The coloring composition as described in any one of <1> to <6>, which is used for formation of a colored layer of a color filter.

<8> A cured film formed by curing the coloring composition as described in any one of <1> to <7>.

<9> A color filter comprising the cured film as described in <8>.

<10> A pattern forming method comprising:
a step of applying the coloring composition as described in any one of <1> to <9> onto a support to form a coloring composition layer, followed by curing, to form a colored layer;
a step of forming a photoresist layer on the colored layer;
a step of patterning the photoresist layer by exposure and development to obtain a resist pattern; and
a step of dry etching the colored layer using the resist pattern as an etching mask.

<11> A method for manufacturing a color filter, comprising the pattern forming method as described in <10>.

<12> A solid-state imaging device comprising the color filter as described in <9> or a color filter obtained by the method for manufacturing a color filter as described in <11>.

<13> An image display device comprising the color filter as described in <9> or a color filter obtained by the method for manufacturing a color filter as described in <11>.

According to the present invention, it became possible to provide a coloring composition having excellent viscosity stability. It also became possible to provide a cured film, a color filter, a pattern forming method, a method for manufacturing a color filter, a solid-state imaging device, and an image display device, each using the coloring composition.

DESCRIPTION OF THE PREFERRED EMBODIMENTS

Figure 1:
FIG. 1 is a schematic cross-sectional view of a first colored layer.
Figure 2:
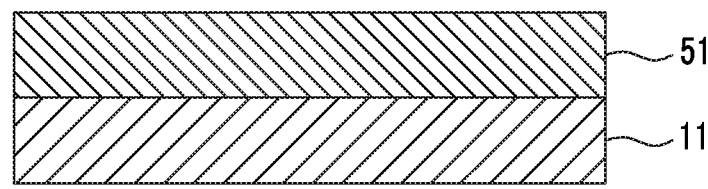
FIG. 2 is a schematic cross-sectional view showing a state where a photoresist layer is formed on the first colored layer.

Hereinafter, disclosures of the present invention will be described in detail. In the present specification, "(a value) to (a value)" is used in a meaning that the numeric values described before and after are included as the lower limit value and the upper limit value. Further, the organic EL element in the present invention refers to an organic electroluminescence element.

In the present specification, the total solid content refers to a total mass of the components remaining when a solvent is excluded from the entire composition of a coloring composition. Further, the solid content refers to a solid contents at 25° C. In addition, the viscosity is a value measured in the state where the temperature is adjusted to 25° C.

In citations for a group (atomic group) in the present specification, when the group is denoted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

Furthermore, "radiation" in the present specification means, for example, a bright line spectrum of a mercury lamp, far ultraviolet rays represented by an excimer laser, extreme ultraviolet rays (EUV rays), X-rays, electron beams, or the like. In addition, in the present invention, light means actinic rays or radiation. "Exposure" in the present specification includes, unless otherwise specified, not only exposure by a mercury lamp, far ultraviolet rays represented by an excimer laser, X-rays, EUV rays, or the like, but also writing by particle rays such as electron beams and ion beams.

Moreover, in the present specification, "(meth)acrylate" represents either or both of acrylate and methacrylate, "(meth)acryl" represents either or both of acryl and methacryl, and "(meth)acryloyl" represents either or both of acryloyl and methacryloyl.

In addition, in the present specification, a "monomeric material" and a "monomer" have the same definition. The monomer in the present specification refers to a compound which is distinguished from an oligomer or a polymer and has a weight-average molecular weight of 2,000 or less. In the present specification, a polymerizable compound refers to a compound having a polymerizable functional group, and may be a monomer or a polymer. The polymerizable functional group refers to a group involved in a polymerization reaction.

In the present specification, Me represents a methyl group, Et represents an ethyl group, Pr represents a propyl group, Bu represents a butyl group, and Ph represents a phenyl group in formulae.

In the present specification, a term "step" includes not only an independent step, but also steps which are not clearly distinguished from other In the present specification, the weight-average molecular weight and the number-average molecular weight are defined as a value in terms of polystyrene by GPC measurement. In the present specification, the weight-average molecular weight (Mw) and the number-average molecular weight (Mn) can be determined, for example, using HLC-8220 (manufactured by Tosoh Corporation) and TSKgel Super AWM-H (manufactured by Tosoh Corporation, 6.0 mm ID×15.0 cm) as a column, and a 10 mmol/L solution of lithium bromide in N-methylpyrrolidinone (NMP) as an eluant.

The pigment for use in the present invention means an insoluble colorant compound that is hardly dissolved in a solvent. Typically, it means a colorant compound that is present in the state where it is dispersed as particles in the present composition. Here, the solvent includes any solvents, and examples thereof include the solvents exemplified in the section of a solvent which will be described later.

In the present specification, the content of the Group 2 element ions is a value measured by flameless atomic light absorption spectrophotometry.

<Coloring Composition>

The coloring composition of the present invention is a coloring composition including a colorant, a resin, and a pigment derivative, in which the colorant contains a halogenated zinc phthalocyanine pigment, the content of the colorant with respect to the total solid content in the coloring composition is 50% by mass or more, and the content of the Group 2 element ions with respect to the mass of the halogenated zinc phthalocyanine pigment is 30 ppm by mass to 300 ppm by mass.

As described above, the halogenated zinc phthalocyanine pigment tends to have a strongly acidic pigment surface, and therefore, there is tendency that the interaction between the resin and the pigment derivative is suppressed and the viscosity stability is deteriorated. By incorporating a trace amount of Group 2 element ions into the coloring composition, the viscosity stability of the coloring composition is improved. The reason why such effects of the present invention are obtained is thought to be that Group 2 element ions are absorbed onto the surface of the halogenated zinc phthalocyanine pigment, the surface of halogenated zinc phthalocyanine pigment is modified, and thus, inhibition of the interaction between the resin and the pigment derivative by the halogenated zinc phthalocyanine pigment is suppressed, and as a result, the equilibrium between a resin and a pigment derivative in the coloring composition can be kept good, leading to improvement in the dispersibility of the halogenated zinc phthalocyanine pigment. Here, the viscosity stability means a small change in the viscosity of the coloring composition.

Moreover, if a cured film of a colored pattern or the like is formed by using a coloring composition which includes a halogenated zinc phthalocyanine pigment and has a high concentration of colorants in the total solid content, there are some cases where acicular crystals based on color mixing with adjacent colored patterns during heating at a high temperature are generated. However, it is also possible to suppress the generation of acicular crystals based by the coloring composition of the present invention.

Hereinafter, the coloring composition of the present invention will be described in detail.

<<Colorant>>

<<<Halogenated Zinc Phthalocyanine Pigment>>>

The coloring composition of the present invention uses a halogenated zinc phthalocyanine pigment as a colorant.

The halogenated zinc phthalocyanine pigment has a planar structure in which zinc as a central metal is positioned within a region surrounded by four nitrogen atoms of an isoindole ring, as represented by the following General Formula (A1), as a halogenated phthalocyanine pigment having zinc as a central atom.

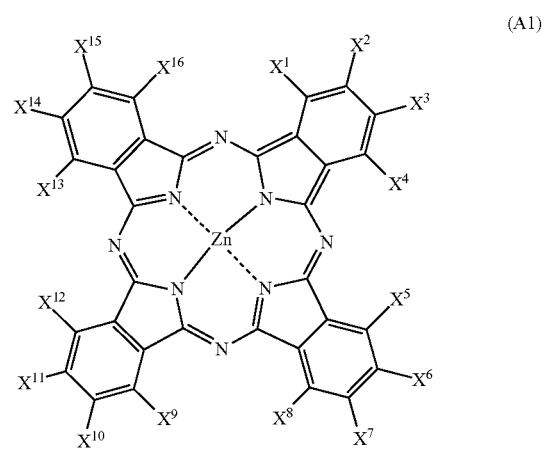

(A1)

In General Formula (A1), it is preferable that in any 8 to 16 positions of $X^1$ to $X^{16}$ each represent a halogen atom, and the residues each represent a hydrogen atom or a substituent. Further, it is preferable that in $X^1$ to $X^{16}$, the number of halogen atoms is 8 to 12. Further, it is preferable that $X^1$ to $X^{16}$ include at least one of each of a chlorine atom, a bromine atom, or a hydrogen atom.

In one embodiment of $X^1$ to $X^{16}$, it is exemplified that the number of chlorine atoms is 0 to 14, the number of bromine atoms is 1 to 14, and the number of hydrogen atoms is 0 to 6, and it is preferable that the number of chlorine atoms is 0 to 4, the number of bromine atoms is 8 to 12, and the number of hydrogen atoms is 0 to 4. In addition, in these embodiments, it is more preferable that one or more hydrogen atoms are included.

Those represented by halogen atoms in $X^1$ to $X^{16}$ may be all the same halogen atoms, which may be different from each other.

In General Formula (A1), the number of bromine atoms/ the number of chlorine atoms is preferably 0.3 to 5.0, more preferably 0.5 to 4.0, and still more preferably 1.0 to 3.5.

Examples of the halogen atom include a chlorine atom, a bromine atom, a fluorine atom, and an iodine atom, and in particular, a bromine atom and a chlorine atom are preferable.

For the substituent, reference can be made to the descriptions of paragraph Nos. 0025 to 0027 of JP2013-209623A, the contents of which will be incorporated herein by reference.

For the halogenated zinc phthalocyanine pigment, reference can be made to, for example, the descriptions of paragraph Nos. 0013 to 0039, and 0084 to 0085 of JP2007-284592A, the contents of which will be incorporated herein by reference.

Examples of the halogenated zinc phthalocyanine pigment include C. I. Pigment Green 58 as a compound classified into a pigment in Color Index (C. I.; published by The Society of Dyers and Colourists). The average composition of C. I. Pigment Green 58 is as follows: by way of a representative example, out of $X^1$ to $X^{16}$, approximately 10 members are bromine atoms, approximately 3 members are chlorine atoms, and approximately 3 members are hydrogen atoms.

In the coloring composition of the present invention, the content of the halogenated zinc phthalocyanine pigment with respect to the total solid content in the coloring composition is preferably 10% by mass to 80% by mass, more preferably 20% by mass to 70% by mass, and particularly preferably 30% by mass to 60% by mass.

Furthermore, the content of the halogenated zinc phthalocyanine pigment in the total amount of the colorant is preferably 30% by mass to 100% by mass, more preferably 40% by mass to 90% by mass, and particularly preferably 50% by mass to 85% by mass.

According to the present invention, even when the content of the halogenated zinc phthalocyanine pigment is increased, the viscosity stability is good, and in the case where the content of the halogenated zinc phthalocyanine pigment is high, the effects of the present invention are remarkable.

One kind of the halogenated zinc phthalocyanine pigment may be used. Further, $X^1$ to $X^{16}$ of General Formula (A1) may include different combinations of two or more kinds of the compounds. In the case of including two or more kinds, the total amount thereof is within the range.

<<Other Halogenated Phthalocyanine Pigment>>

The coloring composition of the present invention may contain a halogenated phthalocyanine pigment (hereinafter referred to as a second halogenated phthalocyanine pigment) other than the halogenated zinc phthalocyanine pigment.

Examples of the second halogenated phthalocyanine pigment include one or more kinds selected from a halogenated phthalocyanine pigment having one selected from Al, Ti, Fe, Sn, Pb, Ga, V, Mo, Ta, or Nb as a central metal, and a halogenated phthalocyanine pigment having no central metal. By incorporating the second halogenated phthalocyanine pigment into the coloring composition, a cured film in which color mixing hardly occurs can be obtained. The reason therefor is presumed that the presence of the second halogenated phthalocyanine pigment in the halogenated zinc phthalocyanine pigment causes non-evenness in the crystal structure of the pigment (particularly the outermost surface of the pigment), and pigments that are originally hydrophobic pigments are slightly hydrophilicized. As a result, the affinity for a developing liquid or the like is improved, and thus, residues are reduced.

In the case where the coloring composition of the present invention contains the second phthalocyanine pigment, the content of the second phthalocyanine pigment in the total amount of the colorant is preferably 0.01% by mass to 1.00% by mass. If the content of the second phthalocyanine pigment is within the range, color mixing can be more effectively suppressed.

<<<Other Colorants>>>

The coloring composition of the present invention may include other colorants, in addition to the halogenated zinc phthalocyanine pigment, and preferably includes other colorants. As other colorants, yellow colorants are preferably used. Other colorants may be either a dye or a pigment, and both may be used in combination.

Examples of the pigment include various inorganic pigments or organic pigments known in the art. Further, when it is considered that either inorganic or organic pigments having a high transmittance are preferable, pigments having an average particle diameter which is as small as possible are preferably used, and when the handleability is also considered, the average particle diameter of the pigments is preferably 0.01 μm to 0.1 μm, and more preferably 0.01 μm to 0.05 μm.

Examples of the inorganic pigment include metal compounds represented by metal oxides, metal complex salts, or the like. Specific examples thereof include black pigments such as carbon black and titanium black, metal oxides of iron, cobalt, aluminum, cadmium, lead, copper, titanium, magnesium, chromium, zinc, antimony, and the like, and composite oxides of the metals.

Examples of the organic pigments which can be preferably used in the present invention include the following pigments, but the present invention is not limited thereto.

C. I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like, C. I. Pigment Orange 2, 5, 13, 16, 17:1, 31, 34, 36, 38, 43, 46, 48, 49, 51, 52, 55, 59, 60, 61, 62, 64, 71, 73, and the like, C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279, C. I. Pigment Green 7, 10, 36, and 37, C. I. Pigment Violet 1, 19, 23, 27, 32, 37, and 42, C. I. Pigment Blue 1, 2, 15, 15:1, 15:2, 15:3, 15:4, 15:6, 16, 22, 60, 64, 66, 79, and 80, and C. I. Pigment Black 1.

These organic pigments may be used singly or in combination of various pigments to improve color purity.

Among those, C. I. Pigment Yellow 129, 138, 150, and 185 are preferable, and C. I. Pigment Yellow 150 and 185 are more preferable.

As the dye which can be used in the coloring composition of the present invention, for example, the colorants disclosed in JP1989-90403A (JP-S64-90403A) JP1989-91102A (JP-S64-91102A), JP1989-94301A (JP-H01-94301A), JP1994-11614A (JP-H06-11614A), JP2592207B, U.S. Pat. No. 4,808,501A, U.S. Pat. No. 5,667,920A, U.S. Pat. No. 505,950A, U.S. Pat. No. 5,667,920A, JP1993-333207A (JP-H05-333207A), JP1994-35183A (JP-H06-35183A), JP1994-51115A (JP-H06-51115A), JP1994-194828A (JP-H06-194828A), and the like. In terms of classification based on the chemical structure, it is possible to use a pyrazoleazo compound, a pyrromethene compound, an anilinoazo compound, a triphenylmethane compound, an anthraquinone compound, a benzylidene compound, an oxonol compound, a pyrazolotriazoleazo compound, a pyridoneazo compound, a cyanine compound, a phenothioazine compound, a pyrrolopyrazoleazomethine compound, and the like. Further, as the dye, a colorant multimer may be used. Examples of the colorant multimer include the compounds described in JP2011-213925A and JP2013-041097A.

In the case where the coloring composition of the present invention contains other colorants, the content of other colorants is preferably 10 parts by mass to 150 parts by mass, and more preferably 20 parts by mass to 120 parts by mass, with respect to 100 parts by mass of the halogenated zinc phthalocyanine pigment.

Moreover, in the case where C. I. Pigment Yellow 150 and/or C. I. Pigment Yellow 185 is/are contained as other colorants, its content is preferably 10 parts by mass to 150 parts by mass, and more preferably 20 parts by mass to 120 parts by mass, with respect to 100 parts by mass of the halogenated zinc phthalocyanine pigment. Within the range, spectral characteristics preferred in terms of color reproducibility are obtained.

For the coloring composition of the present invention, the content of the colorant with respect to the total solid content in the coloring composition is 50% by mass or more, preferably 55% by mass or more, more preferably 60% by mass or more, and particularly preferably 65% by mass or more. By setting the content of the colorant to 50% by mass or more, the concentration of colorants in the solid content increases, and thus, the crosstalk (color mixing of light) when a color filter is formed into a thin film can be reduced. Further, in the case where dry etching is carried out using the coloring composition of the present invention, the etching rate during formation of a pattern by dry etching decreases. Thus, the difference in the etching rates between the upper part and the lower part of the pattern decreases, and therefore, the perpendicularity of the pattern to the substrate increases, and thus, rectangularity is improved. Incidentally, the film thickness of the colored pattern formed by etching correspondingly increases, and surface roughness during a flattening treatment suppressed. Further, when the concentration of colorants is high, the strength of the colored layer increases, and thus, the surface roughness can also be reduced by a flattening treatment due to a polishing treatment such as a CMP treatment. Therefore, the coloring composition can be preferably used as a coloring composition for dry etching.

Other colorants may be used singly or in combination of two or more kinds thereof. In the case of including two or more kinds, the total amount is preferably within the range.

<<Group 2 Element Ion>>

The coloring composition of the present invention contains Group 2 element ions.

By incorporating the Group 2 element ions into the coloring composition of the present invention, the viscosity stability of the coloring composition can be improved. Further, it is possible to suppress the acicular crystals from being precipitated during heating at a high temperature. In addition, even when an alkali metal is used instead of the Group 2 element ions, the effects cannot be sufficiently obtained. The reason is thought to be that the valency of the alkali metal is almost the half of that the Group 2 element ions, the area with absorption onto the pigment is reduced to the half, and thus the adsorption efficiency onto the pigment is reduced.

Examples of the Group 2 element ions include a beryllium ion, a magnesium ion, a calcium ion, a strontium ion, and a barium ion, preferably a magnesium ion and/or a calcium ion, and particularly preferably a calcium ion. The calcium ion is particularly excellent in improvement of the viscosity stability.

The source from which the Group 2 element ions are derived is not particularly limited, and ones derived from a salt formed from a Group 2 element ion and an anion can be preferably used. The salt is preferably at least one selected from a chloride salt, a hydroxide salt, a carbonate salt, and a hydrogen carbonate salt, more preferably at least one selected from a chloride salt, a hydroxide salt, and a hydrogen carbonate salt, and particularly preferably a chloride salt.

Specific examples thereof include calcium chloride, calcium hydroxide, calcium hydrogen carbonate, magnesium chloride, calcium carbonate, magnesium hydroxide, magnesium carbonate, and magnesium hydrogen carbonate, and preferably calcium chloride.

In the coloring composition of the present invention, the content of the Group 2 element ions with respect to the mass of the halogenated zinc phthalocyanine pigment is 30 ppm by mass to 300 ppm by mass, preferably 50 ppm by mass to 200 ppm by mass, and more preferably 70 ppm by mass to 150 ppm by mass. If the content of the Group 2 element ions is within the range, the viscosity stability is improved, and further, a coloring composition in which acicular crystals are hardly precipitated can be obtained.

Group 2 element ions may be used singly or in combination of two or more kinds thereof. In the case of including two or more kinds, the total content is within the range. Furthermore, in the case where calcium ions are contained as the Group 2 element ions, the content of the Group 2 element ions containing calcium ions with respect to the mass of the halogenated zinc phthalocyanine pigment is 30 ppm by mass to 300 ppm by mass, and the content of the calcium ions is preferably 30 ppm by mass to 300 ppm by mass. The content of the calcium ions is preferably 50 ppm by mass to 200 ppm by mass, and more preferably 70 ppm by mass to 150 ppm by mass. Further, the content of the calcium ions in the Group 2 element ion is preferably 80% by mass to 100% by mass, more preferably 90% by mass to 100% by mass, still more preferably 95% by mass to 100% by mass, and particularly preferably constituted with only calcium ions.

<<Alkali Metal Ions>>

The coloring composition of the present invention may further include an alkali metal ion.

The content of the alkali metal ion is preferably 500 ppm by mass or less with respect to the mass of the halogenated zinc phthalocyanine pigment.

Examples of the alkali metal ions include a lithium ion, a potassium ion, and a sodium ion. By incorporating the alkali metal ions, the effects are obtained, but a case where Group 2 element ions are added is more remarkable.

The source from which the alkali metal ions is derived is not particularly limited, and those derived from a salt formed from an alkali metal ion and an anion can be preferably used. The salt is preferably at least one selected from a chloride salt, a hydroxide salt, carbonate, and hydrogen carbonate, more preferably at least one selected from a chloride salt, a hydroxide salt, and hydrogen carbonate, and particularly preferably a chloride salt.

<<Resin>>

The coloring composition of the present invention includes a resin. The resin usually acts as a dispersant that disperses pigments in the coloring composition.

The resin which acts as a dispersant is preferably substantially constituted with only an acidic resin or a basic resin. When the resin which acts as a dispersant is constituted with only an acidic resin or a basic resin, the dispersibility of pigments can further be improved. Above all, it is particularly preferable that the resin which acts as a dispersant is substantially constituted with only an acidic resin. Further, "being substantially constituted with only an acidic resin" means that the content of the resins other than the acidic resins in the resins is preferably 5% by mass or less, more preferably 3% mass or less, and still more preferably 1% by mass or less, and particularly preferably, it does not contains the resin. In addition, "substantially constituted with only a basic resin" means that the content of the resins other than the basic resins in the resins is preferably 5% by mass or less, more preferably 3% mass or less, and still more preferably 1% by mass or less, and particularly preferably, it does not contains the resin.

Here, the acidic resin means that the amount of the acid groups is more than that of the basic groups. For the acidic resin, when the sum of the amount of the acid groups and the amount of basic groups in the resin is defined as 100% by mole, the amount of the acid groups accounts for 70% by mole or more, and more preferably, the resin is substantially composed of only acid groups. The acid groups contained in the acidic resin is preferably a carboxyl group. The acid value of the acidic resin is preferably 40 mgKOH/g to 105 mgKOH/g, more preferably 50 mgKOH/g to 105 mgKOH/g, and still more preferably 60 mgKOH/g to 105 mgKOH/g.

Furthermore, the basic resin means that the amount of basic groups is more than that of acid groups. For the basic resin, the amount of basic groups preferably accounts for 50% by mole or more when the sum of the amount of acid groups and the amount of basic groups in the resin is defined as 100% by mole. The basic group contained in the basic resin is preferably amine.

Examples of the resin which can be used in the present invention include polymer dispersants (for example, a polyamide amine and a salt thereof, a polycarboxylic acid and a salt thereof, a high-molecular-weight unsaturated acid ester, a modified polyurethane, a modified polyester, a modified poly(meth)acrylate, a (meth)acrylic copolymer, and a naphthalene sulfonate formalin condensate), and a polyoxyethylene alkyl phosphoric ester, a polyoxyethylene alkylamine, an alkanolamine, and an pigment derivative.

The polymer dispersants can be further classified into linear polymers, terminal-modified polymers, graft type polymers, and block type polymers, according to the structure.

The polymer dispersant is adsorbed on the surface of a pigment, and thus functions to prevent reaggregation. In this regard, preferred structures of the polymer dispersant include a terminal-modified polymer having an anchoring site onto a pigment surface, a graft type polymer, and a block type polymer.

Examples of the terminal-modified polymers which has a moiety anchored to the pigment surface include a polymer having a phosphoric acid group in the terminal as described in JP1991-112992A (JP-H03-112992A), JP2003-533455A, and the like, a polymer having a sulfonic acid group in the terminal as described in JP2002-273191A, a polymer having a partial skeleton or a heterocycle of an organic colorant as described in JP1997-77994A (JP-H09-77994A), and the like. Moreover, a polymer obtained by introducing two or more moieties (acid groups, basic groups, partial skeletons of an organic colorant, heterocycles, or the like) anchored to the pigment surface into a polymer terminal as described in JP2007-277514A is also preferable since this polymer is excellent in dispersion stability.

Examples of the graft type polymers having a moiety anchored to the pigment surface include polyester-based dispersants, and specifically, a product of a reaction between a poly(lower alkyleneimine) and a polyester, which is described in JP1979-37082A (JP-S54-37082A), JP1996-507960A (JP-H08-507960A), JP2009-258668A, and the like, a product of a reaction between a polyallylamine and a polyester, which is described in JP1997-169821A (JP-H09-169821A) and the like, a copolymer of a macromonomer and a nitrogen atom monomer, which is described in JP1998-339949A (JP-H10-339949A), JP2004-37986A, WO2010/110491A, and the like, a graft polymer having a partial skeleton or a heterocycle of an organic colorant, which is described in JP2003-238837A, JP2008-9426A, JP2008-81732A, and the like, and a copolymer of a macromonomer and an acid group-containing monomer, which is described in JP2010-106268A, and the like. In particular, from the viewpoint of the dispersibility and the dispersion stability of a pigment dispersion liquid, and the developability exhibited by a coloring composition using a pigment dispersion, the amphoteric dispersion resin having basic and acid groups, described in JP2009-203462A, is particularly preferable.

As the macromonomer used in producing a graft type polymer having a moiety anchored to the pigment surface by radical polymerization, known macromonomers can be used, and examples thereof include macromonomers AA-6 (polymethyl methacrylate having a methacryloyl group as a terminal group), AS-6 (polystyrene having a methacryloyl group as a terminal group), AN-6S (a copolymer of styrene and acrylonitrile that has a methacryloyl group as a terminal group), and AB-6 (polybutyl acrylate having a methacryloyl group as a terminal group) manufactured by TOAGOSEI, CO., LTD.; PLACCEL FM 5 (a product obtained by adding 5 molar equivalents of $\epsilon$-caprolactone to 2-hydroxyethyl methacrylate) and FA10L (a product obtained by adding 10 molar equivalents of $\epsilon$-caprolactone to 2-hydroxyethyl acrylate) manufactured by DAICEL CORPORATION; a polyester-based macromonomer described in JP1990-272009A (JP-H02-272009A), and the like. Among these, from the viewpoints of dispersibility and dispersion stability of the pigment dispersion, and the developability exhibited by a coloring composition using the pigment dispersion, the polyester-based macromonomer excellent in flexibility and solvent compatibility is particularly preferable. Furthermore, a polyester-based macromonomer represented by the polyester-based macromonomer described in JP1990-272009A (JP-H02-272009A) is most preferable.

As the block type polymer having a moiety anchored to the pigment surface, the block type polymers described in JP2003-49110A, JP2009-52010A, and the like are preferable.

The resin which can be used in the present invention are available as a commerically available product, and specific examples thereof include "DA-7301" manufactured by Kusumoto Chemicals, Ltd., "DISPERBYK-101 (polyamidamine phosphate), 107 (carboxylic ester), 110 (copolymer including an acid group), 111 (phosphoric acid-based dispersant), 130 (polyamide), 161, 162, 163, 164, 165, 166, and 170 (polymeric copolymers)", and "BYK-P104 and P105 (high-molecular-weight unsaturated polycarboxylic acids)", manufactured by BYK Additives & Instruments, "EFKA 4047, 4050 to 4010 to 4165 (polyurethane-based dispersants), EFKA 4330 to 4340 (block copolymers), 4400 to 4402 (modified polyacrylates), 5010 (polyesteramide), 5765 (high-molecular-weight polycarboxylate), 6220 (aliphatic polyester), 6745 (phthalocyanine derivative), and 6750 (azo pigment derivative)", manufactured by EFKA, "AJISPER PB821, PB822, PB880, and PB881" manufactured by Ajinomoto Fine-Techno Co., Inc., "FLOWLEN TG-710 (urethane oligomer)" and "POLYFLOW No. 50E and No. 300 (acrylic copolymer)", manufactured by KYOEISHA CHEMICAL CO., LTD., "DISPARLON KS-860, 873SN, 874, and #2150 (aliphatic polyvalent carboxylic acid),

7004 (polyether ester), DA-703-50, DA-705, and DA-725", manufactured by Kusumoto Chemicals, Ltd., "DEMOL RN, N (naphthalene sulfonate formalin polycondensates), MS, C, and SN-B (aromatic sulfonate formalin polycondensates)", "HOMOGENOL L-18 (polymeric polycarboxylic acid)", "EMULGEN 920, 930, 935, and 985 (polyoxyethylene nonyl phenyl ethers)", and "ACETAMINE 86 (stearylamine acetate)", manufactured by Kao Corporation, "SOLSPERSE 5000 (phthalocyanine derivative), 22000 (azo pigment derivative), 13240 (polyesteramine), 3000, 17000, and 27000 (polymers having a functional portion in the terminal portion), and 24000, 28000, 32000, and 38500 (graft polymers)", manufactured by Lubrizol Japan Ltd., "NIKKOL T106 (polyoxyethylene sorbitan monooleate), MYS-IEX (polyoxyethylene monostearate)" manufactured by NIKKO CHEMICALS Co., Ltd., "HINOACT T-8000E" and the like manufactured by Kawaken Fine Chemicals Co., Ltd., "ORGANOSILOXANE POLYMER KP341" manufactured by Shin-Etsu Chemical Co., Ltd., "W001: Cationic Surfactants" manufactured by Yusho Co., Ltd., nonionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan aliphatic ester, and anionic surfactants such as "W004, W005, and W017", "EFKA-46, EFKA-47, EFKA-47EA, EFKA POLYMER 100, EFKA POLYMER 400, EFKA POLYMER 401, and EFKA POLYMER 450", manufactured by MORISHITA SANGYO CO., LTD., polymer dispersants such as "DISPERSE AID 6, DISPERSE AID 8, DISPERSE AID 15, and DISPERSE AID 9100" manufactured by SAN NOPCO Ltd., "ADEKA PLURONIC L31, F38, L42, L44, L61, L64, F68, L72, P95, F77, P84, F87, P94, L101, P103, F108, L121, and P-123" manufactured by ADEKA Corporation, and "IONET (trade name) S-20" manufactured by Sanyo Chemical Industries, Ltd.

In addition, as the resin, acryl-Based FFS-6752, acryl-Based FFS-187, ACRYCURE RD-F8, or Cyclomer P can be used. Further, the following resins can also be used.

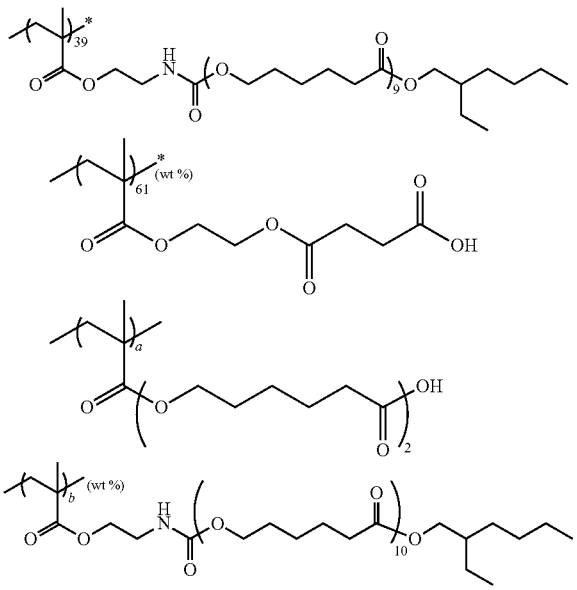

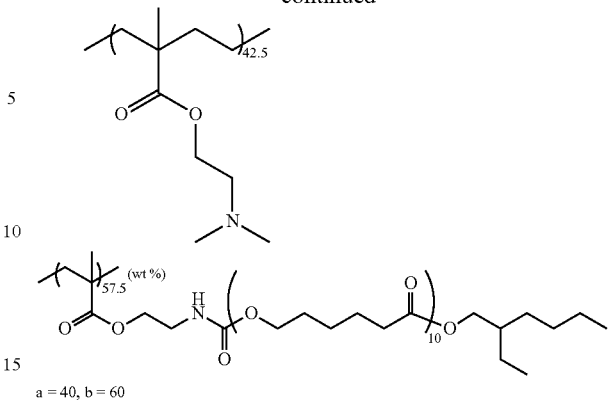

Furthermore, a block copolymer obtained by radical polymerizing a polymerizable unsaturated compound in the presence of a reversible addition-fragmentation chain transfer agent (RAFT agent) such as a dithiocarbonyl compound, and a radical initiator, or a copolymer having a narrow molecular weight distribution may also be used as the dispersant. Specific examples of such resins may include the resins described in paragraph Nos. 0053 to 0129 of JP2008-242081A, paragraph Nos. 0049 to 0117 of JP2008-176218A, and the like, the contents of which will be incorporated herein by reference. In addition, the block copolymer or the copolymer having a narrow molecular weight distribution may also be used as an alkali-soluble resin.

These resins may be used singly or in combination of two or more kinds thereof. In the present invention, it is particularly preferable to use a combination of a pigment derivative and a polymer dispersant.

The content of the resin in the coloring composition of the present invention is preferably 10 parts by mass to 100 parts by mass, more preferably 20 parts by mass to 85 parts by mass, and still more preferably 25 parts by mass to 70 parts by mass, with respect to 100 parts by mass of the pigment.

One kind or two or more kinds of the resin may be included in the coloring composition of the present invention. In the case where two or more kinds are included, the total amount thereof is preferably within the range.

The resins may be the same as or different from each other per pigment to be used, and are preferably the same as each other per pigment to be used.

<<Pigment Derivatives>>

It is preferable that the coloring composition of the present invention contains a pigment derivative. The pigment derivative is a compound having a structure in which a portion of an organic pigment is substituted with an acidic group, a basic group, or a phthalimidomethyl group. As the pigment derivative, a pigment derivative having an acidic group or a basic group is preferable from the viewpoints of dispersibility and dispersion stability. A pigment derivative having a basic group is particularly preferable. Further, a combination of the resin (dispersant) as described above with a pigment derivative is an acidic resin in which a resin has an acid group, and a combination in which the pigment derivative has a basic group is preferable. By this, it is possible to further improve the viscosity stability of the coloring composition. In addition, it is possible to suppress the generation of acicular crystals during heating at a high temperature.

Examples of the organic pigment for constituting the pigment derivative include a diketopyrrolopyrrole-based pigment, an azo-based pigment, a phthalocyanine-based pigment, an anthraquinone-based pigment, a quinacridone-based pigment, a dioxazine-based pigment, a perinone-based pigment, a perylene-based pigment, a thioindigo-based pigment, an isoindoline-based pigment, an isoindolinone-based pigment, a quinophthalone-based pigment, an indanthrene-based pigment, and a metal complex-based pigment.

In addition, as the acidic group contained in the pigment derivative, a sulfonic acid group, a carboxylic acid group, and a quaternary ammonium salt group thereof are preferable; a carboxylic acid group and a sulfonic acid group are more preferable; and a sulfonic acid group is particularly preferable. As the basic group contained in the pigment derivative, an amino group is preferable, and a tertiary amino group is particularly preferable.

In particular, the pigment derivative is preferably a quinoline-based pigment derivative, a benzimidazolone-based pigment derivative, or an isoindoline-based pigment derivative, and more preferably a quinoline-based pigment derivative or a benzimidazolone-based pigment derivative. In particular, a pigment derivative having the following structure is preferable.

$$A\text{-}B\text{-}(C\text{-}D\text{-}E)_t \quad (P)$$

In General Formula (P), A represents a partial structure selected from the following General Formulae (PA-1) to (PA-3). B represents a single bond or a (t+1)-valent linking group. C represents a single bond, —NH—, —CONH—, —CO$_2$—, —SO$_2$NH—, —O—, —S—, or —SO$_2$—. D represents a single bond, an alkylene group, a cycloalkylene group, or an arylene group. E represents —SO$_3$H, —SO$_3$M (M represents an alkali metal atom), —CO$_2$H, or N(Rpa)(Rpb). Rpa and Rpb each independently represent an alkyl group or an aryl group, and Rpa and Rpb may be linked with each other to form a ring. t represents an integer of 1 to 5.

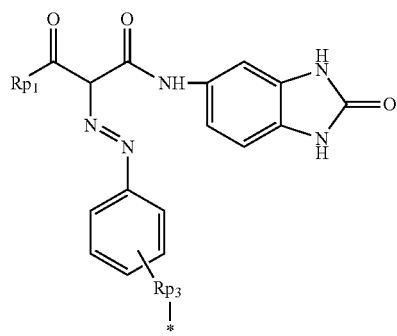
(PA-1)

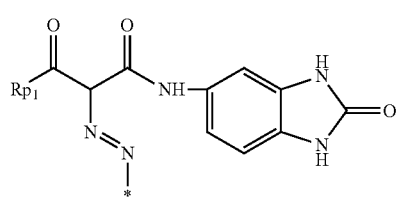
(PA-2)

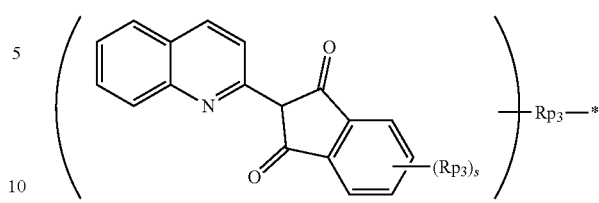
(PA-3)

In General Formulae (PA-1) and (PA-2), Rp$_1$ represents an alkyl group having 1 to 5 carbon atoms or an aryl group. In General Formula (PA-3), Rp$_2$ represents a hydrogen atom, a halogen atom, an alkyl group, or a hydroxyl group. s represents an integer of 1 to 4. In the case where s is 2 or more, the plurality of Rp$_2$'s may be the same as or different from each other. In General Formula (PA-1) and General Formula (PA-3), Rp$_3$ represents a single bond, —NH—, —CONH—, —CO$_2$—, —SO$_2$NH—, —O—, —S—, or —SO$_2$—. * represents a linking moiety with B.

In General Formula (P), in particular, Rp$_1$ is preferably a methyl group or a phenyl group, and most preferably a methyl group. In General Formula (PA-3), Rp$_2$ is preferably a hydrogen atom or a halogen atom, and most preferably a hydrogen atom or a chlorine atom.

In General Formula (P), examples of the (t+1)-valent linking group represented by B include an alkylene group, a cycloalkylene group, an arylene group, and a heteroarylene group. Among these, in particular, a linking group represented by the following Structural Formulae (PA-4) to (PA-9) is preferable.

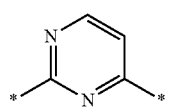
(PA-4)

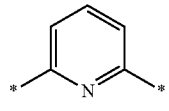
(PA-5)

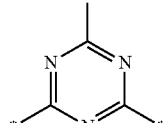
(PA-6)

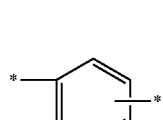
(PA-7)

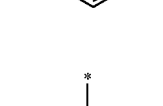
(PA-8)

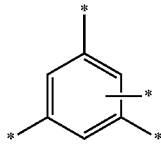
(PA-9)

In particular, a pigment derivative having a linking group represented by Structural Formula (PA-5) or (PA-8) among Structural Formulae (PA-4) to (PA-9) as B is preferable due to excellent dispersibility.

In General Formula (P), examples of the alkylene group, the cycloalkylene group, and the arylene group which are represented by D include methylene, ethylene, propylene, butylene, pentylene, hexylene, decylene, cyclopropylene, cyclobutylene, cyclopentylene, cyclohexylene, cyclooctylene, cyclodecylene, phenylene, and naphthylene. Among these, in particular, D is preferably an alkylene group, and more preferably an alkylene group having 1 to 5 carbon atoms.

In General Formula (P), in the case where E represents —N(Rpa)(Rpb), examples of the alkyl group and the aryl group in Rpa and Rpb include a methyl group, an ethyl group, a propyl group, an isopropyl group, a butyl group, a sec-butyl group, a tert-butyl group, a pentyl group, an isopentyl group, a neopentyl group, a hexyl group, an octyl group, a decyl group, a cyclopropyl group, a cyclobutyl group, a cyclopentyl group, a cyclohexyl group, a cyclooctyl group, a cyclodecyl group, a phenyl group, and a naphthyl group. Rpa and Rpb are particularly preferably an alkyl group, and most preferably an alkyl group having 1 to 5 carbon atoms. In General Formula (P), t is preferably 1 or 2.

Specific examples of the pigment derivative are shown below, but the present invention is not limited thereto.

For other pigment derivatives, reference can be made to the descriptions of paragraphs 0162 to 0183 of JP2011-252065A, the contents of which will be incorporated herein by reference.

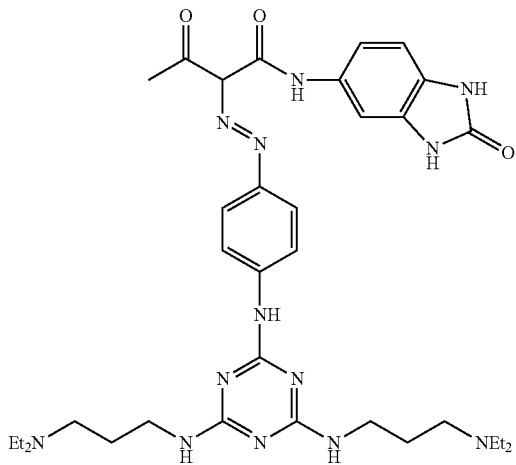
(A-1)

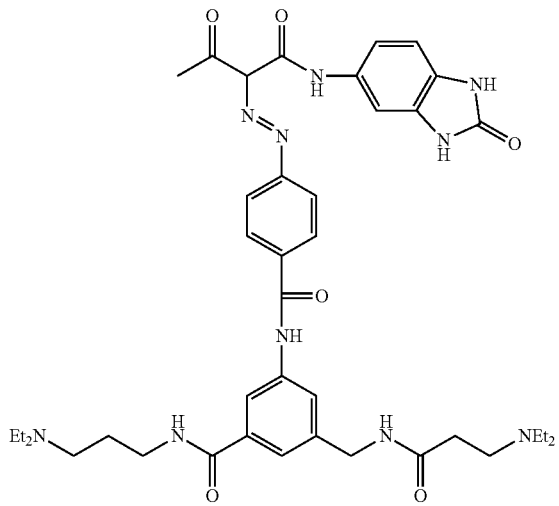
(A-2)

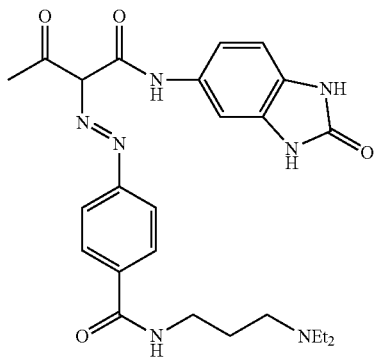
(A-3)

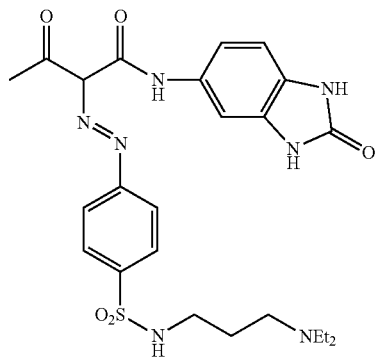
(A-4)

-continued
(A-5)
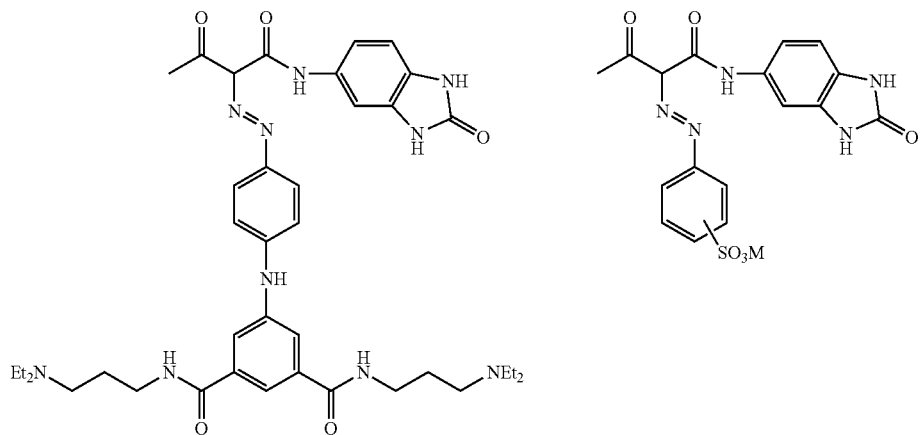
(A-6)
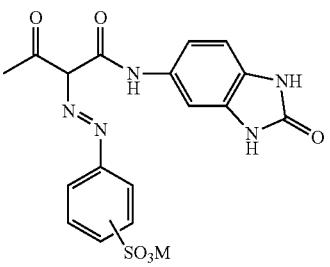
(A-7)
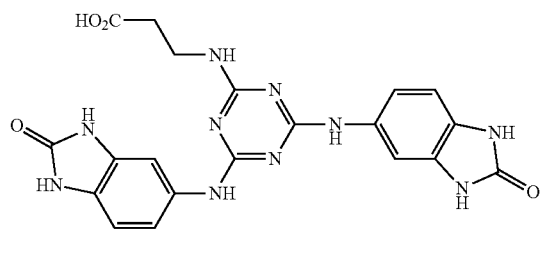
(A-8)
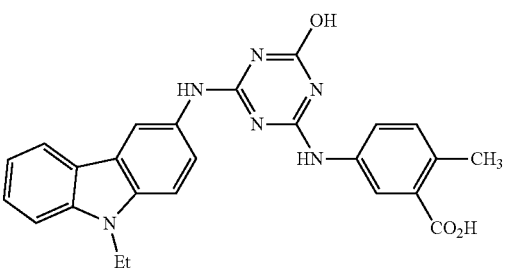
(A-9)
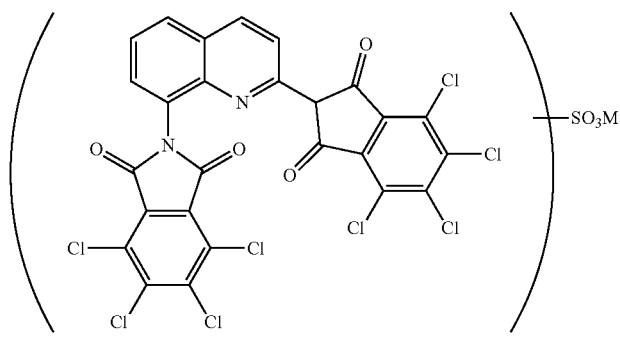
(A-10)
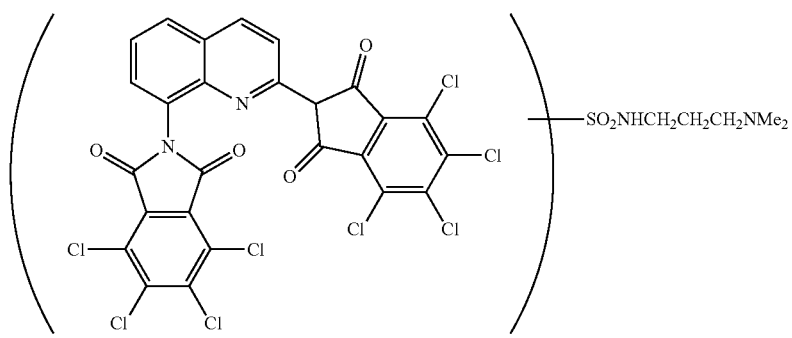

-continued
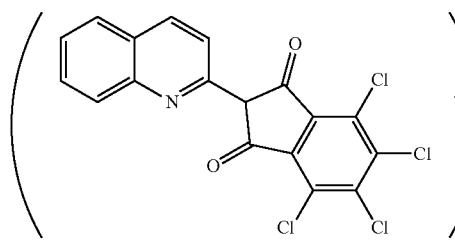 (A-11)
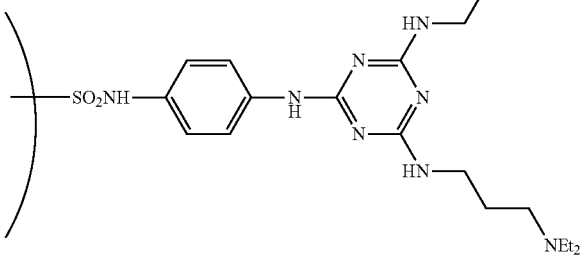
(A-12) 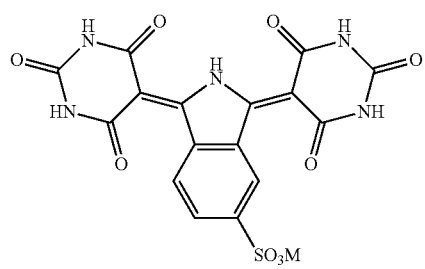
(A-13) 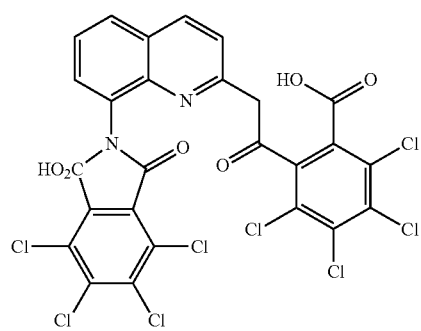
(A-14) 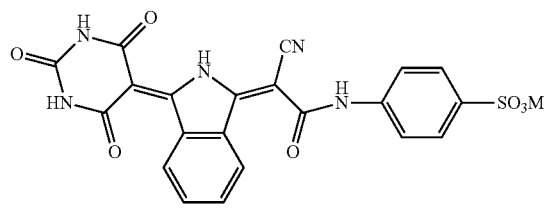
(A-15) 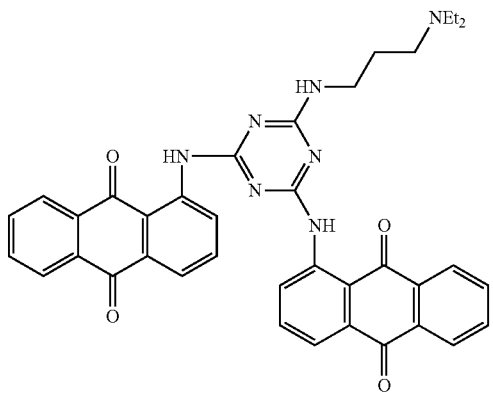
(A-16) 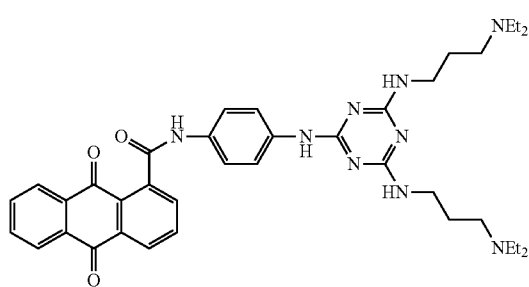
(A-17) 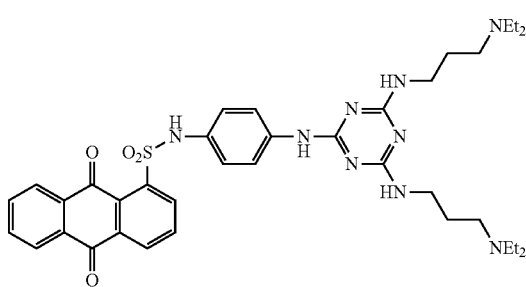
(A-18) 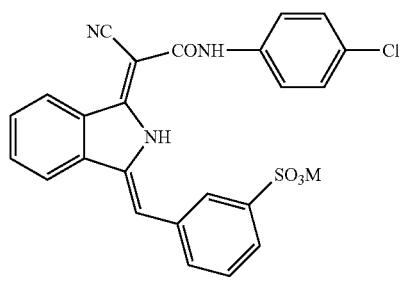

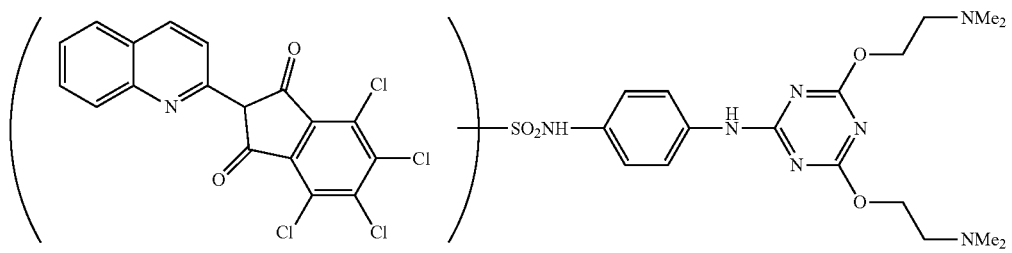
(A-19)
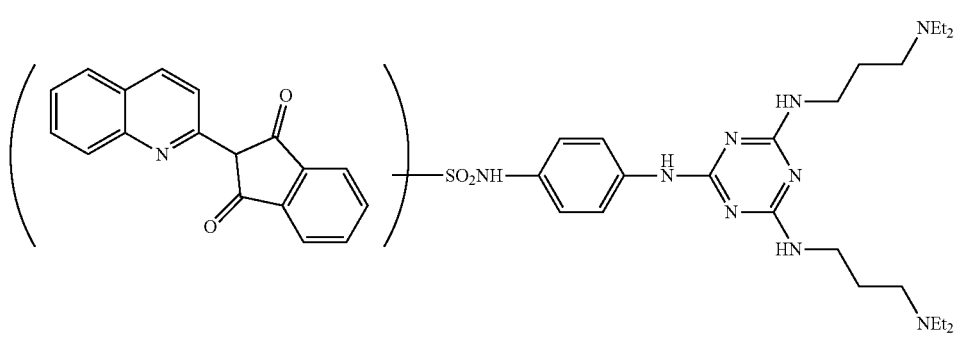
(A-20)
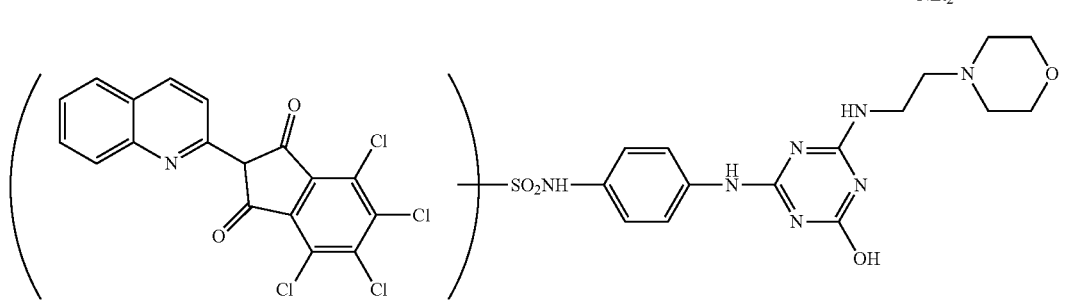
(A-21)
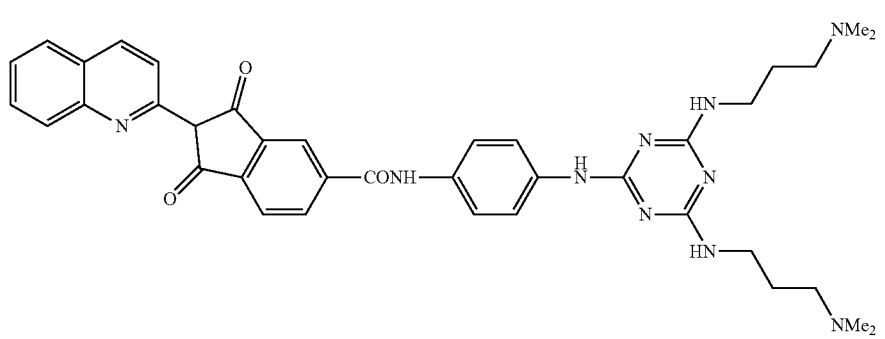
(A-22)
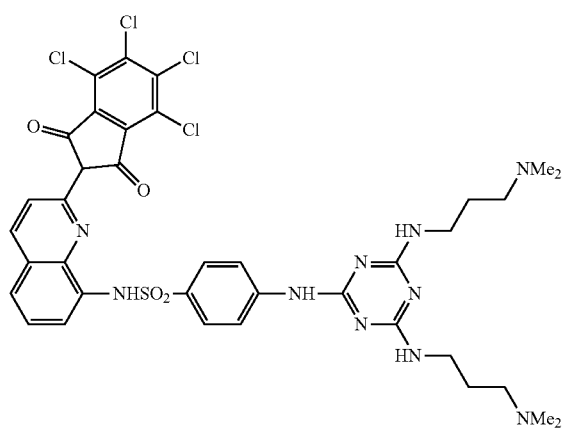
(A-23)
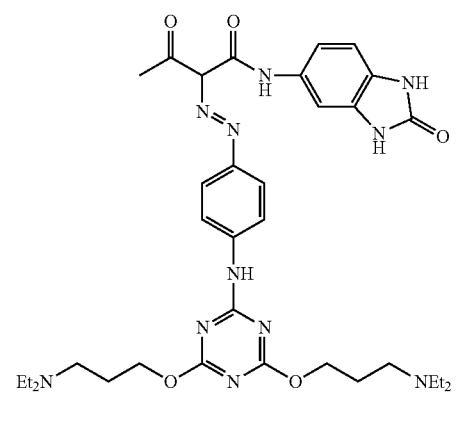
(A-24)

-continued
(A-25)
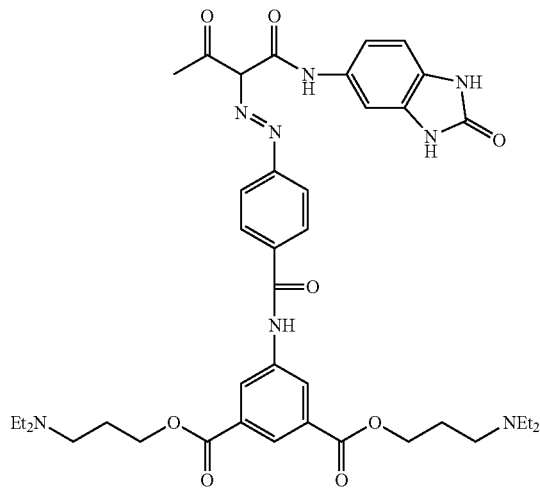
(A-26)
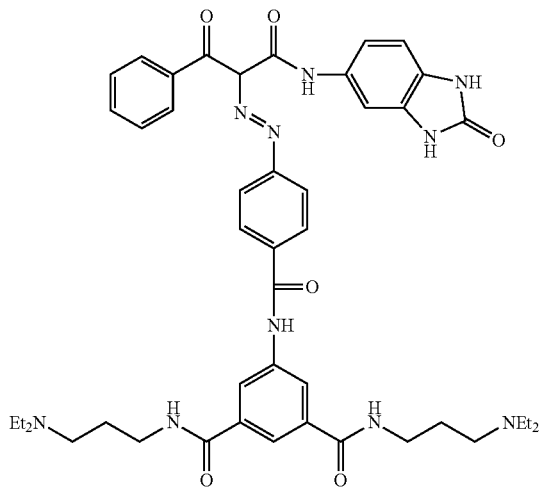
(A-27)
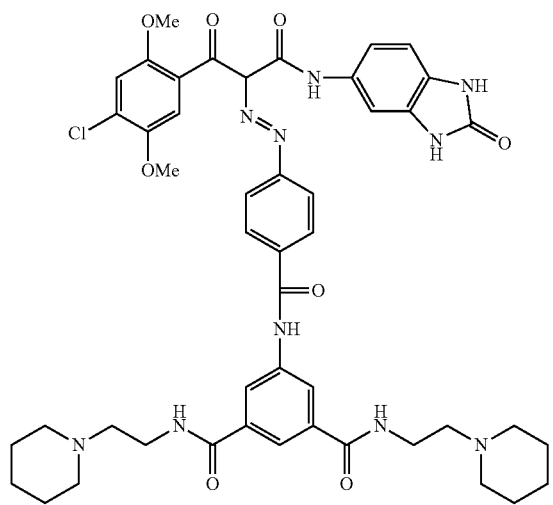
(A-28)
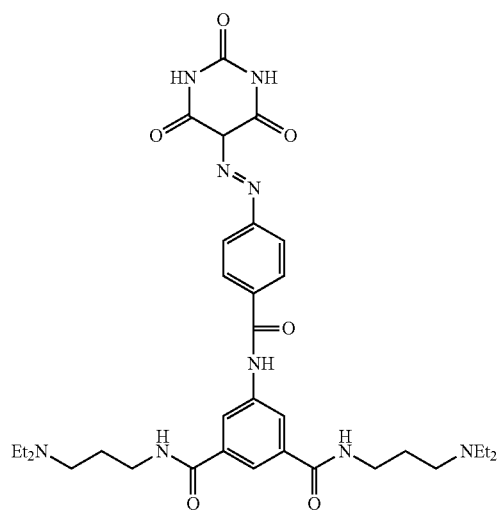
(A-29)
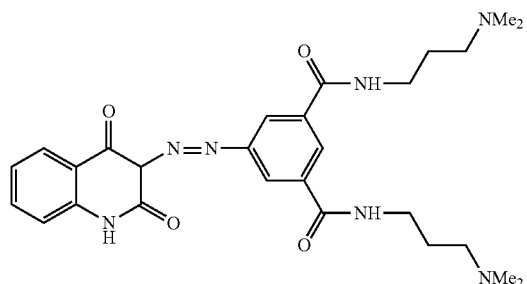
(A-30)
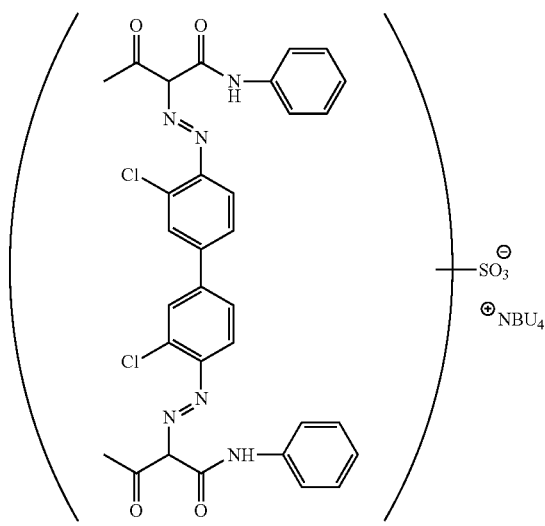

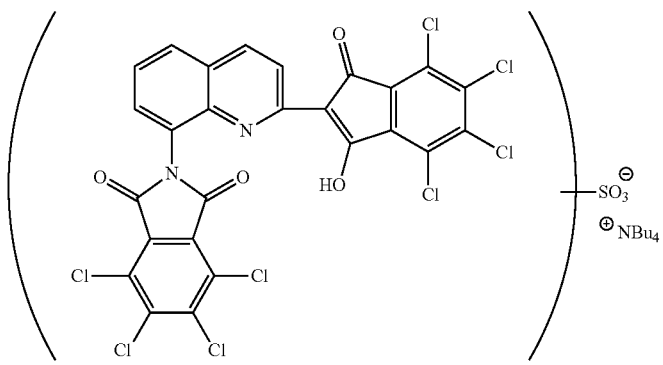

(A-31)

The content of the pigment derivative in the coloring composition of the present invention is preferably 1% by mass to 30% by mass, and more preferably 3% by mass to 20% by mass, with respect to the total mass of the pigment. The pigment derivatives may be used singly or in combination of two or more kinds thereof. In the case where the coloring composition includes two or more kinds of pigment derivatives, the total amount thereof is preferably within the range.

<<Curable Compound>>

The coloring composition of the present invention contains a curable compound. As the curable compound, known polymerizable compounds which can be crosslinked by a radical, an acid, or heat can be used. Examples thereof include polymerizable compounds having an ethylenically unsaturated bond, cyclic ethers (epoxy or oxethane), methylol, or the like. In the case of forming a pattern by a dry etching method, a compound having an epoxy group is preferably used.

<<<Compound Having Epoxy Group>>>

The compound having an epoxy group preferably has two or more epoxy groups in one molecule. By using the compound having two or more epoxy groups in one molecule, the effects of the present invention can be more effectively accomplished. The number of epoxy groups in one molecule is preferably 2 to 10, more preferably 2 to 5, and particularly preferably 3.

In the present invention, as the compound having an epoxy group, one having a structure in which two benzene rings are linked via a hydrocarbon group is preferably used. As the hydrocarbon group, an alkylene group having 1 to 6 carbon atoms is preferable.

Furthermore, the epoxy groups are preferably linked via a linking group. Examples of the linking group include groups including at least one selected from an alkylene group, an arylene group, —O—, a structure represented by —NR'— (R' represents a hydrogen atom, an alkyl group which may have a substituent, or an aryl group which may have a substituent, and preferably a hydrogen atom), —SO$_2$—, —CO—, —O—, or —S—.

The compound having such a structure causes an interaction between the halogenated zinc phthalimide pigment and the compound having an epoxy group, and is thus likely to be present in the vicinity of the halogenated zinc phthalimide pigment. As a result, the reaction of the compound having an epoxy group is likely to occur in the vicinity of the halogenated zinc phthalimide pigment and sublimation or heat transfer of the halogenated zinc phthalimide pigment can be efficiently suppressed. Thus, it is possible to more effectively suppress the generation of acicular crystals during heating at a high temperature.

The epoxy equivalents (=the molecular weight of the compound having an epoxy group/the number of epoxy groups) of the compound having an epoxy group is preferably 500 g/eq or less, more preferably 100 g/eq to 400 g/eq, and still more preferably 100 g/eq to 300 g/eq. By setting the upper limit of the epoxy equivalents of the compound having an epoxy group to 500 g/eq or less, the effects are obtained. Further, it is preferable to set the lower limit of the epoxy equivalents of the compound having an epoxy group to 100 g/eq or more in view of stability in practical use.

The compound having an epoxy group may be either a low-molecular-weight compound (for example, a molecular weight of less than 2,000, and further a molecular weight of less than 1,000) or a high-molecular-weight compound (macromolecule) (for example, a molecular weight of 1,000 or more, and in the case of a polymer, a weight-average molecular weight of 1,000 or more). The weight-average molecular weight of the compound having an epoxy group is preferably 200 to 100,000, and more preferably 500 to 10,000.

As the compound having an epoxy group, having a structure in which two benzene rings are linked via a hydrocarbon group, a compound represented by the following General Formula (1) is preferably used.

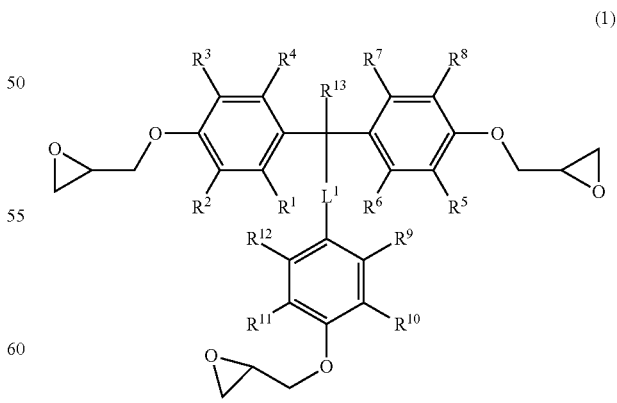

(1)

In General Formula (1), $R^1$ to $R^{13}$ each independently represent a hydrogen atom, an alkyl group, an alkoxy group, or a halogen atom, and $L^Z$ represents a single bond or a divalent linking group.

$R^1$ to $R^{13}$ in General Formula (1) each independently represent a hydrogen atom, an alkyl group, an alkoxy group, or a halogen atom.

The alkyl group in $R^1$ to $R^{13}$ is preferably an alkyl group having 1 to 30 carbon atoms, and more preferably an alkyl group having 1 to 12 carbon atoms.

The alkyl group is not limited to any of linear, branched, or cyclic, but is preferably linear or branched, and particularly preferably linear.

The alkyl group may have a substituent or may be unsubstituted, and is preferably unsubstituted.

Examples of the substituent which the alkyl group may have include an alkyl group (preferably a linear, branched, or cyclic alkyl group having 1 to 48 carbon atoms, and more preferably a linear, branched, or cyclic alkyl group having 1 to 24 carbon atoms, for example, methyl, ethyl, propyl, isopropyl, n-butyl, tert-butyl, pentyl, hexyl, heptyl, octyl, 2-ethylhexyl, dodecyl, hexadecyl, cyclopropyl, cyclopentyl, cyclohexyl, 1-norbornyl, and 1-adamantyl), an alkenyl group (preferably an alkenyl group having 2 to 48 carbon atoms, and more preferably an alkenyl group having 2 to 18 carbon atoms, for example, vinyl, allyl, and 3-buten-1-yl), an alkynyl group (preferably having 2 to 20 carbon atoms, more preferably having 2 to 12 carbon atoms, and particularly preferably having 2 to 8 carbon atoms, for example, propargyl and 3-pentynyl), an aryl group (preferably an aryl group having 6 to 48 carbon atoms, and more preferably an aryl group having 6 to 24 carbon atoms, for example, phenyl and naphthyl), a heterocyclic group (preferably a heterocyclic group having 1 to 32 carbon atoms, and more preferably a heterocyclic group having 1 to 18 carbon atoms, for example, 2-thienyl, 4-pyridyl, 2-furyl, 2-pyrimidinyl, 1-pyridyl, 2-benzothiazolyl, 1-imidazolyl, 1-pyrazolyl, and benzotriazol-1-yl), a silyl group (preferably a silyl group having 3 to 38 carbon atoms, and more preferably a silyl group having 3 to 18 carbon atoms, for example, trimethylsilyl, triethylsilyl, tributylsilyl, tert-butyldimethylsilyl, and tert-hexyldimethylsilyl), a hydroxyl group, a cyano group, a nitro group, an alkoxy group (preferably an alkoxy group having 1 to 48 carbon atoms, more preferably an alkoxy group having 1 to 24 carbon atoms, and still more preferably an alkoxy group having 1 to 3 carbon atoms, for example, methoxy, ethoxy, 1-butoxy, 2-butoxy, isopropoxy, tert-butoxy, dodecyloxy, and cycloalkyloxy group, for example, cyclopentyloxy and cyclohexyloxy), an aryloxy group (preferably an aryloxy group having 6 to 48 carbon atoms, and more preferably an aryloxy group having 6 to 24 carbon atoms, for example, phenoxy and 1-naphthoxy), a heterocyclic oxy group (preferably a heterocyclic oxy group having 1 to 32 carbon atoms, and more preferably a heterocyclic oxy group having 1 to 18 carbon atoms, for example, 1-phenyltetrazol-5-oxy and 2-tetrahydropyranyloxy), a silyloxy group (preferably a silyloxy group having 1 to 32 carbon atoms, and more preferably a silyloxy group having 1 to 18 carbon atoms, for example, trimethylsilyloxy, tert-butyldimethylsilyloxy, and diphenylmethylsilyloxy), an acyloxy group (preferably an acyloxy group having 2 to 48 carbon atoms, and more preferably an acyloxy group having 2 to 24 carbon atoms, for example, acetoxy, pivaloyloxy, a 2-ethylhexanoyloxy group, a 2-methylpropanoyloxy group, an octanoyloxy group, a butanoyloxy group, a 2-methylbutanoyloxyl group, benzoyloxy, and dodecanoyloxy), an alkoxycarbonyloxy group (preferably an alkoxycarbonyloxy group having 2 to 48 carbon atoms, and more preferably an alkoxycarbonyloxy group having 2 to 24 carbon atoms, for example, ethoxycarbonyloxy, tert-butoxycarbonyloxy, and cycloalkyloxycarbonyloxy groups, for example, cyclohexyloxycarbonyloxy), an aryloxycarbonyloxy group (preferably an aryloxycarbonyloxy group having 7 to 32 carbon atoms, and more preferably an aryloxycarbonyloxy group having 7 to 24 carbon atoms, for example, phenoxycarbonyloxy), a carbamoyloxy group (preferably a carbamoyloxy group having 1 to 48 carbon atoms, and more preferably a carbamoyloxy group having 1 to 24 carbon atoms, for example, N,N-dimethylcarbamoyloxy, N-butylcarbamoyloxy, N-phenylcarbamoyloxy, and N-ethyl-N-phenylcarbamoyloxy), a sulfamoyloxy group (preferably a sulfamoyloxy group having 1 to 32 carbon atoms, and more preferably a sulfamoyloxy group having 1 to 24 carbon atoms, for example, N,N-diethylsulfamoyloxy and N-propylsulfamoyloxy), an alkylsulfonyloxy group (preferably an alkylsulfonyloxy group having 1 to 38 carbon atoms, and more preferably an alkylsulfonyloxy group having 1 to 24 carbon atoms, for example, methylsulfonyloxy, hexadecylsulfonyloxy, and cyclohexylsulfonyloxy), an arylsulfonyloxy group (preferably an arylsulfonyloxy group having 6 to 32 carbon atoms, and more preferably an arylsulfonyloxy group having 6 to 24 carbon atoms, for example, phenylsulfonyloxy), an acyl group (preferably an acyl group having 1 to 48 carbon atoms, and more preferably an acyl group having 1 to 24 carbon atoms, for example, formyl, acetyl, pivaloyl, benzoyl, tetradecanoyl, and cyclohexanoyl), an alkoxycarbonyl group (preferably an alkoxycarbonyl group having 2 to 48 carbon atoms, and more preferably an alkoxycarbonyl group having 2 to 24 carbon atoms, for example, methoxycarbonyl, ethoxycarbonyl, octadecyloxycarbonyl, cyclohexyloxycarbonyl, and 2,6-di-tert-butyl-4-methylcyclohexyloxycarbonyl), an aryloxycarbonyl group (preferably an aryloxycarbonyl group having 7 to 32 carbon atoms, and more preferably an aryloxycarbonyl group having 7 to 24 carbon atoms, for example, phenoxycarbonyl), a carbamoyl group (preferably a carbamoyl group having 1 to 48 carbon atoms, and more preferably a carbamoyl group having 1 to 24 carbon atoms, for example, carbamoyl, N,N-diethylcarbamoyl, N-ethyl-N-octylcarbamoyl, N,N-dibutylcarbamoyl, N-propylcarbamoyl, N-phenylcarbamoyl, N-methyl-N-phenylcarbamoyl, and N,N-dicyclohexylcarbamoyl), an amino group (preferably an amino group having 32 or less carbon atoms, and more preferably an amino group having 24 or less carbon atoms, for example, amino, methylamino, N,N-dibutylamino, tetradecylamino, 2-ethylhexylamino, and cyclohexylamino), an anilino group (preferably an anilino group having 6 to 32 carbon atoms, and more preferably an anilino group having 6 to 24 carbon atoms, for example, anilino and N-methylanilino), a heterocyclic amino group (preferably a heterocyclic amino group having 1 to 32 carbon atoms, and more preferably a heterocyclic amino group having 1 to 18 carbon atoms, for example, 4-pyridylamino), a carbonamide group (preferably a carbonamide group having 2 to 48 carbon atoms, and more preferably a carbonamide group having 2 to 24 carbon atoms, for example, acetamide, benzamide, tetradecanamide, pivaloylamide, and cyclohexanamide), a ureido group (preferably a ureido group having 1 to 32 carbon atoms, and more preferably a ureido group having 1 to 24 carbon atoms, for example, ureido, N,N-dimethylureido, and N-phenylureido), an imide group (preferably an imide group having 36 or less carbon atoms, and more preferably an imide group having 24 or less carbon atoms, for example, N-succinimide and N-phthalimide), an alkoxycarbonylamino group (preferably an alkoxycarbonylamino group having 2 to 48 carbon atoms, and more preferably an alkoxycarbonylamino group having 2 to 24 carbon atoms, for example, methoxycarbonylamino, ethoxycarbonylamino, tert-butoxycarbonylamino, octadecyloxycarbonylamino, and cyclohexyloxycarbonylamino), an aryloxycarbonylamino group (preferably an aryloxycarbonylamino group having 7 to 32 carbon atoms, and more preferably an aryloxycarbonylamino group having 7 to 24 carbon atoms, for example, phenoxycarbonylamino), a sulfonamide group (preferably a sulfonamide group having 1 to 48 carbon atoms, and more preferably a sulfonamide group 1 to 24 carbon atoms, for example, methanesulfonamide, butanesulfonamide, benzenesulfonamide, hexadecanesulfonamide, and cyclohexanesulfonamide), a sulfamoylamino group (preferably a sulfamoylamino group having 1 to 48 carbon atoms, and more preferably a sulfamoylamino group having 1 to 24 carbon atoms, for example, N,N-dipropylsulfamoylamino and N-ethyl-N-dodecylsulfamoylamino), an azo group (preferably an azo group having 1 to 32 carbon atoms, and more preferably an azo group having 1 to 24 carbon atoms, for example, phenylazo and 3-pyrazolylazo), an alkylthio group (preferably an alkylthio group having 1 to 48 carbon atoms, and more preferably an alkylthio group having 1 to 24 carbon atoms, for example, methylthio, ethylthio, octylthio, and cyclohexylthio), an arylthio group (preferably an arylthio group having 6 to 48 carbon atoms, and more preferably an arylthio group having 6 to 24 carbon atoms, for example, phenylthio), a heterocyclic thio group (preferably a heterocyclic thio group having 1 to 32 carbon atoms, and more preferably a heterocyclic thio group having 1 to 18 carbon atoms, for example, 2-benzothiazolylthio, 2-pyridylthio, and 1-phenyltetrazolylthio), an alkylsulfinyl group (preferably an alkylsulfinyl group having 1 to 32 carbon atoms, and more preferably an alkylsulfinyl group having 1 to 24 carbon atoms, for example, dodecanesulfinyl), an arylsulfinyl group (preferably an arylsulfinyl group having 6 to 32 carbon atoms, and more preferably an arylsulfinyl group having 6 to 24 carbon atoms, for example, phenylsulfinyl), an alkylsulfonyl group (preferably an alkylsulfonyl group having 1 to 48 carbon atoms, and more preferably an alkylsulfonyl group having 1 to 24 carbon atoms, for example, methylsulfonyl, ethylsulfonyl, propylsulfonyl, butylsulfonyl, isopropylsulfonyl, 2-ethylhexylsulfonyl, hexadecylsulfonyl, octylsulfonyl, and cyclohexylsulfonyl), an arylsulfonyl group (preferably an arylsulfonyl group having 6 to 48 carbon atoms, and more preferably an arylsulfonyl group having 6 to 24 carbon atoms, for example, phenylsulfonyl and 1-naphthylsulfonyl), a sulfamoyl group (preferably a sulfamoyl group having 32 or less carbon atoms, and more preferably a sulfamoyl group having 24 or less carbon atoms, for example, sulfamoyl, N,N-dipropylsulfamoyl, N-ethyl-N-dodecylsulfamoyl, N-ethyl-N-phenylsulfamoyl, and N-cyclohexylsulfamoyl), a sulfo group, a phosphonyl group (preferably a phosphonyl group having 1 to 32 carbon atoms, and more preferably 1 to 24 carbon atoms, for example, phenoxyphosphonyl, octyloxyphosphonyl, and phenylphosphonyl), and a phosphinoylamino group (preferably a phosphinoylamino group having 1 to 32 carbon atoms, and more preferably a phosphinoylamino group having 1 to 24 carbon atoms, for example, diethoxyphosphinoylamino and dioctyloxyphosphinoylamino). These substituents may further be substituted. Further, in the case where there are two or more substituents, the substituents may be the same as or different from each other. In addition, if possible, the groups may be bonded to each other to form a ring.

The alkoxy group in $R^1$ to $R^{13}$ is preferably an alkoxy group having 1 to 30 carbon atoms, and particularly preferably an alkoxy group having 1 to 12 carbon atoms.

The alkoxy group may have a substituent or may be unsubstituted, and preferably unsubstituted. Specific examples of the substituent include the same substituents as those which the alkyl group may have.

Examples of the halogen atom in $R^1$ to $R^{13}$ include a fluorine atom, a chlorine atom, a bromine atom, and an iodine atom.

$R^1$ to $R^{13}$ are each independently preferably any one of a hydrogen atom, a methyl group, an ethyl group, and a methoxy group. Further, $R^{13}$ is preferably a methyl group. In addition, $R^1$ to $R^{12}$ are preferably hydrogen atoms.

$L^1$ of General Formula (1) represents a single bond or a divalent linking group, and preferably a divalent linking group.

Examples of the divalent linking group include groups including at least one selected from an alkylene group, an arylene group, —O—, a structure represented by —NR'— (R' represents a hydrogen atom, an alkyl group which may have a substituent, or an aryl group which may have a substituent, and preferably a hydrogen atom), —SO$_2$—, —CO—, —O—, or —S—. These may have a substituent. Examples of the substituent include the same substituents as those exemplified as the substituent which the alkyl group in $R^1$ to $R^{13}$ may have.

The number of carbon atoms of the alkylene group is preferably 1 to 30, and more preferably 1 to 12.

The number of carbon atoms of the arylene group is preferably 6 to 30, and more preferably 6 to 12.

The compound represented by General Formula (1) is more preferably a compound represented by the following General Formula (1a).

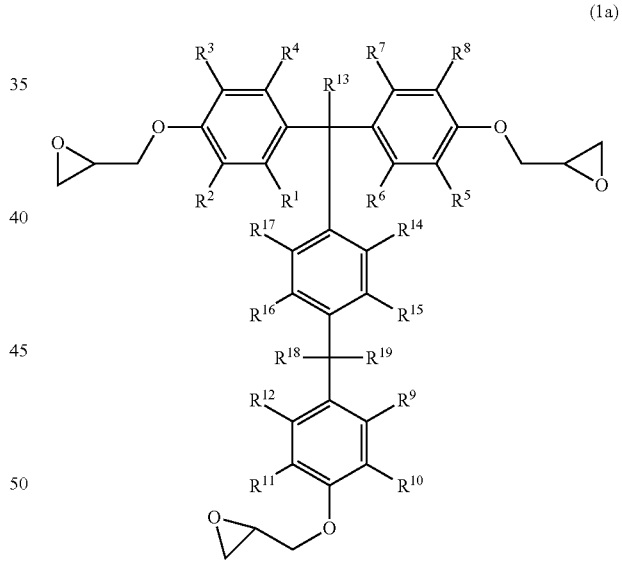

In General Formula (1a), $R^1$ to $R^{19}$ each independently represent a hydrogen atom, an alkyl group, an alkoxy group, or a halogen atom.

$R^1$ to $R^{19}$ in General Formula (1a) have the same definitions as $R^1$ to $R^{13}$ in General Formula (1).

In particular, $R^1$ to $R^{19}$ are each independently preferably any one of a hydrogen atom, a methyl group, an ethyl group, and a methoxy group. More preferably, at least one selected from $R^{13}$, $R^{18}$, or $R^{19}$ is a methyl group. Still more preferably, $R^{13}$, $R^{18}$, and $R^{19}$ are methyl groups, and $R^1$ to $R^{12}$, and $R^{14}$ to $R^{17}$ are hydrogen atoms.

Examples of the compound represented by General Formula (1a) include phenol resins obtained by the reaction of 1-[4-(1-hydroxy-1-methyl-ethyl)-phenyl]ethanone and phenols (unsubstituted phenols or phenols having an alkyl group having 1 to 12 carbon atoms, an alkoxy group having 1 to 12 carbon atoms, or a halogen atom as a substituent), and compounds obtained as a main component by the reaction of epihalohydrin (at least one selected from epichlorohydrin and epibromohydrin). Examples of the commercially available product include VG-3101L manufactured by Printec Co. Ltd., and NC-6000 and NC-6300 manufactured by Nippon-Kayaku Co., Ltd.

As the compound having an epoxy group, for example, a compound represented by the following General Formula (EP1) can be used, in addition to the above compounds.

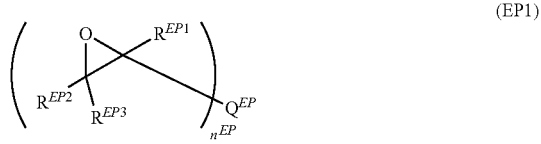

(EP1)

In Formula (EP1), $R^{EP1}$ to $R^{EP3}$ each represent a hydrogen atom, a halogen atom, or an alkyl group, in which the alkyl group may have a cyclic structure or may have a substituent. $R^{EP1}$ and $R^{EP2}$, or $R^{EP2}$ and $R^{EP3}$ may be bonded with each other to form a cyclic structure. Examples of the substituent which may be contained in the alkyl group include a hydroxyl group, a cyano group, an alkoxy group, an alkylcarbonyl group, an alkoxycarbonyl group, an alkylcarbonyloxy group, an alkylthio group, an alkylsulfone group, an alkylsulfonyl group, an alkylamino group, and an alkylamide group.

$Q^{EP}$ represents a single bond or an $n^{EP}$-valent organic group. $R^{EP1}$ to $R^{EP3}$ may also be bonded to $Q^{EP}$ to form a cyclic structure.

$n^{EP}$ represents an integer of 2 or more, preferably 2 to 10, and more preferably 2 to 6. In the case where $Q^{EP}$ is a single bond, $n^{EP}$ is 2.

In the case where $Q^{EP}$ is an $n^{EP}$-valent organic group, it is preferably a chained or cyclic $n^{EP}$-valent saturated hydrocarbon group (preferably having 2 to 20 carbon atoms); an $n^{EP}$ valent aromatic ring group (preferably having 6 to 30 carbon atoms); and an ($n^{EP}$)-valent organic group having a structure in which chained or cyclic saturated hydrocarbon or aromatic hydrocarbon is bonded to a divalent linking group such as an ether group, an ester group, an amide group, a sulfonamide group, and an alkylene group (preferably having 1 to 4 carbon atoms, and more preferably a methylene group); bonded to a trivalent linking group such as —N(—)₂; or bonded to any combination of these groups.

Specific examples thereof are shown below, but the present invention is not limited thereto.

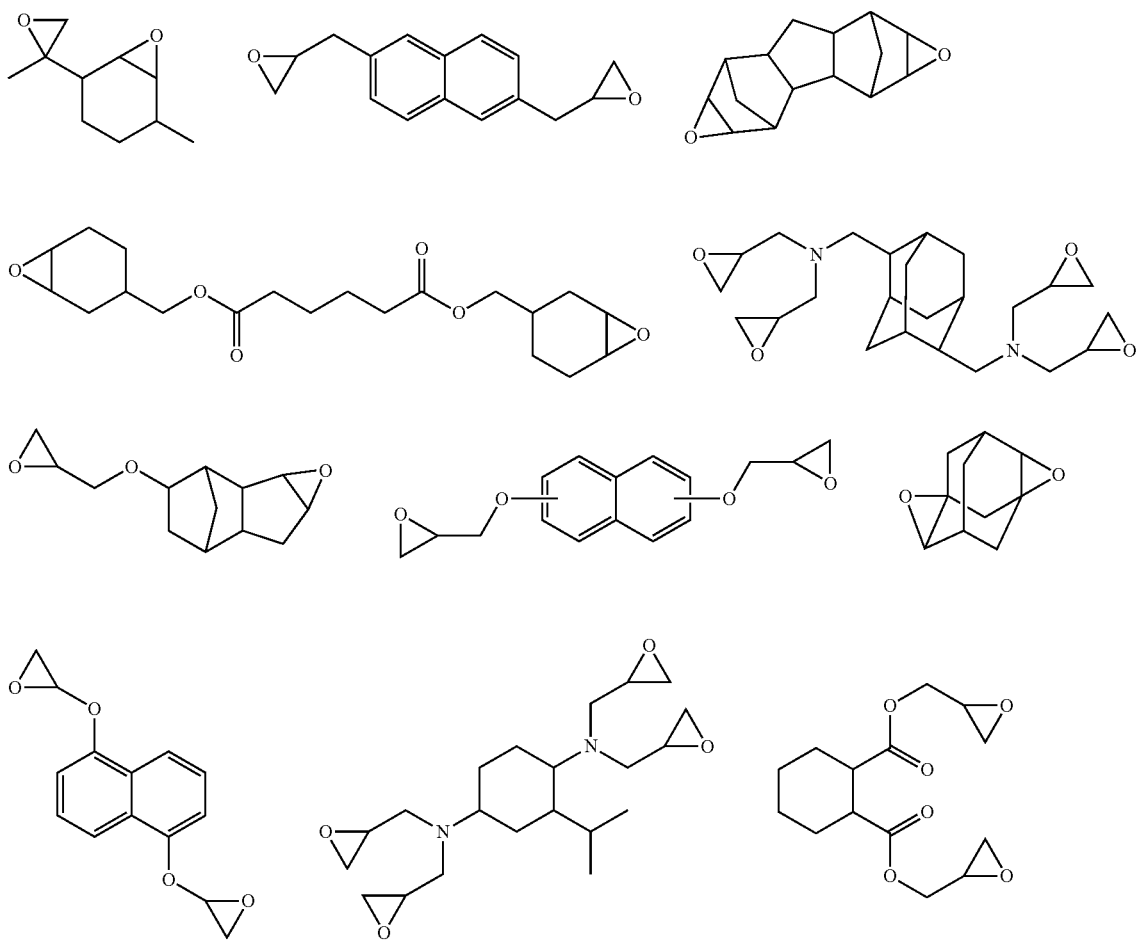

-continued
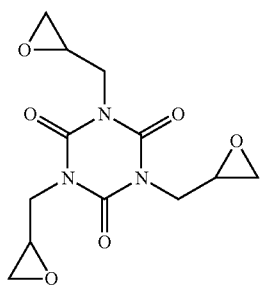
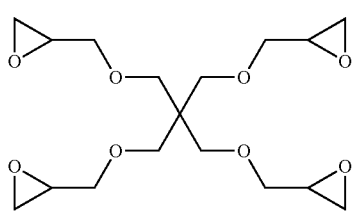
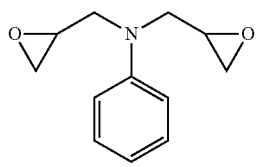
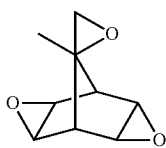
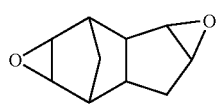
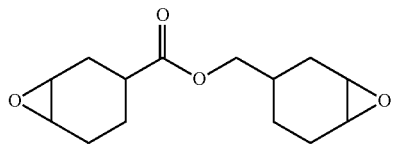
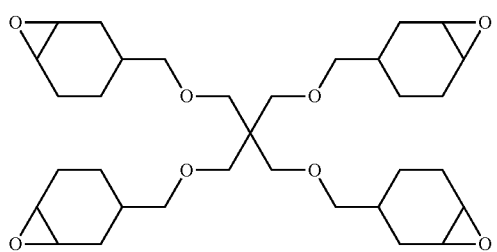
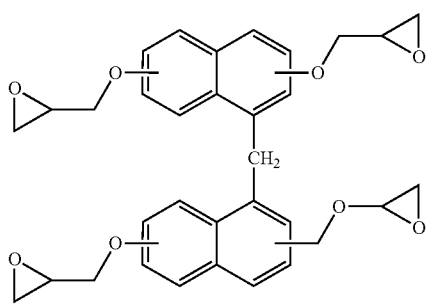
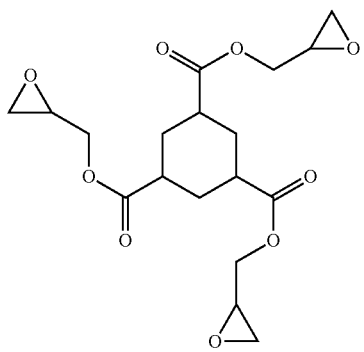

-continued

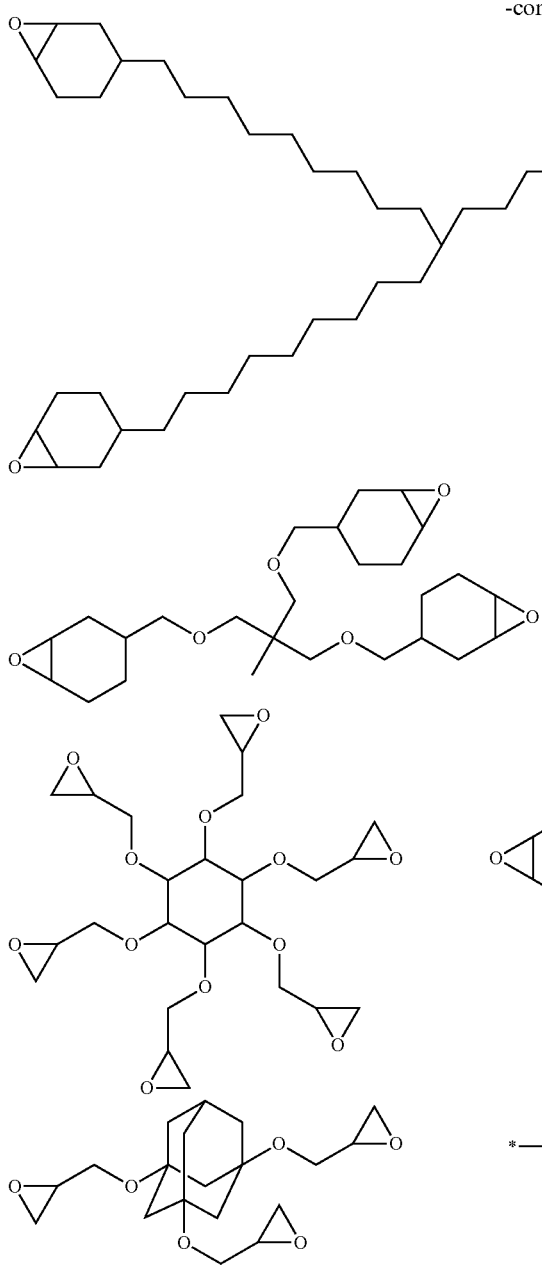
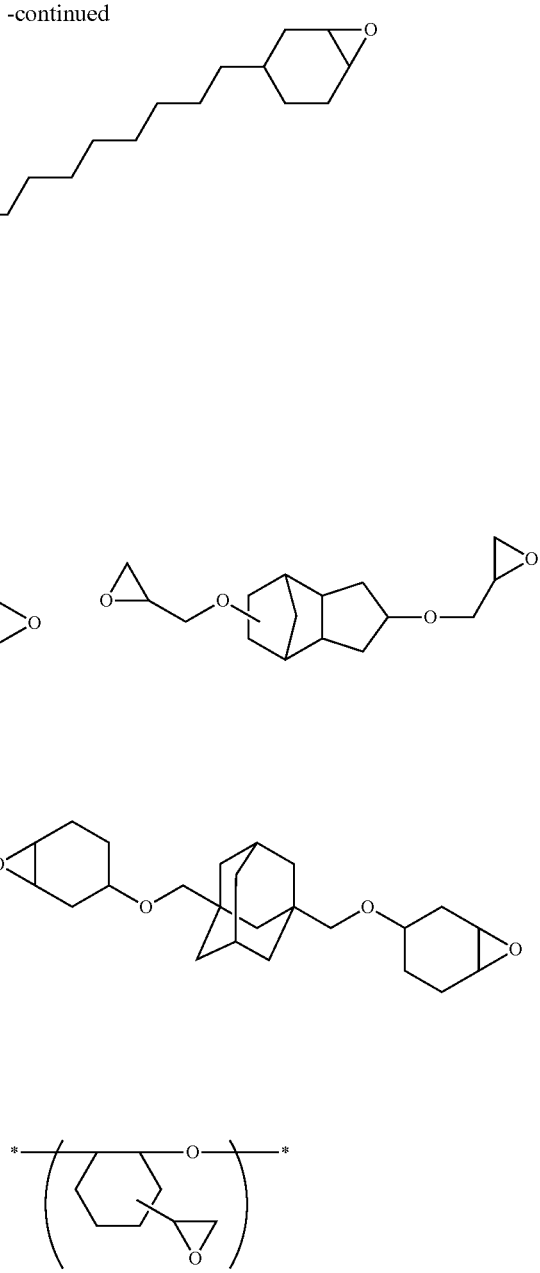

50

An oligomer or a polymer, having an epoxy group in the side chain, can also be preferably used as the compound having an epoxy group. Examples of such a compound include a bisphenol A epoxy resin, a bisphenol F epoxy resin, a phenol novolac type epoxy resin, a cresol novolac type epoxy resin, and an aliphatic epoxy resin.

As these compounds, commercially available products may be used or the compounds may also be obtained by introducing an epoxy group into the side chain of a polymer.

As the commercially available product, examples of the bisphenol A epoxy resin include JER827, JER828, JER834, JER1001, JER1002, JER1003, JER1055, JER1007, JER1009, and JER1010 (all manufactured by Japan Epoxy Resin Co., Ltd.), EPICLON860, EPICLON1050, EPICLON1051, and EPICLON1055 (all manufactured by DIC Corporation); examples of the bisphenol F epoxy resin include JER806, JER807, JER4004, JER4005, JER4007, and JER4010 (all manufactured by Japan Epoxy Resin Co., Ltd.), EPICLON830 and EPICLON835 (all manufactured by DIC Corporation), LCE-21 and RE-602S (all manufactured by Nippon Kayaku Co., Ltd.); examples of the phenol novolac epoxy resin include JER152, JER154, JER157S70, and JER157S65 (all manufactured by Japan Epoxy Resin Co., Ltd.), EPICLON N-740, EPICLON N-770, and EPICLON N-775 (all manufactured by DIC Corporation); examples of the cresol novolac epoxy resin include EPICLON N-660, EPICLON N-665, EPICLON N-670, EPICLON N-673, EPICLON N-680, EPICLON N-690, and EPICLON N-695 (all manufactured by DIC Corporation), EOCN-1020 (manufactured by Nippon Kayaku Co., Ltd.); and examples of the aliphatic epoxy resin include ADEKA RESIN EP-4080S, ADEKA RESIN EP-4085S, and ADEKA RESIN EP-4088S (all manufactured by ADEKA Corporation), CELLOXIDE 2021P, CELLOXIDE 2081, CELLOXIDE 2083, CELLOXIDE 2085, EHPE 3150, EPOLEAD PB 3600, and EPOLEAD PB 4700 (all manufactured by Daicel Corporation), DENACOL EX-212L, EX-214L, EX-216L, EX-321L, and EX-850L (all manufactured by Nagase ChemteX Corporation). Other examples include ADEKA RESIN EP-4000S, ADEKA RESIN EP-4003S, ADEKA RESIN EP-4010S, and ADEKA RESIN EP-4011S (all manufactured by ADEKA Corporation), NC-2000, NC-3000, NC-7300, XD-1000, EPPN-501, and EPPN-502 (all manufactured by ADEKA Corporation), and JER1031S (manufactured by Japan Epoxy Resin Co., Ltd.).

Furthermore, as the commercially available product of the compound having an epoxy group, JER1031S (manufactured by Mitsubishi Chemical Corporation), JER1032H60 (manufactured by Mitsubishi Chemical Corporation), EPICLON HP-4700 (manufactured by DIC Corporation), and EPICLON N-695 (manufactured by DIC Corporation) can also be preferably used.

In the case of synthesis by introducing an epoxy group into the side chain of a polymer, the introduction reaction can be carried out by using a tertiary amine such as triethylamine and benzylmethylamine, a quaternary ammonium salt such as dodecyltrimethylammonium chloride, tetramethylammonium chloride, and tetraethylammonium chloride, pyridine, or triphenylphosphine as a catalyst in an organic solvent at a reaction temperature of 50° C. to 150° C. for several to several tens of hours. The amount of the alicyclic epoxy unsaturated compounds to be introduced is preferably controlled so that the obtainable polymer may have an acid value in the range of 5 KOH·mg/g to 200 KOH·mg/g.

While those having a glycidyl group as the epoxy group, such as glycidyl (meth)acrylate and allyl glycidyl ether, may be used as the epoxy unsaturated compound, it is preferable to use an unsaturated compound having an alicyclic epoxy group. Examples of such a compound include the following compounds.

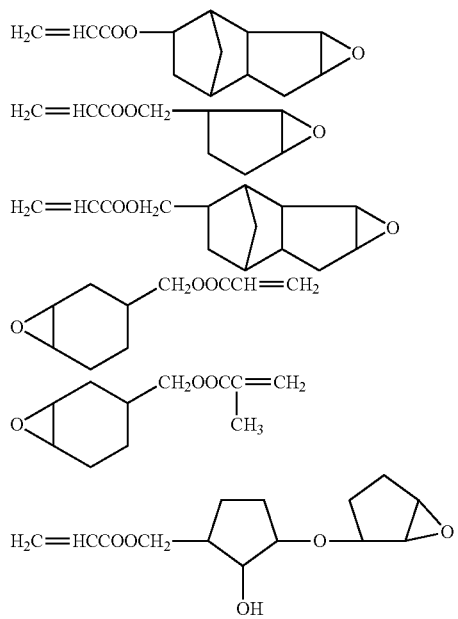

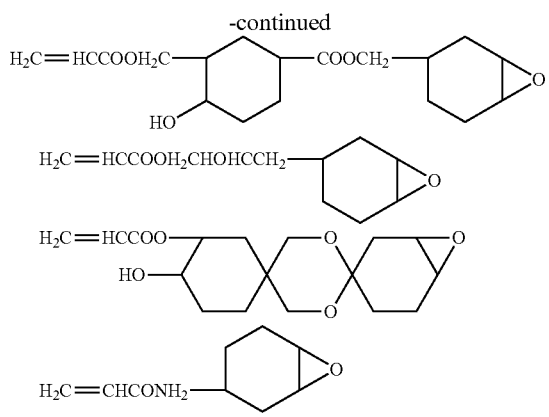

In the present invention, the compound having an epoxy groups may be used singly or in combination of two or more kinds thereof. The compound having an epoxy group is preferably substantially composed of only the compound represented by General Formula (1). Further, the expression of "substantially composed of only the compound represented by General Formula (1)" means that the content of the compound having an epoxy group other than the compound represented by General Formula (1) is preferably 3% by mass or less, more preferably 1% by mass or less, and still more preferably 0.01% by mass or less, and most preferably, it does not contain the compound, with respect to the total amount of the compound having an epoxy group.

While the total contents of the compound having an epoxy group in the coloring composition of the present invention may vary depending on whether the low-molecular-weight compound or the high-molecular-weight compound is mixed, it is preferably 5% by mass to 40% by mass, more preferably 5% by mass to 35% by mass, and particularly preferably 5% by mass to 30% by mass, with respect to the total solid content (mass) of the coloring composition. With this blending amount, color mixing can be more effectively suppressed.

Furthermore, the content of the compound having an epoxy group in the entire curable compound is preferably 50% by mass to 100% by mass, and more preferably 70% by mass to 100% by mass.

<<<Other Polymerizable Compounds>>>

Examples of other polymerizable compounds include an ethylenically unsaturated group-containing compound having at least one addition-polymerizable ethylene group and having a boiling point of 100° C. or higher under atmospheric pressure is also preferred as the polymerizable compound. Examples thereof include monofunctional acrylates or methacrylates such as polyethylene glycol mono(meth)acrylate, polypropylene glycol mono(meth)acrylate and phenoxyethyl (meth)acrylate; polyfunctional acrylates or methacrylates such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl) isocyanurate, a compound obtained by adding ethylene oxide or propylene oxide to a polyhydric alcohol such as glycerin and trimethylolethane, and (meth)acrylating the adduct, the urethane (meth)acrylates described in JP1973-41708B (JP-S48-41708B), JP1975-6034B (JP-S50-6034B), and JP1976-37193A (JP-S51-37193A), the polyester acrylates described in JP1973-64183A (JP-S48-64183A), JP1974-43191B (JP-S49-43191B), and JP1977-30490B (JP-S52-30490B), and epoxy acrylates as a reaction product of an epoxy resin and (meth)acrylic acid; and a mixture thereof.

Examples thereof include polyfunctional (meth)acrylates obtained by reacting a polyfunctional carboxylate with a compound having a cyclic ether group such as glycidyl (meth)acrylate and an ethylenically unsaturated group.

Furthermore, as other preferred polymerizable compounds, compounds having a fluorene ring and having 2 or more ethylenically unsaturated groups, and cardo resins, as described in JP2010-160418A, JP2010-129825A, JP4364216B, and the like can be used.

Moreover, as the compound which has a boiling point of 100° C. or higher under atmospheric pressure, and has at least one addition-polymerizable, ethylenically unsaturated group, the compounds described in paragraph Nos. [0254] to [0257] of JP2008-292970A are also suitable.

In addition, radical polymerizable monomers represented by the following General Formulae (MO-1) to (MO-5) can also be used. Further, in the formulae, in the case where T is an oxyalkylene group, R is bonded to the terminal of the carbon atom side.

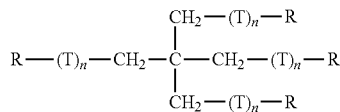  (MO-1)

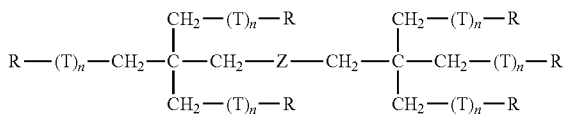  (MO-2)

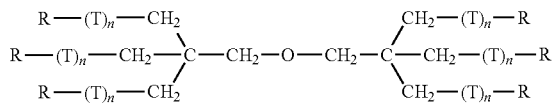  (MO-3)

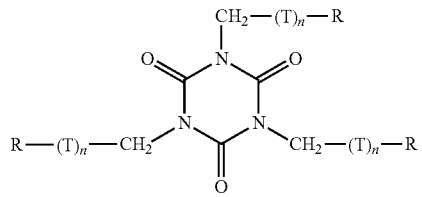  (MO-4)

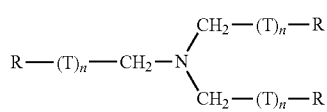  (MO-5)

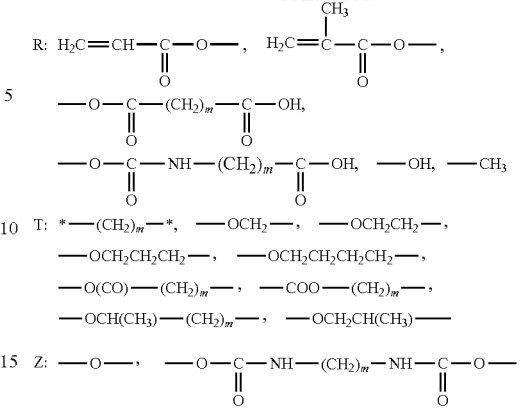

In the general formulae, n is 0 to 14, and m is 1 to 8. When plural R's and Ts are present in one molecule, they may be each the same as or different from each other.

In each of the radical polymerizable compounds represented by General Formulae (MO-1) to (MO-5), at least one of plural R's represents a group represented by —OC(=O)CH=CH$_2$ or —OC(=O)C(CH$_3$)=CH$_2$.

As specific examples of the polymerizable compounds represented by General Formulae (MO-1) to (MO-5), the compounds described in paragraph Nos. 0248 to 0251 of JP2007-269779A can also be suitably used in the present invention.

Furthermore, as the polymerizable compound, a compound which is described as the compounds of General Formulae (1) and (2), together with specific examples thereof, in JP1998-62986A (IP-H10-62986A) and which is obtained by (meth)acrylation of the polyhydric alcohol to which ethylene oxide, propylene oxide, or the like has been added, may be used.

Dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (as a commercially available product, KAYARAD DPHA manufactured by Nippon Chemical Co., Ltd.), ethyleneoxy-modified dipentaerythritol hexaacrylate (A-DPH-12E manufactured by Shin-Nakamura Chemical Co., Ltd.), and a structure in which an ethylene glycol or propylene glycol moiety is interposed between these (meth)acryloyl groups are preferable. Oligomer types of these can also be used.

Such other polymerizable compounds are polyfunctional monomers, which may have an acid group such as a carboxyl group, a sulfonic acid group, and a phosphoric acid group. If an ethylenic compound has an unreacted carboxyl group as described above, this compound can be used as is, but if desired, a hydroxyl group of the above ethylenic compound may be reacted with a non-aromatic carboxylic anhydride so as to introduce an acid group. In this case, specific examples of the non-aromatic carboxylic anhydride used include tetrahydrophthalic anhydride, alkylated tetrahydrophthalic anhydride, hexahydrophthalic anhydride, alkylated hexahydrophthalic anhydride, succinic anhydride, and maleic anhydride.

The polyfunctional monomer having an acid group is preferably a polyfunctional monomer which is an ester obtained between an aliphatic polyhydroxy compound and an unsaturated carboxylic acid and provides an acid group by reacting an unreacted hydroxyl group of the aliphatic polyhydroxy compound with a non-aromatic carboxylic anhydride. A monomer in which the aliphatic polyhydroxy compound in the ester is pentaerythritol and/or dipentaerythritol is particularly preferable. Examples of commercially available products thereof include M-510 and M-520, which are polybasic acid-modified acryl oligomers manufactured by TOAGOSEI, CO., LTD.

These monomers may be used singly, but since it is difficult to use a single compound in production, two or more kinds thereof may be used as a mixture. Moreover, if desired, a polyfunctional monomer not having an acid group and a polyfunctional monomer having an acid group may be used in combination therewith as the monomer.

The acid value of the polyfunctional monomer having an acid group is preferably 0.1 mg KOH/g to 40 mg KOH/g, and particularly preferably 5 mg KOH/g to 30 mg KOH/g. If the acid value of the polyfunctional monomer is too low, the development solubility characteristics deteriorate. If the acid value is too high, difficulty is caused in the production and handleability, hence a photopolymerization performance is deteriorated, which leads to deterioration of curing properties such as surface smoothness of pixels. Therefore, in the case where a combination of two or more kinds of polyfunctional monomers having different acid groups is used, or in the case where a combination of polyfunctional monomers not having an acid group is used, it is preferable to adjust the acid value such that all the acid groups as the polyfunctional monomers fall within the above range.

Moreover, it is also a preferred aspect that a polyfunctional monomer having a caprolactone structure is contained as another polymerizable compound.

The polyfunctional monomer having a caprolactone structure is not particularly limited as long as it has a caprolactone structure in a molecule thereof, and examples thereof include ε-caprolactone-modified polyfunctional (meth)acrylates which are obtained by esterifying polyhydric alcohols such as trimethylolethane, ditrimethylolethane, trimethylolpropane, ditrimethylolpropane, pentaerythritol, dipentaerythritol, tripentaerythritol, glycerin, diglycerol, and trimethylolmelamine with (meth)acrylic acid and ε-caprolactone. Among these, a polyfunctional monomer having a caprolactone structure represented by the following General Formula (Z-1) is preferable.

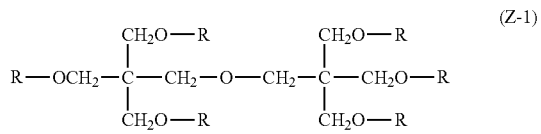

In General Formula (Z-1), all of six R's are a group represented by the following General Formula (Z-2). Alternatively, one to five out of six R's are a group represented by the following General Formula (Z-2), and the remainder is a group represented by the following General Formula (Z-3).

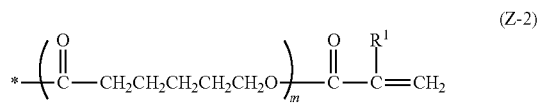

In General Formula (Z-2), $R^1$ represents a hydrogen atom or a methyl group, m represents a number 1 or 2, and "*" represents a bonding hand.

In General Formula (Z-3), $R^1$ represents a hydrogen atom or a methyl group, and "*" represents a bonding hand.

The polyfunctional monomer having such a caprolactone structure is commercially available from Nippon Kayaku Co., Ltd., as a KAYARAD DPCA series, and examples thereof include DPCA-20 (a compound in which m is 1, the number of the group represented by Formula (2) is 2, and all of R's are hydrogen atoms in Formulae (1) to (3)), DPCA-30 (a compound in which m is 1, the number of the group represented by Formula (2) is 3, and all of $R^1$'s are hydrogen atoms in Formulae (1) to (3)), DPCA-60 (a compound in which m is 1, the number of the group represented by Formula (2) is 6, and all of $R^1$'s are hydrogen atoms in Formulae (1) to (3)), and DPCA-120 (a compound in which m is 2, the number of the group represented by Formula (2) is 6, and all of $R^1$'s are hydrogen atoms in Formulae (1) to (3)).

The polyfunctional monomer having a caprolactone structure can be used singly or as a mixture of two or more kinds thereof.

Moreover, the other polymerizable compound is preferably at least one kind selected from a group of compounds represented by the following General Formula (Z-4) or (Z-5).

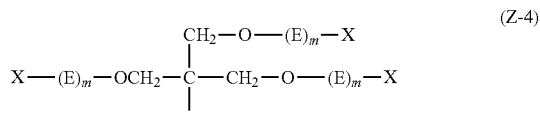

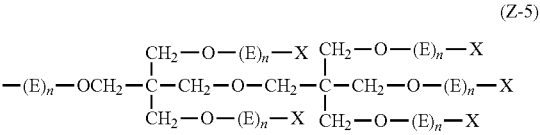

In General Formulae (Z-4) and (Z-5), E's each independently represent $-((CH_2)_yCH_2O)-$ or $-((CH_2)_yCH(CH_3)O)-$, y's each independently represent an integer of 0 to 10, and X's each independently represent an acryloyl group, a methacryloyl group, a hydrogen atom, or a carboxyl group.

In General Formula (Z-4), the sum of the acryloyl group and the methacryloyl group is 3 or 4, m's each independently represent an integer of 0 to 10, and the sum of the respective m's is an integer of 0 to 40. Herein, in the case where the sum of the respective m's is 0, any one of X's is a carboxyl group.

In General Formula (Z-5), the sum of the acryloyl group and the methacryloyl group is 5 or 6, n's each independently represent an integer of 0 to 10, and the sum of the respective n's is an integer of 0 to 60. Herein, in the case where the sum of the respective n's is 0, one of X's is a carboxyl group.

In General Formula (Z-4), m is preferably an integer of 0 to 6, and more preferably an integer of 0 to 4. Further, the sum of the respective m's is preferably an integer of 2 to 40, more preferably an integer of 2 to 16, and particularly preferably an integer of 4 to 8.

In General Formula (Z-5), n is preferably an integer of 0 to 6, and more preferably an integer of 0 to 4.

Further, the sum of the respective n's is preferably an integer of 3 to 60, more preferably an integer of 3 to 24, and particularly preferably an integer of 6 to 12.

In addition, —((CH$_2$)$_y$CH$_2$O)— or —((CH$_2$)$_y$CH(CH$_3$)O)— in General Formula (Z-4) or (Z-5) is preferably in the form in which the terminal at an oxygen atom side binds to X.

The compound represented by General Formula (Z-4) or (Z-5) may be used singly or in combination of two or more kinds thereof. In particular, a form in which all of six X's in General Formula (Z-5) are acryloyl groups is preferable.

Moreover, the total content of the compound represented by General Formula (Z-4) or (Z-5) in the polymerizable compound is preferably 20% by mass or more, and more preferably 50% by mass or more.

The compound represented by General Formula (Z-4) or (Z-5) can be synthesized by steps known in the related art, which includes a step of binding ethylene oxide or propylene oxide to pentaerythritol or dipentaerythritol by a ring-opening addition reaction to form a ring-opening skeleton, and a step of reacting, for example, (meth)acryloyl chloride to a terminal hydroxyl group of the ring-opening skeleton to introduce a (meth)acryloyl group. Since the respective steps are well-known, a person skilled in the art can easily synthesize the compound represented by General Formula (Z-4) or (Z-5).

Among the compounds represented by General Formula (Z-4) or (Z-5), a pentaerythritol derivative and/or a dipentaerythritol derivative is/are more preferable.

Specific examples of the compounds include compounds represented by the following Formulae (a) to (f) (hereinafter also referred to as "exemplary compounds (a) to (f)"). Among these, the exemplary compounds (a), (b), (e), and (f) are preferable.

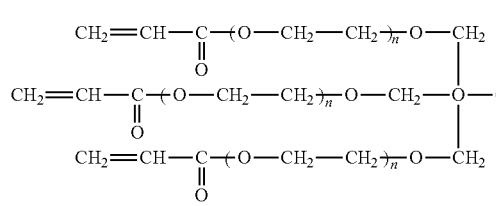
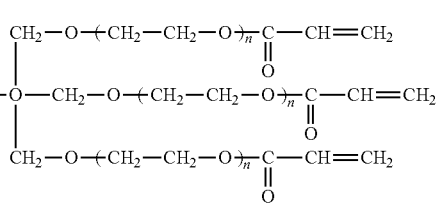

(a)

(the sum of the respective n's is 6)

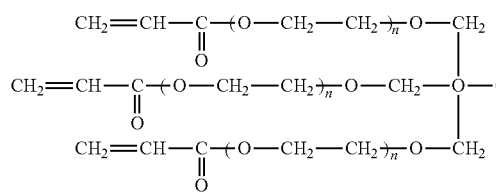
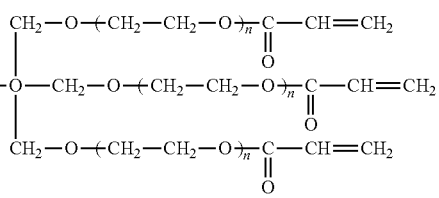

(b)

(the sum of the respective n's is 12)

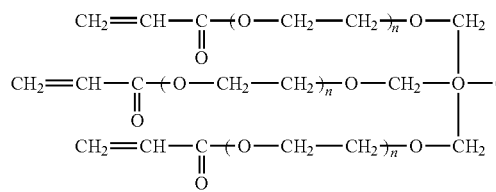
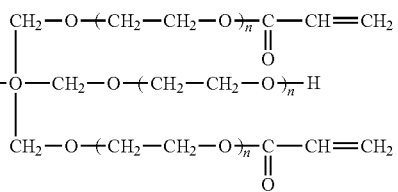

(c)

(the sum of the respective n's is 12)

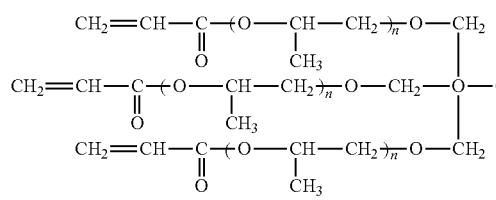
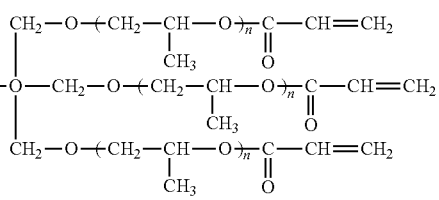

(d)

(the sum of the respective n's is 6)

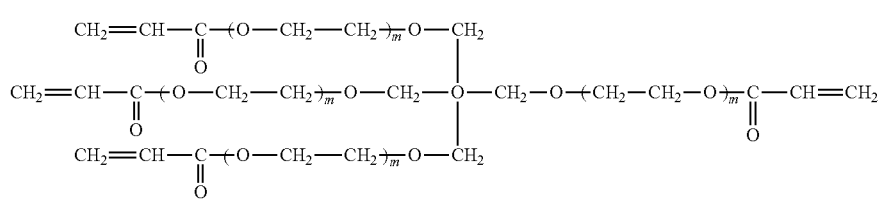

(the sum of the respective m's is 4)

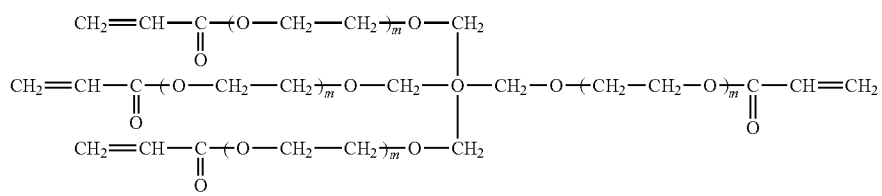

(the sum of the respective m's is 12)

Examples of commercially available products of the polymerizable compounds represented by General Formulae (Z-4) and (Z-5) include SR-494 which is a tetrafunctional acrylate having four ethyleneoxy chains, manufactured by Sartomer, and DPCA-60 which is a hexafunctional acrylate having six pentyleneoxy chains, and TPA-330 which is a trifunctional acrylate having three isobutyleneoxy chains, manufactured by Nippon Kayaku Co., Ltd.

Moreover, as other polymerizable compounds, the urethane acrylates described in JP1973-41708B (JP-S48-41708B), JP1976-37193A (JP-S51-37193A), JP1990-32293B (JP-H02-32293B), and JP1990-16765B (JP-H02-16765B) or urethane compounds having an ethylene oxide-based skeleton described in JP1983-49860B (JP-S58-49860B), JP1981-17654B (JP-S56-17654B), JP1987-39417B (JP-S62-39417B), and JP1987-39418B (JP-S62-39418B) are also preferable. Furthermore, by using addition-polymerizable compounds, which have an amino structure or a sulfide structure in a molecule and are described in JP1988-277653A (JP-S63-277653A), JP1988-260909A (JP-S63-260909A), and JP1989-105238A (JP-H01-105238A), as the polymerizable compounds, a curable composition which is extremely excellent in photosensitization speed can be obtained.

Examples of commercially available products of the polymerizable compounds include urethane oligomers UAS-10 and UAB-140 (manufactured by Sanyo-Kokusaku Pulp, Co., Ltd.), UA-7200 (manufactured by SHIN-NAKAMURA CHEMICAL CO., LTD.), DPHA-40H (manufactured by Nippon Kayaku Co., Ltd.), and UA-306H, UA-306T, UA-3061, AH-600, T-600, and AI-600 (manufactured by KYOEISHA CHEMICAL CO., LTD.).

Details of how to use these polymerizable compounds, such as the structure, whether the polymerizable compounds are used singly or used in combination thereof, and the amount of the polymerizable compounds added, can be arbitrarily set according to the designed final performance of the coloring composition. For example, from the viewpoint of sensitivity, a structure in which the content of an unsaturated group per molecule is large is preferable, and in many cases, it is preferable that the polymerizable compound has 2 or more functional groups. Moreover, from the viewpoint of enhancing the strength of a cured film formed of the coloring composition, it is preferable that the polymerizable compound has 3 or more functional groups. In addition, a method for adjusting both the sensitivity and the strength by using a combination of compounds which differ in the number of functional groups and have different polymerizable groups (for example, an acrylic ester, a methacrylic ester, a styrene-based compound, and a vinylether-based compound) is also effective. Further, it is preferable to use polymerizable compounds having 3 or more functional groups and differing in the length of an ethylene oxide chain since the developability of the coloring composition can be adjusted, and excellent pattern formability is obtained.

In addition, from the viewpoints of the compatibility with other components (for example, a photopolymerization initiator, a substance to be dispersed, and an alkali-soluble resin) contained in the coloring composition, and the dispersibility, how to select and use the polymerizable compound is an important factor. For example, if a low-purity compound is used or a combination of two or more kinds thereof is used, the compatibility can be improved in some cases. In addition, from the viewpoint of improving the adhesiveness of the composition to a hard surface of a support or the like, specific structures may be selected in some cases.

In the case where of other polymerizable compounds are blended into the coloring composition of the present invention, the content of other polymerizable compounds is preferably 1% by mass to 40% by mass, and more preferably 1% by mass to 30% by mass, with respect to the total solid contents of the coloring composition. The polymerizable compounds may be used singly or in combination of two or more kinds thereof. In the case where two or more kinds of other polymerizable compounds are included, the total amount thereof is preferably within the range.

<<Organic Solvent>>

The coloring composition of the present invention preferably contains an organic solvent.

The organic solvent is not particularly limited as long as it satisfies the solubility of the respective components or the coatability of the coloring composition, but the organic solvent is preferably selected, particularly in consideration of the solubility, the coatability, and the safety of an ultraviolet absorbent, a polymerizable compound, a resin (dispersant), or the like.

Suitable examples of the organic solvent include esters such as ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl oxyacetate (e.g.: methyl oxyacetate, ethyl oxyacetate, and butyl oxyacetate (e.g.: methyl methoxyacetate, ethyl methoxyacetate, butyl methoxyacetate, methyl ethoxyacetate, and ethyl ethoxyacetate)), alkyl 3-oxypropionate esters (e.g.: methyl 3-oxypropionate and ethyl 3-oxypropionate (e.g.: methyl 3-methoxypropionate, ethyl 3-methoxypropionate, methyl 3-ethoxypropionate, and ethyl 3-ethoxypropionate)), alkyl 2-oxypropionate esters (e.g.: methyl 2-oxypropionate, ethyl 2-oxypropionate, or propyl 2-oxypropionate (e.g.: methyl 2-methoxypropionate, ethyl 2-methoxypropionate, propyl 2-methoxypropionate, methyl 2-ethoxypropionate, or ethyl 2-ethoxypropionate)), methyl 2-oxy-2-methyl propionate and ethyl 2-oxy-2-methyl propionate (e.g.: methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol methyl ether acetate, propylene glycol ethyl ether acetate, and propylene glycol propyl ether acetate; ketones such as methyl ethyl ketone, cyclohexanone, 2-heptanone, 3-heptanone, and cyclopentanone; and aromatic hydrocarbons such as toluene and xylene.

From the viewpoints of improvement of the shape of the coated surface, and the like, it is also preferable to mix two or more kinds of these organic solvents. In this case, a mixed solution consisting of two or more kinds selected from the methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethylcarbitol acetate, butylcarbitol acetate, propylene glycol methyl ether, and propylene glycol methyl ether acetate is particularly preferable. In particular, a mixed solution consisting of cyclohexanone, ethyl 3-ethoxypropionate, and propylene glycol methyl ether acetate is preferable. The solvent has a content of peroxides of 0.8 mmmpl/L or less, and it is more preferable that the organic solvent substantially does not include peroxides.

From the viewpoint of coatability, the content of the organic solvent in the coloring composition of the present invention is set such that the concentration of the total solid content of the coloring composition becomes preferably 5% by mass to 80% by mass, more preferably 5% by mass to 60% by mass, still more preferably 10% by mass to 50% by mass, and particularly preferably 10% by mass to 40% by mass.

<<Other Components>>

In addition to the respective components as described above, a surfactant, an acid anhydride, a curing agent, a curing catalyst, a photopolymerization initiator, and an alkali-soluble resin, or the like can further be blended into the composition of the present invention within a range not diminishing the effects of the present invention.

<<Surfactant>>

From the viewpoint of further improving coatability, various surfactants are preferably added to the coloring composition of the present invention. As the surfactants, various surfactants such as a fluorine-based surfactant, a nonionic surfactant, a cationic surfactant, an anionic surfactant, and a silicone-based surfactant can be used.

In particular, if the coloring composition of the present invention contains a fluorine-based surfactant, liquid characteristics (particularly, fluidity) are further improved when the composition is prepared as a coating liquid, whereby evenness of the coating thickness or liquid saving properties can be further improved.

That is, in the case where a coating liquid obtained by applying the coloring composition containing a fluorine-based surfactant is used to form a film, the surface tension between a surface to be coated and the coating liquid is reduced to improve wettability with respect to the surface to be coated, and enhance coatability with respect to the surface to be coated. Therefore, even in the case where a thin film of about several μm is formed of a small amount of liquid, the coloring composition containing a fluorine-based surfactant is effective in that a film with a uniform thickness which exhibits a small extent of thickness unevenness can be more suitably formed.

The fluorine content in the fluorine-based surfactant is preferably 3% by mass to 40% by mass, more preferably 5% by mass to 30% by mass, and particularly preferably 7% by mass to 25% by mass. The fluorine-based surfactant in which the fluorine content is within this range is effective in terms of the evenness of the thickness of the coated film or liquid saving properties, and the solubility of the surfactant in the coloring composition is also good.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, and MEGAFACE F781 (all manufactured by DIC Corporation); FLUORAD FC430, FC431, and FC171 (all manufactured by Sumitomo 3M); SURFLON S-382, SURFLON SC-101, SURFLON SC-103, SURFLON SC-104, SURFLON SC-105, SURFLON SC1068, SURFLON SC-381, SURFLON SC-383, SURFLON SC-393, and SURFLON KH-40 (all manufactured by ASAHI GLASS Co., Ltd.); and PF636, PF656, PF6320, PF6520, and PF7002 (manufactured by OMNOVA). As the fluorine-based surfactant, a block polymer can also be used, and specific examples thereof include the compounds described in JP2011-89090A.

Specific examples of the nonionic surfactant include glycerol, trimethylolpropane, trimethylolethane, and ethoxylate and propoxylate thereof (for example, glycerol propoxylate and glycerin ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters (PLURONIC L10, L31, L61, L62, 10R5, 17R2, and 25R2, and TETRONIC 304, 701, 704, 901, 904, and 150R1 manufactured by BASF), and SOLSEPERSE 20000 (manufactured by Lubrizol Japan Ltd.).

Specific examples of the cationic surfactant include phthalocyanine derivatives (trade name: EFKA-745 manufactured by MORISHITA KAGAKU SANGYO Corporation), organosiloxane polymer KP341 (manufactured by Shin-Etsu Chemical Co., Ltd.), (meth)acrylic acid-based (co)polymer POLYFLOW No. 75, No. 90, and No. 95 (manufactured by KYOEISHA CHEMICAL CO., LTD.), and W001 (manufactured by Yusho Co., Ltd.).

Specific examples of the anionic surfactant include W004, W005, and W017 (manufactured by Yusho Co., Ltd.).

Examples of the silicone-based surfactant include "TORAY SILICONE DC3PA", "TORAY SILICONE SH7PA", "TORAY SILICONE DC11PA", "TORAY SILICONE SH21PA", "TORAY SILICONE SH28PA", "TORAY SILICONE SH29PA", "TORAY SILICONE SH30PA", and "TORAY SILICONE SH8400", manufactured by Dow Corning Toray CO., LTD., "TSF-4440", "TSF-4300", "TSF-4445", "TSF-4460", and "TSF-4452", manufactured by Momentive Performance Materials Inc., "KP341", "KF6001", and "KF6002", manufactured by Shin-Etsu Chemical Co., Ltd., and "BYK307", "BYK323", and "BYK330", manufactured by BYK Additives & Instruments.

The surfactants may be used singly or in combination of two or more kinds thereof.

The coloring composition of the present invention may or may not contain a surfactant, but in the case where the coloring composition contains a surfactant, the content of the surfactant is preferably 0.001% by mass to 2.0% by mass, and more preferably 0.005% by mass to 1.0% by mass, with respect to the total solid content of the coloring composition.

<<<Acid Anhydride>>>

In the case where the coloring composition of the present invention contains a compound having an epoxy group, it may contain an acid anhydride. By incorporating the acid anhydride into the coloring composition, the crosslinking properties by the heat curing of the compound having an epoxy group can be improved.

Examples of the acid anhydride include phthalic anhydride, nadic anhydride, maleic anhydride, and succinic anhydride. Among these, phthalic anhydride is preferable as the acid anhydride from the viewpoint that the effect on pigment dispersion is little.

The content of the acid anhydride in the coloring composition is preferably in the range of 10% by mass to 40% by mass, and more preferably in the range of 15% by mass to 30% by mass, with respect to the mass of the compound having an epoxy group. With the content of acid anhydride of 10% by mass or more, the epoxy compound will have an increased crosslinking density, and an increased mechanical strength, whereas with a content of 30% by mass or less, the heat curable components will be suppressed in the coated film, thereby advantageously increasing the concentration of colorants.

<<<Curing Agent>>>

In the case where the coloring composition of the present invention contains a compound having an epoxy group, it may contain a curing agent. There are a great variety of curing agents, and they largely vary from species to species in properties, the survival time of a mixture of a resin and a curing agent, the viscosity, the curing temperature, the curing time, and the heat generation, so that it is preferable to select an appropriate curing agent taking purpose of use, conditions of use, conditions of working and so forth into consideration. The curing agent is described in detail in "Epoxy Resin" (published by Shokodo Co., Ltd.), edited by Hiroshi Kakiuchi, Chapter 5. Examples of the curing agent will be enumerated below.

Examples of those demonstrating a catalytic action include a tertiary amines and a boron trifluoride-amine complex; examples of those demonstrating stoichiometric reaction with an epoxy group include a polyamine and an acid anhydride; examples of those curable at normal temperature include diethylenetriamine and a polyamide resin; examples of those curable at middle temperatures include diethylaminopropylamine, and tris(dimethylaminomethyl) phenol; and examples of those curable at high temperatures include phthalic anhydride and meta-phenylenediamine. When classified by the chemical structure, examples of amines include aliphatic polyamines such as diethylenetriamine; aromatic polyamine such as meta-phenylenediamine; tertiary amines such as tris(dimethylaminomethyl)phenol; acid anhydrides such as phthalic anhydride; a polyamide resin, a polysulfide resin, and a boron trifluoride-monoethylamine complex; an initial condensate of a synthetic resin such as a phenol resin, and dicyandiamide. Further, phthalimide can also be used. Phthalimide is particularly preferable. Sine phthalimide has a structure that is similar to that of the halogenated zinc phthalocyanine pigment, it is likely to be present in the vicinity of the halogenated zinc phthalocyanine pigment. As a result, the reaction of the compound having an epoxy group is likely to occur in the vicinity of the halogenated zinc phthalocyanine pigment and sublimation or heat transfer of the halogenated zinc phthalocyanine pigment can be efficiently suppressed. Thus, it is possible to more effectively suppress the generation of acicular crystals during heating at a high temperature.

Phthalimide is preferably a compound represented by the following General Formula (1).

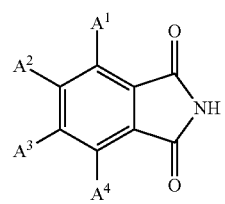

(1)

In General Formula (1), $A^1$ to $A^4$ each independently represent a hydrogen atom, a halogen atom, or a methyl group.

It is preferable that at least one of $A^1, \ldots,$ or $A^4$ is selected from a chlorine atom and a bromine atom, and it is more preferable that all of $A^1$ to $A^4$ are selected from a chlorine atom and a bromine atom. Since phthalimide in which at least one of $A^1, \ldots,$ or $A^4$ is selected from a chlorine atom and a bromine atom structure has a structure similar to that of the halogenated zinc phthalocyanine pigment, the halogenated zinc phthalocyanine pigment can be in vicinity of phthalimide at a suitable distance, the effects are likely to be more effectively obtained.

Furthermore, it is also preferable that $A^1$ to $A^4$ are the same as $X^1$ to $X^4$, $X^5$ to $X^3$, $X^9$ to $X^{12}$, or $X^{13}$ to $X^{16}$ of the halogenated zinc phthalocyanine pigment represented by General Formula (A1). According to this aspect, since the structure of phthalimide is similar to the structure of the halogenated zinc phthalocyanine pigment, the halogenated zinc phthalocyanine pigment can be in vicinity of phthalimide at a suitable distance, the effects are likely to be more effectively obtained.

These curing agents react with an epoxy group under heating, and polymerize the resin, thereby increasing the crosslinking density to perform curing. From the viewpoint of thinning of the film, the amounts of consumption of both of the binder and the curing agent are preferably as small as possible, and in particular, the curing agent is in the amount of 35% by mass or less, preferably 30% by mass or less, and more preferably 25% by mass or less, with respect to the compound having an epoxy group.

Moreover, in the case where phthalimide is contained, the content of phthalimide with respect to the total solid content in the coloring composition is preferably 0.01% by mass to 5% by mass.

<<<Curing Catalyst>>>

In the case where the coloring composition of the present invention contains the compound having an epoxy group, it may contain a curing catalyst. In order to obtain a composition with a high concentration of colorants, it is effective to employ, in addition to curing by the reaction with the curing agent, a curing mechanism mainly based on a reaction between epoxy groups. For this purpose, a curing catalyst may also be used, while abandoning the curing agent. Only a slight amount of addition of the curing catalyst, approximately $1/10$ to $1/1,000$ on a mass basis, preferably approximately $1/20$ to $1/500$, and more preferably approximately $1/30$ to $1/250$, with respect to the epoxy resin with an epoxy equivalent of approximately 150 to 200, can be used to perform curing.

<<<Photopolymerization Initiator>>>

The coloring composition of the present invention may contain a photopolymerization initiator from the viewpoint of further improvement of sensitivity.

The photopolymerization initiator is not particularly limited as long as it has an ability of initiating polymerization of the polymerizable compound, and may be appropriately selected from known photopolymerization initiators. For example, those having photosensitivity to light in the region from ultraviolet to visible are preferred, and the initiator may be an activator that causes a certain action with a photoexcited sensitizer to produce an active radical or an initiator that initiates cationic polymerization according to the kind of the monomer.

For the photopolymerization initiator, reference can be made to, for example, the descriptions of paragraph Nos. 0178 to 0226 of JP2013-54080A, the contents of which may be hereby incorporated. In addition, commercially available products such as TRONLY TR-PBG-304, TRONLY TR-PBG-309, and TRONLY TR-PBG-305 (manufactured by CHANGZHOU TRONLY NEW ELECTRONIC MATERIALS CO., LTD.), ADEKA ARKLS NCI-831, and ADEKA ARKLS NCI-930 (manufactured by ADEKA Corporation) can also be used.

The coloring composition of the present invention may not contain a photopolymerization initiator, but the content of the photopolymerization initiator is preferably 0% by mass to 50% by mass, more preferably 0.5% by mass to 30% by mass, and still more preferably 1% by mass to 20% by mass, with respect to the total solid content of the coloring composition of the present invention.

Moreover, in the case where the coloring composition of the present invention is used for a dry etching step, it is preferable that the coloring composition of the present invention substantially does not contain a photopolymerization initiator. In the case where the coloring composition substantially does not contain the photopolymerization initiator, the content of the photopolymerization initiator is preferably 1% by mass or less, more preferably 0.1% by mass or less, and particularly preferably 0% by mass, with respect to the total solid content of the coloring composition of the present invention.

<<<Alkali-Soluble Resin>>>

The coloring composition of the present invention may contain an alkali-soluble resin.

The molecular weight of the alkali-soluble resin is not particularly determined, but Mw is preferably 5,000 to 100,000. Further, Mn is preferably 1,000 to 20,000.

The alkali-soluble resin can be appropriately selected from alkali-soluble resins which are linear organic high molecular-weight polymers and have at least one group enhancing alkali solubility in a molecule (preferably a molecule having an acrylic copolymer or a styrene-based copolymer as a main chain). From the viewpoint of heat resistance, a polyhydroxystyrene-based resin, a polysiloxane-based resin, an acrylic resin, an acrylamide-based resin, and an acryl/acrylamide copolymer resin are preferable, and further, from the viewpoint of controlling developability, an acrylic resin, an acrylamide-based resin, and an acryl/acrylamide copolymer resin are preferable.

For the alkali-soluble resin, reference can be made to the descriptions in paragraphs 0558 to 0571 of JP2012-208494A ([0685] to [0700] of the corresponding US2012/0235099A), the contents of which are incorporated herein by reference.

The coloring composition of the present invention may not contain the alkali-soluble resin, but in the case where the coloring composition contains the alkali-soluble resin, the content of the alkali-soluble resin is preferably 1% by mass to 15% by mass, more preferably 2% by mass to 12% by mass, and particularly preferably 3% by mass to 10% by mass, with respect to the total solid content of the coloring composition.

The coloring composition of the present invention may include one kind or two or more kinds of alkali-soluble resin. In the case where the coloring composition includes two or more kinds of the alkali-soluble resin, the total amount thereof is preferably within the range.

In addition, various additions, for example, a filler, an adhesion promoter, an antioxidant, an ultraviolet absorbent, an aggregation inhibitor, or the like can be blended into the coloring composition of the present invention, if desired. Examples of these additives include those described in paragraphs 0155 to 0156 of JP2004-295116A.

The coloring composition of the present invention may contain the sensitizer or the light stabilizer described in paragraph 0078 of JP2004-295116A, or the thermal polymerization inhibitor described in paragraph 0081 of the same publication.

<Method for Preparing Coloring Composition>

The coloring composition of the present invention can be prepared by mixing the respective components as described above.

Furthermore, when the coloring composition is prepared, the respective components constituting the coloring composition may be mixed together at the same time or mixed together sequentially after being dissolved and dispersed in a solvent. Further, the order of adding the components and the operation conditions during the mixing are not particularly restricted. For example, all the components may be dissolved and dispersed in a solvent at the same time to prepare the coloring composition. Alternatively, if desired, the respective components may be appropriately prepared as two or more solutions or dispersion liquids and mixed at the time of use (at the time of coating) to prepare the composition.

For the coloring composition of the present invention, it is preferable that a pigment is dispersed in by a resin (dispersant), and the resultant is blended into other components.

It is preferable that the coloring composition of the present invention is filtered using a filter for the purpose of removing impurities or reducing deficit, for example.

As a filter for used in filter filtration, any filters that have been used in the related art for filtration use and the like may be used as a filter for filtration through a filter without particular limitation.

Examples of the materials of the filter include filters formed of a fluorine resin such as polytetrafluoroethylene (PTFE), a polyamide-based resin such as Nylon-6 and Nylon-6,6, and a polyolefin resin (including a high density and a ultrahigh molecular weight) such as polyethylene and polypropylene (PP). Among these materials, polypropylene (including high-density polypropylene) is preferable.

The pore diameter of the filter is not particularly limited, and is, for example, approximately 0.01 µm to 20.0 µm, preferably approximately 0.01 µm to 5 µm, and more preferably approximately 0.01 µm to 2.0 µm.

By setting the pore diameter of the filter to the range, it is possible to remove fine particles more effectively, and thus to further reduce the turbidity.

Here, for the pore diameter of the filter herein, reference can be made to nominal values of filter manufacturers. A commercially available filter may be selected from various filters provided by, for example, Nihon Pall Corporation, Toyo Roshi Kaisha., Ltd., Nihon Entegris K. K. (formerly Nippon Microlith Co., Ltd.), Kitz Micro Filter Corporation, or the like.

In the filtration through a filter, two or more kinds of filters may be used in combination.

For example, the filtration through a first filter may be followed by the next filtration through a second filter having a pore diameter different from that of the first filter.

At this time, each of the filtration through the first filter and the filtration through the second filter may be run once, or may be repeated twice or more times.

As the second filter, those formed of the same material as that of the above-described first filter may be used.

<Applications>

The coloring composition of the present invention is suitably used for forming a colored pattern of a color filter. Further, the coloring composition of the present invention can be suitably used for forming a colored pattern of a color filter or the like used in a solid-state imaging device (for example, a CCD and a CMOS) and an image display device such as a liquid crystal display device (LCD). Among these, the coloring composition can also be suitably used in an application of the manufacture of a color filter for a solid-state imaging device such as CCD and CMOS. In addition, the coloring composition of the present invention can be preferably used as a coloring composition for dry etching.

<Cured Film, Pattern Forming Method, Color Filter, and Method for Manufacturing Color Filter>

Next, the cured film, the pattern forming method, and the color filter in the present invention will be described in detail by an explanation of manufacturing methods thereof. Further, a method for manufacturing a color filter using the pattern forming method of the present invention will also be described.

The cured film of the present invention is formed by curing the coloring composition of the present invention. Such a cured film is preferably used in a color filter.

In the pattern forming method of the present invention, the coloring composition of the present invention is applied onto a support to form a coloring composition layer, and an undesired area is removed to form a colored pattern.

The pattern forming method of the present invention can be suitably applied for forming a colored pattern (pixel) included in a color filter.

With the coloring composition of the present invention, a pattern may be formed by a dry etching method and a color filter may be manufactured by forming a pattern using a so-called photolithography method.

That is, as a first embodiment of the pattern forming method of the present invention, a pattern forming method including a step of applying a coloring composition onto a support to form a coloring composition layer, followed by curing, thereby forming a colored layer, a step of forming a photoresist layer on the colored layer; a step of patterning the photoresist layer by exposure and development to obtain a resist pattern; and a step of dry etching the colored layer using the resist pattern as an etching mask is exemplified. In the case where the coloring composition of the present invention is used in a pattern forming method including a dry etching step, it may be a light or heat curable composition. In the case where the coloring composition is the heat curable composition, it is preferable to use the compound having an epoxy group as described above as the curable compound.

Moreover, in a second embodiment of the pattern forming method of the present invention, a pattern forming method including a step of applying a coloring composition onto a support to form a coloring composition layer, a step of patternwise exposing the coloring composition layer, and a step of removing an unexposed area by development to form a colored pattern is exemplified.

Such a pattern forming method is used for the manufacture of the colored layer of the color filter. That is, a method for manufacturing a color filter, including the pattern forming method of the present invention, is also disclosed in the present invention.

Hereinafter, details of these will be described.

The respective steps in the pattern forming method of the present invention will be described in detail below with reference to the method for manufacturing a color filter for a solid-state imaging device, but the present invention is not limited to this method. Hereinafter, the color filter for a solid-state imaging device may be simply referred to as a "color filter" in some cases.

The method for manufacturing a color filter of the present invention will be described with reference to the specific examples thereof, using FIGS. 1 to 9.

First, as shown in the schematic cross-sectional view of FIG. 1, a first colored layer 11 is formed on a support not shown, using the coloring composition of the present invention (also referred to as a first coloring composition) (step (a)).

The first colored layer 11 can be formed by coating the coloring composition onto a support by a coating method such as spinning coating, slit coating, and spray coating, followed by drying, to form a colored layer.

The thickness of the first colored layer 11 is preferably in the range of 0.3 µm to 1.0 µm, more preferably in the range of 0.35 µm to 0.8 µm, and still more preferably in the range of 0.35 µm to 0.7 µm.

As a curing method, a method in which the first colored layer 11 is heated using a heating device such as a hot plate and an oven, followed by curing, is preferable. The heating temperature is preferably 120° C. to 250° C., and more preferably 160° C. to 230° C. The heating time varies depending on a heating means, but in the case of heating on a hot plate, the heating time is usually approximately 3 minutes to 30 minutes, and in the case of heating in an oven, the heating times is usually approximately 30 minutes to 90 minutes.

Next, the first colored layer 11 is patterned by dry etching such that a through-hole group is formed (step (b)).

The first colored pattern may be a colored pattern which is provided as a first tint on a support, and in some cases, may be a colored pattern which is provided as, for example, a pattern after a second tint or a third tint, on a support having a pattern already provided thereon.

The first colored layer 11 may be dry-etched using a patterned photoresist layer as a mask, and an etching gas. For example, as shown in schematic cross sectional view of FIG. 2, first, a photoresist layer 51 is formed over the first colored layer 11.

Specifically, a positive or negative type radiation-sensitive composition is applied (preferably coated) over the colored layer, and then dried to form the photoresist layer. In formation of the photoresist layer 51, it is preferable to further carry out a prebaking treatment. In particular, a process for forming a photoresist is preferably configured such that a post-exposure baking treatment (PEB) and a post-development baking treatment (post-baking treatment) are carried out.

As the photoresist, for example, a positive type radiation-sensitive composition is used. As the positive type radiation-sensitive composition, a positive type resist composition suitable for use in a positive type photoresist which is sensitive to radiations such as ultraviolet rays (a g-line, an h-line, an i-line), far ultraviolet radiations including excimer laser, electron beams, ion beams, and X-rays can be used. Among the radiations, the g-line, the h-line, and the i-line are preferable, among which the i-line is preferable.

Specifically, as the positive type radiation-sensitive composition, a composition containing a quinone diazide compound and an alkali-soluble resin is preferable. The positive type radiation-sensitive composition containing a quinone diazide compound and an alkali-soluble resin makes use of a mechanism by which a quinone diazide group decomposes upon irradiation with light at 500 nm or less to generate a carboxyl group, and as a result, the composition changes from an alkali-insoluble one to an alkali-soluble one. The positive type photoresist has been used for manufacturing integrated circuits such as an IC and an LSI due to its notably excellent resolving power. Examples of the quinone diazide compound include a naphthoquinone diazide compound.

The thickness of a photoresist layer 51 is preferably 0.1 μm to 3 μm, more preferably 0.2 μm to 2.5 μm, and still more preferably 0.3 μm to 2 μm. Further, the photoresist layer 51 can be suitably coated by a coating method for the first colored layer 11 as described above.

Figure 3:
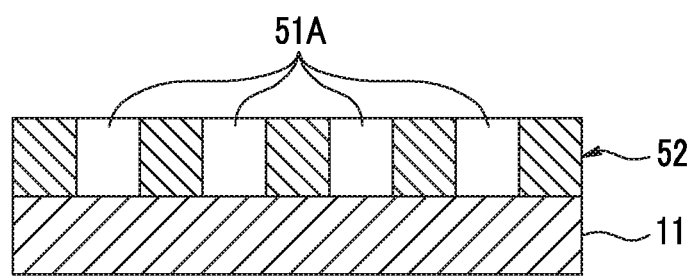
FIG. 3 is a schematic cross-sectional view showing a state where a resist pattern is formed on the first colored layer.

Next, as shown in the schematic cross sectional view of FIG. 3, the photoresist layer 51 is exposed and developed to form a resist pattern (patterned photoresist layer) 52 having a resist through-hole group 51A provided therein.

The resist pattern 52 can be formed by appropriately optimizing any of photolithographic techniques known in the related art, without special limitation. By forming the resist through-hole group 51A in the photoresist layer 51 through exposure and development, the resist pattern 52 which serves as the etching mask in the subsequent etching may be provided on the first colored layer 11.

The photoresist layer 51 can be exposed by the positive or negative type radiation-sensitive composition with a g-line, an h-line, or an i-line, and preferably with an i-line, through a predetermined mask pattern. After the exposure, the photoresist is developed using a developing liquid, to be removed selectively in a region where the colored pattern will be formed.

As the developing liquid, any developing liquid can be used as long as it can dissolve an exposed area of the positive resist or an uncured area of the negative resist while not adversely affecting the first colored layer containing a colorant, and for example, combinations of various organic solvents or an alkaline aqueous solution can be used. As the alkaline aqueous solution, an alkaline aqueous solution which is prepared so as to control the concentration of an alkaline compound to 0.001% by mass to 10% by mass, and preferably 0.01% by mass to 5% by mass is suitable. Examples of the alkaline compound include sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine, and 1,8-diazabicyclo[5.4.0]-7-undecene. Further, in the case of using the alkaline aqueous solution as the developing liquid, a treatment for cleaning with water is generally carried out after the development.

Figure 4:
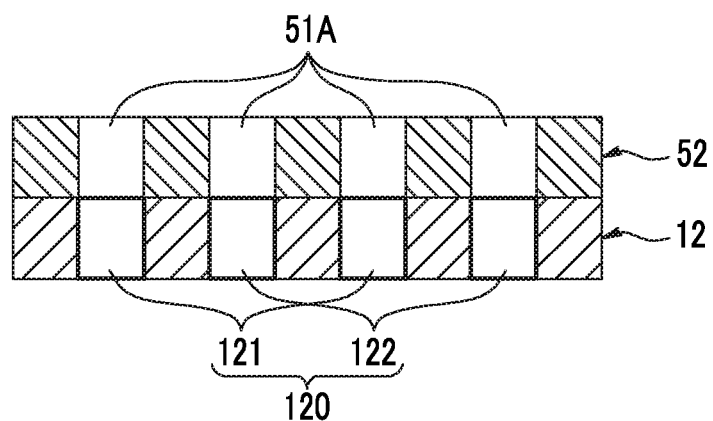
FIG. 4 is a schematic cross-sectional view showing a state where a first colored pattern is formed by providing a through-hole group on the first colored layer by etching.

Next, as shown in the schematic cross sectional view of FIG. 4, the first colored layer 11 is patterned by dry etching, using the resist pattern 52 as an etching mask, so as to form the through-hole group 120. Thus, the first colored pattern 12 is formed. Here, the through-hole group 120 has a first through-hole subgroup 121 and a second through-hole subgroup 122.

The through-hole group 120 is provided in the first colored layer 11 so as to form a checkered pattern. Accordingly, the first colored pattern 12, configured by providing the through-hole group 120 in the first colored layer 11, has a plurality of square first colored pixels arranged in a checkered pattern.

Specifically, in the dry etching, the first colored layer 11 is dry-etched using the resist pattern 52 as the etching mask. Representative methods for dry etching include the methods described in JP1984-126506A (JP-S59-126506A), JP1984-46628A (JP-S59-46628A), JP1983-9108A (JP-S58-9108A), JP1983-2809A (JP-S58-2809A), JP1982-148706A (JP-S57-148706A), and JP1986-41102A (JP-S61-41102A).

The dry etching is preferably carried out in the following configurations, from the viewpoint of shaping the cross-section of the pattern more rectangular, and reducing damages to the support.

The etching step is preferably configured to include etching of the first step, in which the first colored layer 11 is etched using a mixed gas of a fluorine-based gas and oxygen gas ($O_2$), to a region (depth) where the support remains unexposed; a etching of the second step subsequent to the etching of the first step, in which the first colored layer 11 is etched using a mixed gas of nitrogen gas ($N_2$) and oxygen gas ($O_2$), preferably to a region (depth) where the support exposes; and over-etching subsequent to exposure of the support. Specific techniques of the dry etching, the etching of the first step, the etching of the second step, and the over-etching will be described below.

The dry etching is carried out according to etching conditions, which have been preliminarily determined by the following techniques.

(1) The etching rate (nm/min) in the etching of the first step, and the etching rate (nm/min) in the etching of the second step are respectively estimated.

(2) The time required for etching a desired thickness in the etching of the first step, and the time required for etching a desired thickness in the etching of the second step are respectively estimated.

(3) The etching of the first step is carried out according to the etching time estimated in (2).

(4) The etching of the second step is carried out according to the etching time estimated in (2). Alternatively, the etching time may be determined by endpoint detection, and the etching of the second step may be carried out according to the determined etching time.

(5) The over-etching time is estimated based on the total time of (3) and (4), based on which the over-etching is carried out.

The mixed gas used in the etching step of the first step preferably includes a fluorine-based gas and an oxygen gas ($O_2$), from the viewpoint of patterning an organic material which configures a film to be etched into a rectangular profile. By carrying out the etching step of the first step only to a range where the support remains unexposed, the support is prevented from being damaged.

Furthermore, after the etching step of the first step is carried out using a mixed gas of a fluorine-based gas and an oxygen gas, only up to the range where the support remains unexposed, the etching step of the second step and the over-etching step are preferably carried out using a mixed gas of a nitrogen gas and an oxygen gas, from the viewpoint of preventing damages of the support.

It is important to determine the ratio of the amount of etching in the etching step of the first step, and the amount of etching in the etching step of the second step, so as not to degrade the rectangularity obtained in the etching treatment of the etching step of the first step. The ratio of the amount of etching in the etching step of the second step, with respect to the total amount of etching (the total of the amount of etching in the etching step of the first step and the amount of etching in the etching step of the second step) preferably falls in the range of more than 0% and 50% or less, and preferably in the range from 10% to 20%. The amount of etching refers to the thickness of the film which remains etched.

Moreover, the etching preferably includes the over-etching treatment. The over-etching treatment is preferably carried out by presetting the ratio of over-etching. Further, the ratio of over-etching is preferably estimated from the time of the etching treatment initially carried out. While the ratio of over-etching may arbitrarily be set, it is preferably 30% or less, more preferably 5% to 25%, and particularly preferably 10% to 15% of the etching time in the etching treatment in the etching step, from the viewpoint of etching resistance of the photoresist and maintainability of the rectangular etched pattern.

Figure 5:
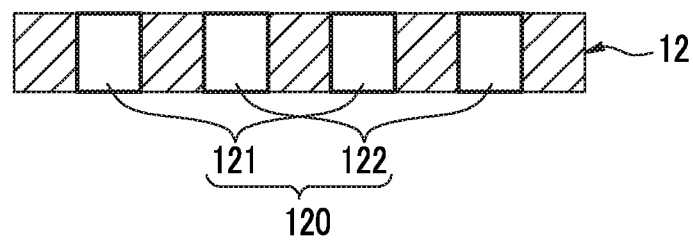
FIG. 5 is a schematic cross-sectional view showing a state where the resist pattern in FIG. 4 is removed.

Next, as shown in the schematic cross-sectional view of FIG. 5, a resist pattern (that is, an etching mask) 52 which remains after the etching is removed. The removal of the resist pattern 52 preferably includes a step of applying a stripping liquid or a solvent over the resist pattern 52 to make the resist pattern 52 ready for removal, and a step of removing the resist pattern 52 using cleaning water.

Examples of the step of applying a stripping liquid or a solvent onto the resist pattern 52 to make the resist pattern 52 ready for removal include a step of applying a stripping liquid or a solvent at least onto the resist pattern 52, and allowing it to stay for a predetermined time for puddle development. The time over which the stripping liquid or solvent is allowed to stay is preferably several tens of seconds to several minutes, but not particularly limited.

Furthermore, examples of the step of removing the resist pattern 52 using cleaning water include a step of removing the resist pattern 52 by spraying the cleaning water from a spray-type or shower-type jetting nozzle against the resist pattern 52. Pure water is preferably used as the cleaning water. Further, examples of the jetting nozzle include a jetting nozzle capable of covering the entire support within the range of jetting thereof, and a movable jetting nozzle capable of covering the entire support within the movable range thereof. The jetting nozzle, in the case of being configured as the movable type one, can more effectively remove the resist pattern 52 in the step of removing the resist pattern 52, by jetting the cleaning water while travelling from the center of the support to the end of the support twice or more times.

The stripping liquid generally contains an organic solvent, and may further contain an inorganic solvent. Examples of the organic solvent include by 1) a hydrocarbon-based compound, 2) a halogenated hydrocarbon-based compound, 3) an alcohol-based compound, 4) an ether or acetal-based compound, 5) a ketone- or aldehyde-based compound, 6) an ester-based compound, 7) a polyhydric alcohol-based compound, 8) a carboxylic acid or its acid anhydride-based compound, 9) a phenol-based compound, 10) a nitrogen-containing compound, 11) a sulfur-containing compound, and 12) a fluorine-containing compound. The stripping liquid preferably contains the nitrogen-containing compound, and more preferably contains the noncyclic nitrogen-containing compound and the cyclic nitrogen-containing compound.

The noncyclic nitrogen-containing compound is preferably a noncyclic nitrogen-containing compound having a hydroxyl group. Specific examples thereof include monoisopropanolamine, diaisopropanolamine, triisopropanolamine, N-ethylethanolamine, N,N-dibutylethanolamine, N-butylethanolamine, monoethanolamine, diethanolamine, and triethanolamine; preferably monoethanolamine, diethanolamine, and triethanolamine; and more preferably monoethanolamine ($H_2NCH_2CH_2OH$). Further, examples of the cyclic nitrogen-containing compound include isoquinoline, imidazole, N-ethylmorpholine, ∈-caprolactam, quinoline, 1,3-dimethyl-2-imidazolidinone, α-picoline, β-picoline, γ-picoline, 2-pipecoline, 3-pipecoline, 4-pipecoline, piperadine, piperidine, pyrazine, pyridine, pyrrolidine, N-methyl-2-pyrrolidone, N-phenylmorpholine, 2,4-lutidine, and 2,6-lutidine; preferably N-methyl-2-pyrrolidone, and N-ethylmorpholine; and more preferably N-methyl-2-pyrrolidone (NMP).

The stripping liquid preferably includes the noncyclic nitrogen-containing compound and the cyclic nitrogen-containing compound; more preferably includes at least one species selected from monoethanolamine, diethanolamine, or triethanolamine as the noncyclic nitrogen-containing compound, and at least one species selected from N-methyl-2-pyrrolidone or N-ethylmorpholine as the cyclic nitrogen-containing compound; and still more preferably includes monoethanolamine and N-methyl-2-pyrrolidone.

The removal using the stripping liquid will suffice if the resist pattern 52 formed on the first colored pattern 12 is removed, in which deposited matter may not be completely removed in the case where the deposited matter as an etching product is adhered onto the side wall of the first colored pattern 12. The deposited matter is an etching product adhered and accumulated on the side wall of the colored layer.

The stripping liquid preferably has a content of the noncyclic nitrogen-containing compound of 9 parts by mass or more and 11 parts by mass or less, with respect to 100 parts by mass of the stripping liquid, and has a content of the cyclic nitrogen-containing compound of 65 parts by mass or more and 70 parts by mass or less, with respect to 100 parts by mass of the stripping liquid. Further, the stripping liquid is preferably a mixture of the noncyclic nitrogen-containing compound and the cyclic nitrogen-containing compound, which has been diluted with pure water.

Figure 6:
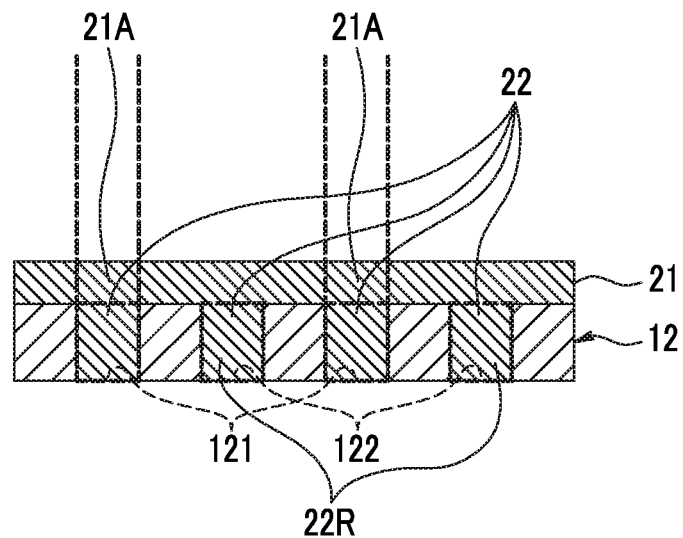
FIG. 6 is a schematic cross-sectional view showing a state where a second colored pattern and a second colored radiation-sensitive layer are formed.

Next, as shown in the schematic cross-sectional view of FIG. 6, a second colored radiation-sensitive layer 21 is laminated on the first colored layer (that is, the first colored pattern 12 configured by forming the through-hole group 120 in the first colored layer 11) using the second colored radiation-sensitive composition, so as to fill up the individual through-holes in the first through-hole subgroup 121 and in the second through-hole subgroup 122 with the second colored radiation-sensitive composition, thereby forming a plurality of second colored pixels (step (c)). Thus, a second colored pattern 22, configured by a plurality of second colored pixels, is formed in the through-hole group 120 of the first colored layer 11. Here, the second colored pixels are given as square pixels. The second colored radiation-sensitive layer 21 can be formed by the same method as that for forming the first colored layer 11 described above.

The thickness of the second colored radiation-sensitive layer 21 is preferably in the range from 0.3 μm to 1 μm, more preferably in the range from 0.35 μm to 0.8 μm, and still more preferably in the range from 0.35 μm to 0.7 μm.

Figure 7:
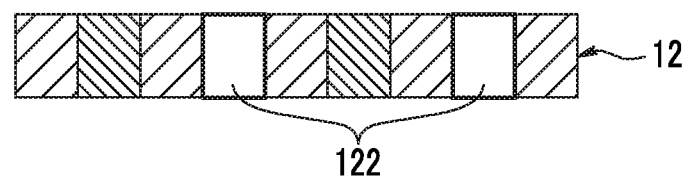
FIG. 7 is a schematic cross-sectional view showing a state where second colored pixels constituting the second colored radiation-sensitive layer and the second colored pattern in FIG. 6 are partially removed.

Furthermore, a region 21A of the second colored radiation-sensitive layer 21, corresponding to the first through-hole subgroup 121 provided in the first colored layer 11, is exposed and developed to remove the second colored radiation-sensitive layer 21 and a plurality of second colored pixels 22R provided inside the individual through-holes in the second through-hole subgroup 122 (step (d)) (see the schematic cross-sectional view of FIG. 7).

Figure 8:
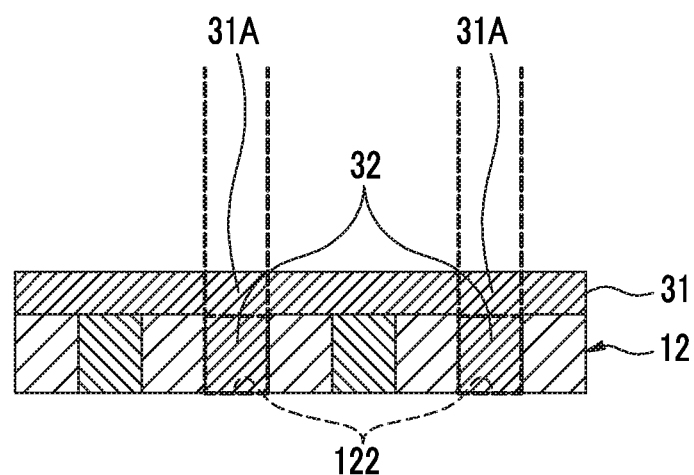
FIG. 8 is a schematic cross-sectional view showing a state where a third colored pattern and a third colored radiation-sensitive layer are formed.

Next, as shown in the schematic cross-sectional view of FIG. 8, a third colored radiation-sensitive layer 31 is formed on the first colored layer (that is, the first colored pattern 12 configured by forming the second colored pattern 22 in the first through-hole subgroup 121) using the third colored radiation-sensitive composition, so as to fill up the individual through-holes in the second through-hole subgroup 122 with the third colored radiation-sensitive composition, thereby forming a plurality of third colored pixels (step (e)). Thus, a third colored pattern 32, configured by a plurality of third colored pixels, is formed in the second through-hole subgroup 122 of the first colored layer 11. Here, the third colored pixels are given as square pixels. The third colored radiation-sensitive layer 31 can be formed by the same method as that for forming the first colored layer 11 described above.

The thickness of the third colored radiation-sensitive layer 31 is preferably in the range from 0.3 μm to 1 μm, more preferably in the range from 0.35 μm to 0.8 μm, and still more preferably in the range from 0.35 μm to 0.7 μm.

Figure 9:
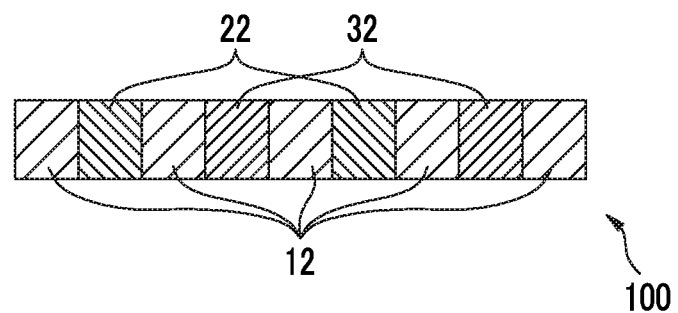
FIG. 9 is a schematic cross-sectional view showing a state where the third colored radiation-sensitive layer in FIG. 8 is removed.

Furthermore, a region 31A of the third colored radiation-sensitive layer 31, corresponding to the second through-hole subgroup 122 provided in the first colored layer 11, is exposed and developed to remove the third colored radiation-sensitive layer 31, thereby manufacturing a color filter 100 having the first colored pattern 12, the second colored pattern 22, and the third colored pattern 32 is manufactured, as shown in the schematic cross-sectional view of FIG. 9 (step (f)).

Each of the second colored radiation-sensitive composition and the third colored radiation-sensitive composition, as described above, contains a colorant. Examples of the colorant include those mentioned above regarding the coloring composition of the present invention, but in a preferred embodiment, one of the second colored pixel and the third colored pixel forms a red transmission portion, and the other forms a blue transmission portion. The colorant contained in the coloring composition for forming the red transmission portion is preferably at least one selected from those described in paragraphs Nos. 0037 and 0039 of JP2012-172003A, the contents of which are incorporated herein for reference. The colorant contained in the coloring composition for forming the blue transmission portion is preferably at least one selected from C.I. Pigment Violets 1, 19, 23, 27, 32, 37, and 42, and, C.I. Pigment Blues 1, 2, 15, 15:1, 15:2, 15:3, 15:4, 15:6, 16, 22, 60, 64, 66, 79, and 80.

In each of the second colored radiation-sensitive composition and the third colored radiation-sensitive composition, the content of the colorant with respect to the total solid content of the composition of the colorant is preferably 30% by mass or more, more preferably 35% by mass or more, and still more preferably 40% by mass or more. Further, the content of the colorant with respect to the total solid content of the composition of the colorant is usually 90% by mass or less, and preferably 80% by mass or less.

Furthermore, as each of the second colored radiation-sensitive composition and the third colored radiation-sensitive composition, a negative type radiation-sensitive composition is preferably used. As this negative type radiation-sensitive composition, a negative type radiation-sensitive composition which is sensitive to radiations such as ultraviolet rays (a g-line, an h-line, an i-line), far ultraviolet radiation including excimer laser, electron beams, ion beams, and X-rays can be used. Among these radiations, the g-line, the h-line, and the i-line are preferable, among which the i-line is preferable.

Specifically, as the negative type radiation-sensitive composition, a negative type radiation-sensitive composition containing a photopolymerization initiator, a polymerizable component (polymerizable compound), a binder resin (an alkali-soluble resin or the like), and the like is preferable, and examples thereof include those described in paragraph Nos. [0017] to [0064] of JP2005-326453A. Such a negative type radiation-sensitive composition makes use of a mechanism by which the photopolymerization initiator initiates a polymerization reaction of the polymerizable compound upon irradiation with radiations, and as a result, the composition changes from an alkali-soluble one to an alkali-insoluble one.

The second colored radiation-sensitive layer 21 and the third colored radiation-sensitive layer 31 can be exposed using a g-line, an h-line, or an i-line, and preferably using an i-line.

Furthermore, the development subsequent to the exposure is usually carried out by a development treatment using a developing liquid.

Examples of the developing liquid include those described above in the exposure and the development for the photoresist layer 51.

In addition, in the case of using the alkaline aqueous solution as the developing liquid, a treatment for cleaning with water is generally carried out after the development.

Each of the first colored pixels, the second colored pixels, and the third colored pixels preferably have a length of one side (a short side in the case of a rectangular pixel and a side in the case of a square pixel) of 0.5 μm to 1.7 μm, and more preferably 0.6 μm to 1.5 μm, from the viewpoint of an image resolution.

<Pattern Forming Method Using Coloring Composition Layer by Photolithography Method>

In the method for manufacturing a color filter of the present invention, pattern formation can be carried out using a coloring composition layer by a photolithography method.

For details of the photolithography method, reference can be made to paragraph Nos. 0173 to 0188 of JP2013-227497A, the contents of which will be incorporated herein by reference.

Since the color filter of the present invention is formed by the coloring composition having a high concentration of colorants, the colored pattern can be extremely thinned (for example, 0.7 µm or less). Further, since other colors hardly remain on the surface and color mixing hardly occurs, a color filter having suppressed crosstalk (color mixing of light) can be obtained.

The color filter of the present invention can be suitably used for a solid-state imaging device such as a CCD and an CMOS, and is suitable for a CCD, a CMOS, or the like having a high resolution exceeding 1,000,000 pixels. The color filter for a solid-state imaging device of the present invention can be used as a color filter disposed, for example, between a light receiving section of each pixel constituting the CCD or the CMOS, and a microlens for collecting light.

The film thickness of the colored pattern (colored pixel) in the color filter of the preset invention is preferably 0.1 µm to 1.0 µm, and more preferably 0.1 µm to 0.8 µm. Since the concentration of the colorants in the colored pattern in the present invention can be increased, such a film can be thinned.

In addition, the size (pattern width) of the colored pattern (colored pixel) is preferably 2.5 µm or less, more preferably 2.0 pin or less, and particularly preferably 1.7 µm or less.

<Solid-State Imaging Device>

The solid-state imaging device of the present invention comprises the color filter of the present invention as described above. The constitution of the solid-state imaging device of the present invention is not particularly limited as long as the solid-state imaging device is constituted to comprise the color filter in the present invention and functions as a solid-state imaging device. However, for example, the solid-state imaging device can be constituted as below.

The solid-state imaging device has a configuration which has a plurality of photodiodes constituting a light-receiving area of a solid-state imaging device (a CCD image sensor, a CMOS image sensor, or the like) and a transfer electrode formed of polysilicon or the like, on a support; a light shielding film formed of tungsten or the like onto the photodiodes and the transfer electrodes, which has openings only over the light receiving section of the photodiode; a device protecting film formed of silicon nitride or the like, which is formed to cover the entire surface of the light shielding film and the light receiving section of the photodiodes, on the light shielding film; and the color filter for a solid-state imaging device of the present invention on the device protecting film.

In addition, the solid-state imaging device may have a configuration in which a light-collecting means (for example, a micro lens or the like, the same applies hereinafter) is disposed on the device protective layer and under the color filter (a side closer to the support), a configuration in which a light-condensing means is disposed on the color filter, and the like.

<Image Display Device>

The color filter of the present invention can be used not only for a solid-state imaging device, but also for an image display device such as a liquid crystal display device and an organic EL display device. In particular, the color filter is suitable in the applications of a liquid crystal display device. The liquid crystal display device comprising the color filter of the present invention can display a high-quality image showing a good tint of a display image and having excellent display characteristics.

The definition of display devices or details of the respective display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989), and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and for example, the present invention can be applied to liquid crystal display devices employing various systems described in the "Liquid Crystal Display Technology for Next Generation".

The color filter of the present invention may be used for a liquid crystal display device using a color TFT system. The liquid crystal display device using a color TFT system is described in, for example, "Color TFT Liquid Crystal Display (KYORITSU SHUPPAN Co., Ltd., published in 1996)". Further, the present invention can be applied to a liquid crystal display device having an enlarged view angle, which uses an in-plane switching mode such as IPS and a pixel division system such as MVA, or to STN, TN, VA, OCS, FFS, R-OCB, and the like.

In addition, the color filter in the present invention can be provided to a Color-filter On Array (COA) system which is a bright and high-definition system. In the liquid crystal display device of the COA system, the characteristics required for a color filter layer need to include characteristics required for an interlayer insulating film, that is, a low dielectric constant and resistance to a peeling solution in some cases, in addition to the generally required characteristics as described above. In the color filter of the present invention, by using a colorant having an excellent hue, the color purity, light-transmitting properties, and the like are excellent, and the tone of the colored pattern (pixel) is excellent. Consequently, a liquid crystal display device of a COA system which has a high resolution and is excellent in long-term durability can be provided. Further, in order to satisfy the characteristics required for a low dielectric constant, a resin coat may be provided on the color filter layer.

In addition, in the present invention, the color filter can also be preferably used in displays in a MICRO OLED mode. These image display systems are described in, for example, p. 43 of "EL, PDP, and LCD Display Technologies and Recent Trend in Market (TORAY RESEARCH CENTER, Research Department, published in 2001)", and the like.

The liquid crystal display device comprising the color filter in the present invention is constituted with various members such as an electrode substrate, a polarizing film, a retardation film, a backlight, a spacer, and a view angle compensation film, in addition to the color filter of the present invention. The color filter of the present invention can be applied to a liquid crystal display device constituted with these known members. These members are described in, for example, "'94 Market of Peripheral Materials And Chemicals of Liquid Crystal Display (Kentaro Shima, CMC Publishing Co., Ltd., published in 1994)" and "2003 Current Situation of Market Relating to Liquid Crystal and Prospects (Vol. 2) (Ryokichi Omote, Fuji Chimera Research Institute, Inc., published in 2003)".

The backlight is described in SID Meeting Digest 1380 (2005) (A. Konno, et al.), December Issue of Monthly "Display", 2005, pp. 18-24 (Yasuhiro Shima) and pp. 25-30 (Takaaki Yagi) of the document, and the like.

If the color filter in the present invention is used in a liquid crystal display device, high contrast can be realized when the color filter is combined with a three-wavelength tube of a cold cathode tube known in the related art. Further, if a light source of LED in red, green, and blue (RGB-LED) is used as a backlight, a liquid crystal display device having high luminance, high color purity, and good color reproducibility can be provided.

EXAMPLES

Hereinbelow, the present invention will be described in more detail with reference to Examples. The materials, amounts of use, proportions, treatment details, treatment procedures, and the like shown in Examples below can be modified as appropriate without departing from the spirit of the present invention. Therefore, the scope of the present invention is not intended to be limited to the specific examples shown below. Further, "part(s)" and "%" are given on the basis of mass unless otherwise specifically stated.

(Synthesis Example 1) Synthesis of Halogenated Zinc Phthalocyanine Pigment A1

Using phthalonitrile, ammonia, and zinc chloride as raw materials, zinc phthalocyanine was produced. This 1-chloronaphthalene solution had a light absorption at 750 nm to 850 nm.

For halogenations of zinc phthalocyanine, 45.5 parts of sulfuryl chloride, 54.5 parts of anhydrous aluminum chloride, and 7 parts of sodium chloride were mixed at 40° C., and 15 parts of a zinc phthalocyanine pigment was added thereto. 35 parts of bromine was added dropwise thereto, and the mixture was warmed to 130° C. for 19.5 hours and kept at that temperature for 1 hour. Thereafter, the reaction mixture was taken out of water to precipitate a crude halogenated zinc phthalocyanine pigment. This aqueous slurry was filtered, washed with warm water at 60° C., with a 1% aqueous sodium hydrogen sulfate solution, and with warm water at 60° C., and dried at 90° C. to obtain 2.7 parts of a purified, crude halogenated zinc phthalocyanine pigment A.

1 part of the purified, crude halogenated zinc phthalocyanine pigment A1, 10 parts of pulverized sodium chloride, and 1 part of diethylene glycol were put into a double-arm type kneader, and kneaded at 100° C. for 8 hours. After kneading, the product was taken out of 100 parts of water at 80° C., stirred for 1 hour, filtered, washed with warm water, dried, and pulverized to obtain a halogenated zinc phthalocyanine pigment A1.

The halogenated zinc phthalocyanine pigment A1 thus obtained was found to have an average composition of $ZnPcBr_{9.8}Cl_{3.1}H_{3.1}$ through mass spectrometry and halogen content analysis by flask combustion ion chromatography. Further, Pc is an abbreviation of phthalocyanine.

(Synthesis Example 2) Synthesis of Halogenated Zinc Phthalocyanine Pigment 1B

By the same method as in Synthesis Example 1, a halogenated zinc phthalocyanine pigment 1B was synthesized by controlling the use amounts of sulfuryl chloride, anhydrous aluminum chloride, sodium chloride, and bromine. The halogenated zinc phthalocyanine pigment thus obtained was found to have an average composition of $ZnPcBr_{5.8}Cl_{9.0}H_{1.2}$ through mass spectrometry and halogen content analysis by flask combustion ion chromatography.

Example 1

Preparation of Green Pigment Dispersion Liquid

A mixed liquid of 7.15 parts of a halogenated zinc phthalocyanine pigment A1 (pigment 1) obtained in Synthesis Example 1, 7.15 parts of Pigment Yellow 150 (pigment 2), 1.4 parts of a derivative A as a pigment derivative, 4.3 parts of a dispersant A as a resin, 80 parts of propylene glycol monomethyl ether acetate (PGMEA) as a solvent, and 0.00086 parts of calcium chloride ($CaCl_2$) was mixed and dispersed by a bead mill for 15 hours to prepare a green pigment dispersion liquid 1.

<Preparation of Green Pigment-Containing Coloring Composition (Coating Liquid)>

Using the green pigment dispersion liquid, the components were mixed and stirred such that the following composition was obtained, thereby preparing a green pigment-containing coloring composition.

<Composition>

| | |
|---|---|
| Pigment dispersion liquid: Green pigment dispersion liquid | 89.2 parts |
| Curable compound: Epoxy compound A | 2.16 parts |
| Solvent: PGMEA | 5.64 parts |
| Surfactant: 0.2% solution of F-781 (manufactured by DIC Corporation) (polymer type surfactant: mass-average molecular weight of 30,000, solid content acid value of 0 mgKOH/g) in PGMEA | 3.0 parts |

Example 2

In the same manner as in Example 1 except that calcium chloride was changed to calcium hydroxide, a green pigment-containing coloring composition was prepared.

Example 3

In the same manner as in Example 1 except that calcium chloride was changed to calcium hydrogen carbonate, a green pigment-containing coloring composition was prepared.

Example 4

In the same manner as in Example 1 except that calcium chloride was changed to magnesium chloride, a green pigment-containing coloring composition was prepared.

Comparative Example 1

In the same manner as in Example 1 except that the content of calcium chloride was changed from 0.00086 parts to 0.000172 parts, a green pigment-containing coloring composition was prepared.

Comparative Example 2

In the same manner as in Example 1 except that the content of calcium chloride was changed from 0.00086 parts to 0.0043 parts, a green pigment-containing coloring composition was prepared.

Comparative Example 3

In the same manner as in Example 1 except that calcium chloride was changed to potassium chloride, a green pigment-containing coloring composition was prepared.

Comparative Example 4

The same procedure as in Comparative Example 2 except that the halogenated zinc phthalocyanine pigment A1 was changed to an equivalent amount of a halogenated zinc phthalocyanine pigment 1B was carried out.

Examples 5 to 18

By the same procedure as in Example 1 except that the kind and content of the colorant, the kind of the resin, the kind of the pigment derivative, and the kind and content of the curable compound were changed to those as shown in Table 1, coloring compositions were prepared.

<Preparation of Blue Pigment Dispersion Liquid>

A mixed liquid composed of 9.5 parts of a Pigment Blue 15:6 as a pigment, 2.4 parts of Pigment Violet 23, 5.6 parts of BYK-161 (manufactured by BYK) as a resin, and 82.5 parts of propylene glycol monomethyl ether acetate (PGMEA) as a solvent was mixed and dispersed by a beads mill for 15 hours, thereby preparing a blue pigment dispersion liquid.

<Preparation of Blue Pigment-Containing Coloring Composition (Coating Liquid)>

Using the blue pigment dispersion liquid, the components were mixed and stirred such that the following composition was obtained, thereby preparing a blue pigment-containing coloring composition (blue coloring radiation-sensitive composition).

<Composition>

| | |
|---|---|
| Pigment dispersion liquid: Blue pigment dispersion liquid | 51.2 parts |
| Photopolymerization initiator: IRGACURE OXE-01 (manufactured by BASF) | 0.87 parts |
| Polymerizable compound: KAYARAD RP-1040 (manufactured by Nippon-Kayaku Co., Ltd.) | 4.7 parts |
| Binder: ACA230AA (manufactured by Daicel Chemical Industries, Ltd.) | 7.4 parts |
| Polymerization inhibitor: p-Methoxyphenol | 0.002 parts |
| Non-ionic surfactant: PIONIN D-6112-W Daicel Chemical Industries, Ltd.) Daicel Chemical Industries, Ltd.) FAT CO., LTD.) | 0.19 parts |
| Slane coupling agent: a 0.9% solution of KBM-602 (manufactured by Shin-Etsu Chemical Co., Ltd.) in cyclohexanone | 10.8 parts |
| Organic solvent: PGMEA | 14.3 parts |
| Organic solvent: cyclohexanone | 6.4 parts |
| Fluorine-based surfactant: a 0.2% solution of F-781 (manufactured factured by DIC) in cyclohexanone | 4.2 parts |

<Manufacture of Color Filter>

(Dry Etching Step)

The green pigment-containing coloring composition was coated onto a 8-inch (20.32-cm) silicon wafer substrate using a spin coater such that the film thickness became 0.5 μm, and then heated at 200° C. for 5 minutes using a hot plate, and the coated film was cured, thereby forming a first colored layer (green layer). The film thickness of this first colored layer (green layer) was 0.5 μm.

(Coating of Resist for Mask)

Next, a positive type photoresist "FHi-622BC" (manufactured by FUJIFILM Electronic Materials Co., Ltd.) was coated and pre-baked, thereby forming a photoresist layer having a film thickness of 0.8 μm.

Next, the photoresist layer was subjected to a heating treatment at a temperature capable of keeping the temperature of photoresist layer or the ambient temperature at 90° C. for 1 minute. Thereafter, the photoresist layer was subjected to a developing treatment using a developer "FHD-5" (manufactured by FUJIFILM Electronic Materials Co., Ltd.) for 1 minute, and further subjected to a post-baking treatment at 110° C. for 1 minute.

(Dry Etching)

Next, dry etching was carried out by the following procedure.

A first step of an etching treatment was carried out for 80 seconds, using a dry etcher (U-621, manufactured by Hitachi High-Technologies Corporation), under the conditions of an RF power of 800 W, an antenna bias of 400 W, a wafer bias of 200 W, an internal pressure of a chamber of 4.0 Pa, a substrate temperature of 50° C., and gas kinds and flow rates of mixed gases of $CF_4$: 80 mL/min., $O_2$: 40 mL/min., Ar: 800 mL/min.

Next, a second step of the etching treatment and the over-etching treatment were carried out for 28 seconds in the same etching chamber, under the conditions of an RF power of 600 W, an antenna bias of 100 W, a wafer bias of 250 W, an internal pressure of a chamber of 2.0 Pa, a substrate temperature of 50° C., and gas kinds and flow rates of mixed gases of $N_2$=500 ml/min, $O_2$=50 mL/min, and Ar=500 mL/min ($N_2/O_2$/Ar=10/1/10).

After the dry etching was carried out under the conditions, the resist was removed by carrying out a stripping treatment using a photoresist stripping liquid "MS230C" (manufactured by FUJIFILM Electronic Materials Co., Ltd.) for 120 seconds. The residue was further washed with pure water, spin-dried, and then subjected to a baking treatment for dehydration at 100° C. for 2 minutes, thereby obtaining a first color filter (green layer).

<Formation of Second Colored Layer>

A blue pigment-containing coloring composition was applied onto the first colored layer (green layer) obtained above such that the thickness after drying and post-baking became 0.40 in, and dried, thereby forming a laminated color filter in which a second colored layer (blue layer) was formed on the first colored layer (green layer).

Then, the laminated color filter thus obtained was loaded on a horizontal rotation table of a spin-shower developer (DW-30 Type, manufactured by Chemitronics Co., Ltd.), and was subjected to a puddle development at 23° C. for 60 seconds using a 60% dilution of CD-2000 (manufactured by Fujifilm Electronic Materials Co., Ltd.).

The silicon wafer after the development was fixed on the horizontal rotation table in a vacuum chuck manner. While the silicon wafer was rotated at 50 rpm by a rotation device, it was subjected to a rinsing treatment by supplying pure water in a shower type from the ejection nozzle above the reaction center, followed by spray-drying, and the second colored layer was removed by development.

Next, a post-baking treatment was carried out at 220° C. for 5 minutes.

<Evaluation of Degree of Generation of Acicular Crystals>

The substrate after the post-baking of the second colored layer and the silicon wafer which had been additionally baked at 240° C. for 5 minutes were observed using a critical dimension S-9260 scanning electron microscope (SEM) (manufactured by Hitachi, Ltd.) at a magnification of 20,000, and the degrees of generation of acicular crystals were evaluated under the following criteria.

A: Acicular crystals are not generated after post-baking (220° C./5 min.) and even after additional baking (240° C./5 min.).

B: Acicular crystals are not generated after post-baking (220° C./5 min.), but crystals in 0.1 µm or less are generated after additional baking (240° C./5 min.).

C: Acicular crystals are not generated after post-baking (220° C./5 min.), but crystals in more than 0.1 µm and 0.5 µm or less are generated after additional baking (240° C./5 min.).

D: Acicular crystals are not generated after post-baking (220° C./5 min.), but crystals in more than 0.5 µm are generated after additional baking (240° C./5 min.).

E: Acicular crystals are generated after post-baking (220° C./5 min.) as well as after additional baking (240° C./5 min.).

<Evaluation of Viscosity Stability>

The viscosity (initial viscosity, unit: mPa·s) after the preparation of the green pigment-containing coloring composition, and the viscosity (viscosity after storage, unit: mPa·s) after storing the coloring composition in a thermostat at 45° C. for 3 days were measured, and the viscosity stability of the coloring composition containing the green pigment was evaluated in accordance with the following criteria. The viscosity was measured in the state where the temperature was adjusted to 25° C., using a viscometer RE85L (rotor: 1° 34'×R24 Measurement Range of 0.6 mPa·s to 1,200 mPa·s) manufactured by Toki Sangyo Co., Ltd.

A: The Δviscosity (the initial viscosity−the viscosity after storage) is 0.5 mPa·s or less.

B: The Δviscosity (the initial viscosity−the viscosity after storage) is more than 0.5 mPa·s and 1.0 mPa·s or less.

C: The Δviscosity (the initial viscosity−the viscosity after storage) is more than 1.0 mPa·s and 2.0 mPa·s or less.

D: The Δviscosity (the initial viscosity−the viscosity after storage) is more than 2.0 mPa·s and 5.0 mPa·s or less.

E: The Δviscosity (the initial viscosity−the viscosity after storage) is more than 5.0 mPa·s.

As a result of the evaluation on the degree of generation of acicular crystals, the results of the viscosity stability are shown in the following table. The contents of cations shown in Table 1 are values measured by a flameless atomic absorption spectrophotometer Z-9000 manufactured by Hitachi High-Technologies Corporation.

The abbreviations described in Table 1, and the compounds used in Examples and Comparative Examples are as follows.

(Colorants)
PY129: C. I. Pigment Yellow 129
PY138: C. I. Pigment Yellow 138
PY150: C. I. Pigment Yellow 150
PY185: C. I. Pigment Yellow 185

(Pigment Derivatives)
Pigment derivative A: The structure shown below

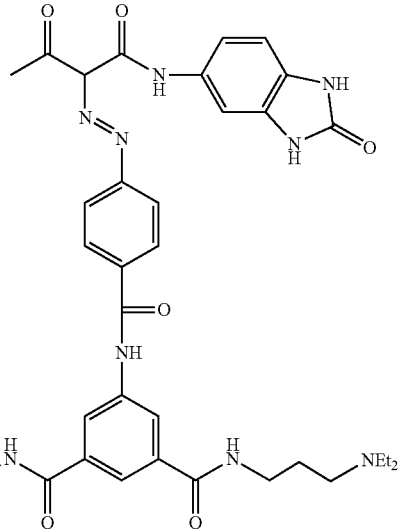

Pigment derivative B: The structure shown below

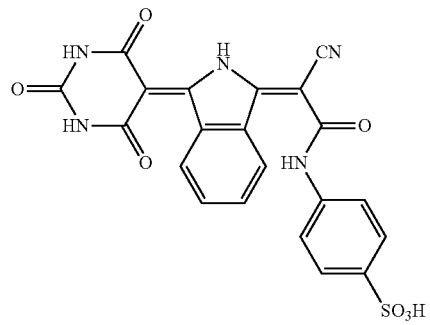 [SMILES: N#C/C(C(=O)Nc1ccc(S(=O)(=O)O)cc1)=c1\[nH]c(=C2C(=O)NC(=O)NC2=O)c2ccccc12]

Pigment derivative C: The structure shown below

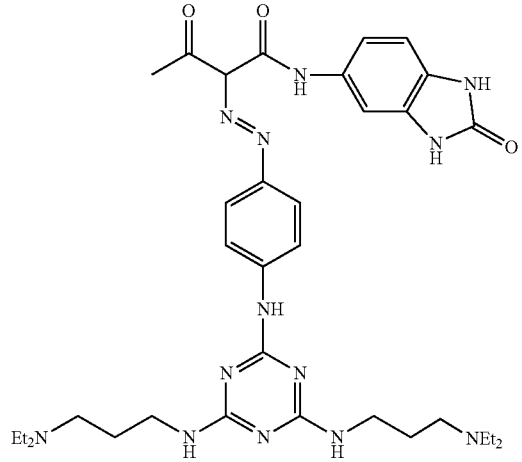

(Resin)
In the compounds shown below, the numeral values also described in the respective structural units (the numeral values denoted also described in the repeating units of the main chain) represent the contents [% by mass: described as (wt %)] of the respective structural units. The numeral values also described in the repeating moieties of the side chain represent the repetition number of the repeating moieties.

Dispersant A: The structure shown below
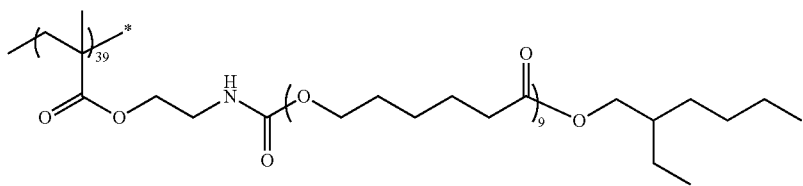
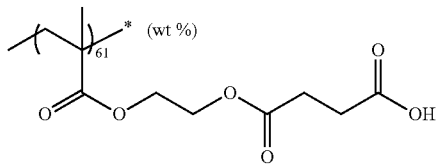
Acid value=53 mgKOH/g, Mw=24,000
Dispersant B: The structure shown below
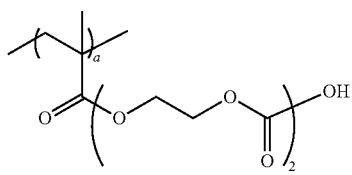
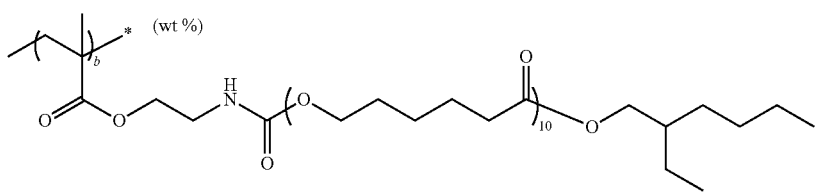
a=40, b=60: Acid value=60 mgKOH/g, Mw=16,000
Dispersant C: The structure shown below
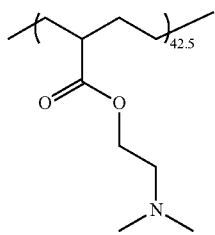
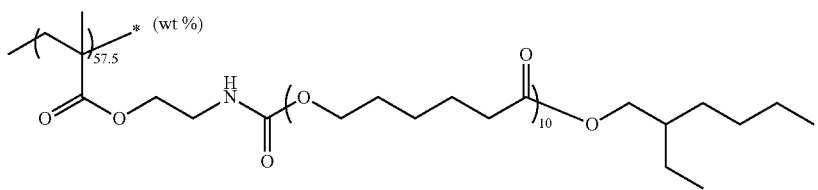
Acid value=0 mgKOH/g, Mw=20,000

(Curable Compound)

Epoxy compound A: The structure shown below, 1,2-epoxy-4-(2-oxiranyl)cyclohexane adduct of 2,2-bis(hydroxymethyl)-1-butanol (EHPE3150 manufactured by Daicel Chemical Industries, Ltd., Mw 23,000)

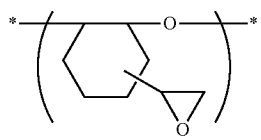

Epoxy compound B: The structure shown below (synthesized according to the method described in paragraph No. 0083 of JP2013-11869A)

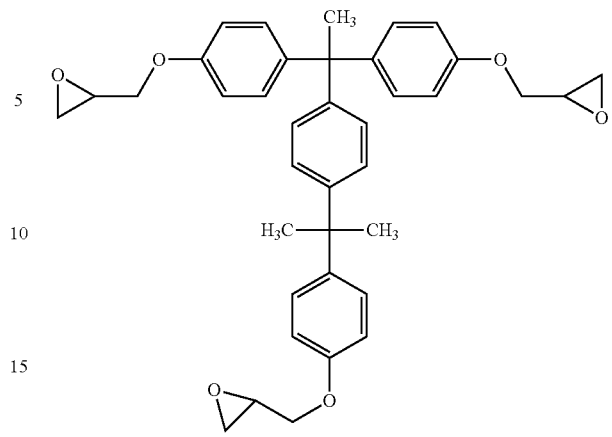

DPHA: Dipentaerythritol hexa(meth)acrylate (KAYARAD DPHA manufactured by Nippon-Kayaku Co., Ltd.)

TABLE 1

| | Green pigment dispersion liquid | | | | Green pigment-containing coloring composition | |
|---|---|---|---|---|---|---|
| | Colorant | | | | | |
| | Pigment 1 | Pigment 2 | Pigment derivative | Resin | Green pigment dispersion liquid | Curable compound |
| Example 1 | Pigment A1 (7.15 parts) | PY150 (7.15 parts) | Pigment derivative A (basic) (1.4 parts) | Dispersant A (4.3 parts) | 89.2 parts | Epoxy compound A (2.16 parts) |
| Example 2 | Pigment A1 (7.15 parts) | PY150 (7.15 parts) | Pigment derivative A (basic) (1.4 parts) | Dispersant A (4.3 parts) | 89.2 parts | Epoxy compound A (2.16 parts) |
| Example 3 | Pigment A1 (7.15 parts) | PY150 (7.15 parts) | Pigment derivative A (basic) (1.4 parts) | Dispersant A (4.3 parts) | 89.2 parts | Epoxy compound A (2.16 parts) |
| Example 4 | Pigment A1 (7.15 parts) | PY150 (7.15 parts) | Pigment derivative A (basic) (1.4 parts) | Dispersant A (4.3 parts) | 89.2 parts | Epoxy compound A (2.16 parts) |
| Comparative Example 1 | Pigment A1 (7.15 parts) | PY150 (7.15 parts) | Pigment derivative A (basic) (1.4 parts) | Dispersant A (4.3 parts) | 89.2 parts | Epoxy compound A (2.16 parts) |
| Comparative Example 2 | Pigment A1 (7.15 parts) | PY150 (7.15 parts) | Pigment derivative A (basic) (1.4 parts) | Dispersant A (4.3 parts) | 89.2 parts | Epoxy compound A (2.16 parts) |
| Comparative Example 3 | Pigment A1 (7.15 parts) | PY150 (7.15 parts) | Pigment derivative A (basic) (1.4 parts) | Dispersant A (4.3 parts) | 89.2 parts | Epoxy compound A (2.16 parts) |
| Example 5 | Pigment A1 (7.15 parts) | PY150 (7.15 parts) | Pigment derivative B (acidic) (1.4 parts) | Dispersant C (4.3 parts) | 89.2 parts | Epoxy compound A (2.16 parts) |
| Example 6 | Pigment A1 (7.15 parts) | PY150 (7.15 parts) | Pigment derivative A (basic) (1.4 parts) | Dispersant A (4.3 parts) | 89.2 parts | Epoxy compound B (2.16 parts) |
| Example 7 | Pigment A1 (7.15 parts) | PY150 (7.15 parts) | Pigment derivative A (basic) (1.4 parts) | Dispersant B (4.3 parts) | 89.2 parts | Epoxy compound A (2.16 parts) |
| Example 8 | Pigment A1 (7.15 parts) | PY150 (7.15 parts) | Pigment derivative C (basic) (1.4 parts) | Dispersant B (4.3 parts) | 89.2 parts | Epoxy compound A (2.16 parts) |
| Example 9 | Pigment A1 (7.15 parts) | PY150 (7.15 parts) | Pigment derivative C (basic) (1.4 parts) | Dispersant A (4.3 parts) | 89.2 parts | Epoxy compound A (2.16 parts) |
| Example 10 | Pigment A1 (11.44 parts) | PY150 (2.86 parts) | Pigment derivative A (basic) (1.4 parts) | Dispersant A (4.3 parts) | 89.2 parts | Epoxy compound A (2.16 parts) |

TABLE 1-continued

| | | | | | | |
|---|---|---|---|---|---|---|
| Example 11 | Pigment A1 (11.92 parts) | PY185 (2.38 parts) | Pigment derivative A (basic) (1.4 parts) | Dispersant A (4.3 parts) | 89.2 parts | Epoxy compound A (2.16 parts) |
| Example 12 | Pigment A1 (9.53 parts) | PY185 (4.77 parts) | Pigment derivative A (basic) (1.4 parts) | Dispersant A (4.3 parts) | 89.2 parts | Epoxy compound A (2.16 parts) |
| Example 13 | Pigment A1 (7.15 parts) | PY138 (7.15 parts) | Pigment derivative A (basic) (1.4 parts) | Dispersant A (4.3 parts) | 89.2 parts | Epoxy compound A (2.16 parts) |
| Example 14 | Pigment A1 (7.15 parts) | PY129 (7.15 parts) | Pigment derivative A (basic) (1.4 parts) | Dispersant A (4.3 parts) | 89.2 parts | Epoxy compound A (2.16 parts) |
| Example 15 | Pigment A1 (7.15 parts) | PY150 (7.15 parts) | Pigment derivative A (basic) (1.4 parts) | Dispersant A (4.3 parts) | 89.2 parts | Epoxy compound A (2.16 parts) |
| Example 16 | Pigment A1 (7.15 parts) | PY150 (7.15 parts) | Pigment derivative A (basic) (1.4 parts) | Dispersant A (4.3 parts) | 89.2 parts | Epoxy compound A (2.16 parts) |
| Example 17 | Pigment A1 (7.15 parts) | PY150 (7.15 parts) | Pigment derivative A (basic) (1.4 parts) | Dispersant A (4.3 parts) | 89.2 parts | DPHA (2.16 parts) |
| Example 18 | Pigment B1 (7.15 parts) | PY150 (7.15 parts) | Pigment derivative A (basic) (1.4 parts) | Dispersant A (4.3 parts) | 89.2 parts | Epoxy compound A (2.16 parts) |
| Comparative Example 4 | Pigment B1 (7.15 parts) | PY150 (7.15 parts) | Pigment derivative A (basic) (1.4 parts) | Dispersant A (4.3 parts) | 89.2 parts | Epoxy compound A (2.16 parts) |

| | Green pigment-containing coloring composition | | | | | | |
|---|---|---|---|---|---|---|---|
| | Cation | | Content of cations (ppm by mass) | Content of colorant (% by mass) | Solid content (% by mass) | Degree of generation of acicular crystals | Viscosity stability |
| | Kind | Source | | | | | |
| Example 1 | $Ca^{2+}$ | Calcium chloride | 100 | 70 | 20 | A | A |
| Example 2 | $Ca^{2+}$ | Calcium hydroxide | 100 | 70 | 20 | A | B |
| Example 3 | $Ca^{2+}$ | Calcium hydrogen carbonate | 100 | 70 | 20 | A | B |
| Example 4 | $Mg^{2+}$ | Magnesium chloride | 100 | 70 | 20 | B | B |
| Comparative Example 1 | $Ca^{2+}$ | Calcium chloride | 20 | 70 | 20 | E | E |
| Comparative Example 2 | $Ca^{2+}$ | Calcium chloride | 500 | 70 | 20 | E | E |
| Comparative Example 3 | $K^+$ | Potassium chloride | 100 | 70 | 20 | E | E |
| Example 5 | $Ca^{2+}$ | Calcium chloride | 100 | 70 | 20 | B | D |
| Example 6 | $Ca^{2+}$ | Calcium chloride | 100 | 70 | 20 | B | A |
| Example 7 | $Ca^{2+}$ | Calcium chloride | 100 | 70 | 20 | B | C |
| Example 8 | $Ca^{2+}$ | Calcium chloride | 100 | 70 | 20 | C | C |
| Example 9 | $Ca^{2+}$ | Calcium chloride | 100 | 70 | 20 | C | B |
| Example 10 | $Ca^{2+}$ | Calcium chloride | 100 | 70 | 20 | A | A |
| Example 11 | $Ca^{2+}$ | Calcium chloride | 100 | 70 | 20 | A | A |
| Example 12 | $Ca^{2+}$ | Calcium chloride | 100 | 70 | 20 | A | A |
| Example 13 | $Ca^{2+}$ | Calcium chloride | 100 | 70 | 20 | B | B |
| Example 14 | $Ca^{2+}$ | Calcium chloride | 100 | 70 | 20 | B | B |
| Example 15 | $Ca^{2+}$ | Calcium chloride | 32 | 70 | 20 | D | D |
| Example 16 | $Ca^{2+}$ | Calcium chloride | 290 | 70 | 20 | D | D |
| Example 17 | $Ca^{2+}$ | Calcium chloride | 100 | 70 | 20 | C | A |

TABLE 1-continued

| Example 18 | Ca²⁺ | Calcium chloride | 100 | 70 | 20 | A | A |
| Comparative Example 4 | Ca²⁺ | Calcium chloride | 500 | 70 | 20 | E | E |

In the table above, the "content of cations" means the content (ppm by mass) of cations with respect to the mass of the pigment 1; the "content of the colorant" means the total content (% by mass) of the colorant with respect to the total solid content in the green pigment-containing coloring composition; and the "solid content" means the solid content (% by mass) of the green pigment-containing coloring composition.

As clearly seen from the above results, the coloring composition of the present invention had good viscosity stability. In addition, generation of acicular crystals could be efficiently suppressed.

On the other hand, in Comparative Example 1 in which the content of the Group 2 element ions with respect to the mass of the halogenated zinc phthalocyanine pigment was less than 30 ppm by mass; in Comparative Examples 2 and 4 in which the content of the Group 2 element ions with respect to the mass of the halogenated zinc phthalocyanine pigment was more than 300 ppm by mass; and in Comparative Example 3 in which cations other than the Group 2 element ions were contained, the viscosity stability was deteriorated. In addition, acicular crystals were easily generated.

What is claimed is:

1. A coloring composition comprising:
   a colorant;
   a resin;
   a pigment derivative, and
   Group 2 element ions,
   wherein the colorant contains a halogenated zinc phthalocyanine pigment, the content of the colorant with respect to the total solids content in the coloring composition is 50% by mass or more, and
   the content of the Group 2 element ions with respect to the mass of the halogenated zinc phthalocyanine pigment is 30 ppm by mass to 300 ppm by mass.

2. The coloring composition according to claim 1, wherein the Group 2 element ions contains a calcium ion,
   the content of the Group 2 element ions containing a calcium ion with respect to the mass of the halogenated zinc phthalocyanine pigment is 30 ppm by mass to 300 ppm by mass, and
   the content of the calcium ion is 30 ppm by mass to 300 ppm by mass.

3. The coloring composition according to claim 1, wherein the resin has an acidic group and the pigment derivative has a basic group.

4. The coloring composition according to claim 1, further comprising a compound having an epoxy group.

5. The coloring composition according to claim 4, wherein the compound having an epoxy group has a structure having at least two benzene rings linked to each other via a hydrocarbon group.

6. The coloring composition according to claim 4, wherein the compound having an epoxy group is represented by the following General Formula (1):

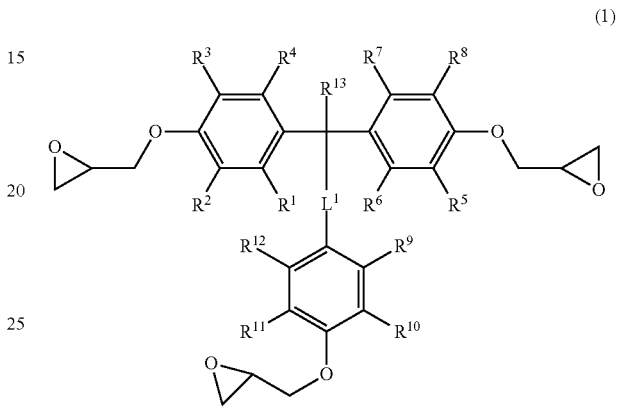

(1)

wherein in General Formula (1), $R^1$ to $R^{13}$ each independently represents a hydrogen atom, an alkyl group, an alkoxy group, or a halogen atom, and $L^1$ represents a single bond or a divalent linking group.

7. The coloring composition according to claim 1, used for formation of a colored layer of a color filter.

8. A cured film formed by curing the coloring composition according to claim 1.

9. A color filter comprising the cured film according to claim 8.

10. A solid-state imaging device comprising the color filter according to claim 9.

11. An image display device comprising the color filter according to claim 9.

12. A pattern forming method comprising:
   applying the coloring composition according to claim 1 onto a support to form a coloring composition layer, followed by curing, to form a colored layer;
   forming a photoresist layer on the colored layer;
   patterning the photoresist layer by exposure and development to obtain a resist pattern; and
   dry-etching the colored layer using the resist pattern as an etching mask.

13. A method for manufacturing a color filter, comprising the pattern forming method according to claim 12.

14. The coloring composition according to claim 1, wherein the content of the Group 2 element ions with respect to the mass of the halogenated zinc phthalocyanine pigment is 50 ppm by mass to 200 ppm by mass.

15. The coloring composition according to claim 1, wherein the halogenated zinc phthalocyanine pigment is represented by the following General Formula (A1):

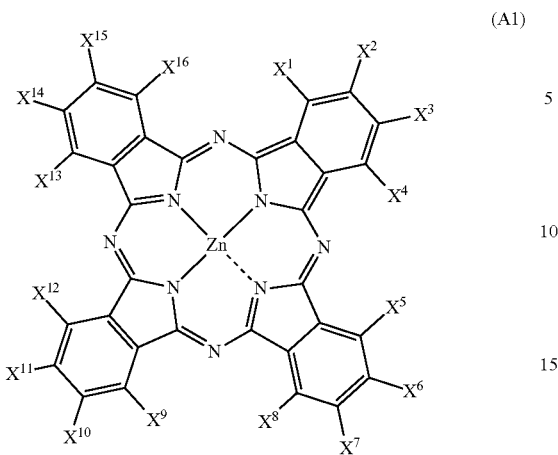
(A1)
wherein in General Formula (A1), 8 to 16 positions of $X^1$ to $X^{16}$ each represent a halogen atom, and the residues each represent a hydrogen atom or a substituent, and the number of bromine atoms/the number of chlorine atoms is 1.0 to 3.5.
* * * * *